United States Patent
Wang et al.

(10) Patent No.: US 12,418,736 B2
(45) Date of Patent: Sep. 16, 2025

(54) COUNTER, ANALOG-TO-DIGITAL CONVERTER, AND METHOD FOR READING OUT IMAGE SIGNALS

(71) Applicant: SMARTSENS TECHNOLOGY(HK) CO., LIMITED, HK (CN)

(72) Inventors: Dongchen Wang, Shanghai (CN); Wenlong Lin, Shanghai (CN); Yaowu Mo, Shanghai (CN)

(73) Assignee: SMARTSENS TECHNOLOGY(HK) CO., LIMITED, Hong Kong (CN)

( * ) Notice: Subject to any disclaimer, the term of this patent is extended or adjusted under 35 U.S.C. 154(b) by 98 days.

(21) Appl. No.: 18/398,150

(22) Filed: Dec. 28, 2023

(65) Prior Publication Data
US 2024/0314468 A1    Sep. 19, 2024

(30) Foreign Application Priority Data

| Mar. 16, 2023 | (CN) | ......................... | 202310255674.5 |
| Mar. 16, 2023 | (CN) | ......................... | 202310255678.3 |
| Mar. 16, 2023 | (CN) | ......................... | 202320514123.1 |
| Mar. 16, 2023 | (CN) | ......................... | 202320514130.1 |

(51) Int. Cl.
*H04N 25/772* (2023.01)
*H04N 25/76* (2023.01)
*H04N 25/771* (2023.01)
*H04N 25/78* (2023.01)

(52) U.S. Cl.
CPC ......... *H04N 25/772* (2023.01); *H04N 25/771* (2023.01); *H04N 25/7795* (2023.01); *H04N 25/78* (2023.01)

(58) Field of Classification Search
None
See application file for complete search history.

(56) References Cited

U.S. PATENT DOCUMENTS

| 2016/0286108 A1* | 9/2016 | Fettig ................... H04N 23/667 |
| 2020/0100040 A1* | 3/2020 | Chang ................... H03K 3/037 |

* cited by examiner

*Primary Examiner* — Mark T Monk
(74) *Attorney, Agent, or Firm* — IPRTOP LLC

(57) ABSTRACT

A counter, an analog-to-digital converter, and a method for reading out image signals; the counter comprises N cascaded counting units, each of which comprises a writable D flip-flop, which has a clock input, a data input, a Q output, a Q-bar output, a control input, and a write input; the clock input of the writable D flip-flop of each counting unit is connected to the Q-bar or Q output of the writable D flip-flop of a previous counting unit, except that the clock input of the writable D flip-flop of a first counting unit of the N cascaded counting units receives a clock signal; the Q-bar output of each writable D flip-flop is connected to the data input of the same writable D flip-flop, each Q output generates a counting result, each control input receives a control signal, and each write input receives a write signal.

20 Claims, 18 Drawing Sheets

Step 1) in the low conversion gain mode, collecting a low-gain reset signal of the all-phase pixels; and then quantizing the low-gain reset signal to obtain and store a quantized low-gain reset signal.

Step 2) in the high conversion gain mode, collecting a high-gain reset signal of the all-phase pixels; and then resetting the quantization status and quantizing the high-gain reset signal to obtain and store a quantized high-gain reset signal Step 3) in the high conversion gain mode, collecting the high-gain total exposure signal of the all-phase pixels; and then using a reverse signal of the quantized high-gain reset signal as an initial state, and quantizing the high-gain total exposure signal based on this initial state to obtain a high-gain total image quantization signal, which is subsequently read out Step 4) in the low conversion gain mode, first collecting the low-gain one-side exposure signal of first-side pixels of the all-phase pixels, and then collecting the low-gain total exposure signal of the all-phase pixels; after collecting the low-gain one-side exposure signal, using a reverse signal of the quantized low-gain reset signal as an initial state, and quantizing the low-gain one-side exposure signal based on this initial state to obtain a low-gain one-side image quantization signal, which is subsequently read out; after collecting the low-gain total exposure signal, using the reverse signal of the quantized low-gain reset signal as an initial state, and quantizing the low-gain total exposure signal to obtain a low-gain total image quantization signal, which is subsequently read out Step 5) calculating a difference between the low-gain total image quantization signal and the low-gain one-side image quantization signal, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in the low conversion gain mode is obtained, thereby achieving ADAF in the low conversion gain mode, wherein PGHDR is achieved based on the high-gain total image quantization signal and the low-gain total image quantization signal

FIG. 28

Step 1) in the low conversion gain mode, collecting a low-gain reset signal of the all-phase pixels, and then quantizing the low-gain reset signal to obtain and store a quantized low-gain reset signal Step 2) in the high conversion gain mode, collecting a high-gain reset signal of the all-phase pixels; and then resetting the quantization status and quantizing the high-gain reset signal to obtain and store a quantized high-gain reset signal Step 3) in the high conversion gain mode, first collecting a high-gain one-side exposure signal of first-side pixels of the all-phase pixels, and then collecting a high-gain total exposure signal of the all-phase pixels; after collecting the high-gain one-side exposure signal, using a reverse signal of the quantized high-gain reset signal as an initial state, and quantizing the high-gain one-side exposure signal based on this initial state to obtain a high-gain one-side image quantization signal, which is subsequently read out; after collecting the high-gain total exposure signal, using the reverse signal of the quantized high-gain reset signal as an initial state, and quantizing the high-gain total exposure signal to obtain a high-gain total image quantization signal, which is subsequently read out Step 4) in the low conversion gain mode, first collecting a low-gain one-side exposure signal of first-side pixels of the all-phase pixels, and then collecting a low-gain total exposure signal of the all-phase pixels; after collecting the low-gain one-side exposure signal, using a reverse signal of the quantized low-gain reset signal as an initial state, quantizing the low-gain one-side exposure signal based on this initial state to obtain a low-gain one-side image quantization signal, which is subsequently read out; after collecting the low-gain total exposure signal, using the reverse signal of the quantized low-gain reset signal as an initial state, and quantizing the low-gain total exposure signal to obtain a low-gain total image quantization signal, which is subsequently read out Step 5) the difference between the high-gain total image quantization signal and the high-gain one-side image quantization signal is calculated, wherein the difference is used to obtain a high-gain other-side image quantization signal corresponding to second-side pixels of the full-phase pixels obtained through CDS of a high-gain other-side exposure signal in the high conversion gain mode, the difference between the low-gain total image quantization signal and the low-gain one-side image quantization signal is calculated, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in different conversion gain modes is obtained, thereby achieving ADAF in the different conversion gain modes; PGHDR is achieved based on the high-gain total image quantization signal and the low-gain total image quantization signal

FIG. 31

COUNTER, ANALOG-TO-DIGITAL CONVERTER, AND METHOD FOR READING OUT IMAGE SIGNALS

CROSS REFERENCE TO RELATED APPLICATION

The present application claims the benefit of priority to Chinese Patent Application No. 2023102556783, entitled "COUNTER, ANALOG-TO-DIGITAL CONVERTER, AND METHOD FOR CONTROLLING ANALOG-TO-DIGITAL CONVERTER", Chinese Patent Application No. 2023102556745, entitled "METHOD FOR READING OUT IMAGE SIGNALS, ANALOG-TO-DIGITAL CONVERTER, AND METHOD FOR CONTROLLING SAME", Chinese Patent Application No. 2023205141301, entitled "COUNTER, AND ANALOG-TO-DIGITAL CONVERTER", Chinese Patent Application No. 2023205141231, entitled "ANALOG-TO-DIGITAL CONVERTER", all filed with CNIPA on Mar. 16, 2023, the disclosure of which is incorporated herein by reference in its entirety for all purposes.

FIELD OF THE INVENTION

The present disclosure generally relates to the technical field of image sensors, and in particular to a counter, an analog-to-digital converter, and a method for reading out image signals.

BACKGROUND OF THE INVENTION

Complementary-metal-oxide-semiconductor (CMOS) image sensors offer significant advantages, including low voltage, low power consumption, affordability, and high integration, making them invaluable in various fields such as machine vision, consumer electronics, high-definition surveillance, and medical imaging. At the core of a CMOS image sensor' readout circuit lies analog-to-digital converters (ADCs), a vital component responsible for converting analog signals from pixels into digital signals. In CMOS image sensors, column-level ADCs are generally used, such as single-slope ADC (SS ADC), successive approximation ADC (SAR ADC) and cyclic ADC. Among them, SS ADC has a simpler circuit, each column of which only needs one comparator and one counter, and all columns share the same ramp signal, so the column consistency of SS ADC is better. Therefore, SS ADC is the most widely used column-level ADC in CMOS image sensors.

In a traditional SS ADC whose circuit structure is shown in FIG. 1, a ramp generator produces a ramp signal that is sampled to a positive input of the comparator of each column via a capacitor, meanwhile, pixel signals from each column are sampled at a negative input of the comparator, see FIG. 2. Taking the first column of the traditional SS ADC as example, the ramp signal Vramp traverses the entire quantization voltage range and is compared with a pixel signal Vin1 while the counter starts counting. When the ramp signal Vramp is larger than the pixel signal Vin1, the comparator flips and the counter stops counting, and the counting result at this time is the digital code value of the pixel signal Vin1 after quantization.

CMOS image sensors that utilize column-parallel readout circuits often encounter an issue known as fixed pattern noise (FPN). However, this can be addressed by using a 4T active pixel structure, which allows for CDS operations. This process involves separately reading a pixel's reset signal (Vrst) and exposure signal (Vsig), and then subtracting one from the other. As both signals contain the same FPN, the subtraction can effectively eliminate the FPN, thereby enhancing the quality of the image. In the context of SS ADC, CDS operation involves using two segments of ramp signals to carry out two quantizations. The first quantization is for the pixel's reset signal (Vrst), and the second is for the pixel's exposure signal (Vsig). The counter is controlled to count downwards and upwards respectively during these two quantization periods, allowing for the digital-domain subtraction of analog voltage values output by the pixel. The counter in this structure is a reversible counter, meaning it can switch between downward and upward counting.

However, due to the high working frequency of the counting clock (often in hundreds of MHz or even over 1 GHZ), the reversible counter requires a two-to-one switch to be inserted between each level of D flip-flops, as well as a buffer for driving, which results in increased power consumption. Furthermore, this structure faces a challenge in maintaining stability of the result of the first quantization during switching periods between upward and downward counting. This necessitates additional holding circuits, which complicates the layout, increases parasitic capacitance and resistance of wiring, further boosts power consumption, and limits the maximum working frequency of the counter.

Auto-focus technology is crucial in image sensors, particularly when using consumer electronics like mobile phones for photography. It significantly enhances the user experience. The All-Direction Auto-Focus (ADAF) technology, which is extensively applied in high-end CMOS image sensor chips, uses All-Photodiode (APD) technology where four pixels arranged in a 2×2 layout share a Floating-Diffusion (FD) node and a Source-Follower (SF) transistor, as shown in FIG. 23. During a readout process, TXA and TXC are activated first to read signals from the two right pixels, obtaining right phase information. Then TXB and TXD are activated to read signals from the two left pixels, providing left phase information. Alternatively, TXA and TXB can be activated first to read signals from the top two pixels for upper phase information, followed by TXC and TXD for the bottom two pixels for lower phase information. By comparing these two sets of phase information, phase differences can be calculated to enable auto-focus. Overlaying these pixel signals results in a complete image.

The dynamic range plays a crucial role in the imaging quality of image sensors. A larger dynamic range allows for the capture of image information within a broader light intensity range, thus generating more detailed images. Typically, image sensors output a dynamic range of around 60 to 70 db. However, in most natural environments, to capture highlights and shadows simultaneously, a dynamic range of approximately 100 db is needed. There are several methods to enhance the dynamic range in image sensor design. For instance, one could increase the full well capacity of pixel circuits for a larger dynamic range. Alternatively, one could read multiple frames and synthesize them to achieve a high dynamic range (HDR) for the image sensor. Dual Conversion Gain (DCG) is applied to the pixel circuits of image sensors. Under low light conditions, it increases the conversion gain with a smaller integration capacitor, thereby improving sensitivity. Conversely, under high light conditions, it uses a larger integration capacitor to boost storage charge and reduce conversion gain, thereby enhancing the dynamic range. Generally, a pixel-gain high dynamic range (PGHDR) technology is adopted to improve the dynamic range of the image sensors and reduce the noise of the pixel circuits.

However, a current challenge is to enhance the user experience by achieving auto focus, while maintaining the image quality with a high dynamic range and low noise. That is, how to implement the ADAF technology when operating in PGHDR mode.

SUMMARY OF THE INVENTION

The present disclosure provides a counter, an analog-to-digital converter, and a method for reading out image signals, which address the issues of complex circuit structures and high-power consumption that are present in the digital quantization process of existing counters, and also realize implementation of the ADAF technology when operating in PGHDR mode.

The counter comprises N cascaded counting units, wherein each of the counting units comprises a writable D flip-flop, and N is an integer greater than or equal to 1, wherein the writable D flip-flop of each counting unit has a clock input, a data input, a Q output, a Q-bar output, a control input, and a write input, wherein the clock input of the writable D flip-flop of each counting unit is connected to the Q-bar output or Q output of the writable D flip-flop of a previous counting unit, except that the clock input of the writable D flip-flop of a first counting unit of the N cascaded counting units receives a clock signal, wherein the Q-bar output of the writable D flip-flop of each counting unit is connected to the data input of the same writable D flip-flop, wherein each Q output generates a counting result, each control input receives a control signal, and each write input receives a write signal; wherein the write signal is written into each writable D flip-flop when the control signal is active.

The analog-to-digital converter comprises at least one row of cascaded analog-to-digital conversion units, wherein each of the analog-to-digital conversion units comprises a comparator and the counter as described above; wherein the comparator compares a ramp signal and an input signal, and generates a comparison signal; wherein the counter is connected to an output of the comparator, and digitally quantizes the input signal based on the comparison signal.

The method for reading out image signals comprises: in a first conversion gain mode, collecting a first-gain reset signal of all-phase pixels; in a second conversion gain mode, collecting a second-gain reset signal of the all-phase pixels; in the second conversion gain mode, first collecting a second-gain one-side exposure signal of first-side pixels of the all-phase pixels, and then collecting a second-gain total exposure signal of the all-phase pixels; in the first conversion gain mode, collecting a first-gain total exposure signal of the all-phase pixels; wherein, after collecting the second-gain reset signal, the method further comprises: quantizing the second-gain reset signal to obtain and store a quantized second-gain reset signal.

In summary, the present disclosed counter, analog-to-digital converter, and method for reading out image signals propose a novel counter circuit structure that possesses both counting and writing capabilities. When this is applied to an analog-to-digital converter for pixel quantization, it can execute Correlated Double Sampling (CDS) operations or CDS operations in the PGHDR mode. The benefits of this approach include a reduction in layout area and optimization of wiring, which in turn leads to lower power consumption and an increase in counting frequency. In addition, the present disclosure is capable of implementing All-Direction Auto Focus (ADAF) during High Conversion Gain (HCG) and/or Low Conversion Gain (LCG) quantization processes in the PGHDR mode. This allows for all direction auto focus while preserving a high dynamic range, thereby enhancing the quality of image capture.

BRIEF DESCRIPTION OF THE DRAWINGS

FIG. 18 shows a schematic structural diagram of a counter according to a second example of Embodiment 4 of the present disclosure, wherein only one counting unit thereof is shown.

FIG. 28 shows a flowchart illustrating a read method according to Embodiment 9 of the present disclosure.

FIG. 31 shows a flowchart illustrating a read method according to Embodiment 10 of the present disclosure.

DETAILED DESCRIPTION

The embodiments of the present disclosure will be described below. Those skilled can easily understand disclosure advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Refer to FIGS. 1-33. It should be noted that the drawings provided in this disclosure only illustrate the basic concept of the present disclosure in a schematic way, so the drawings only show the components closely related to the present disclosure. The drawings are not necessarily drawn according to the number, shape, and size of the components in actual implementation; during the actual implementation, the type, quantity, and proportion of each component can be changed as needed, and the components' layout may also be more complicated.

Embodiment 1

Figure 3:
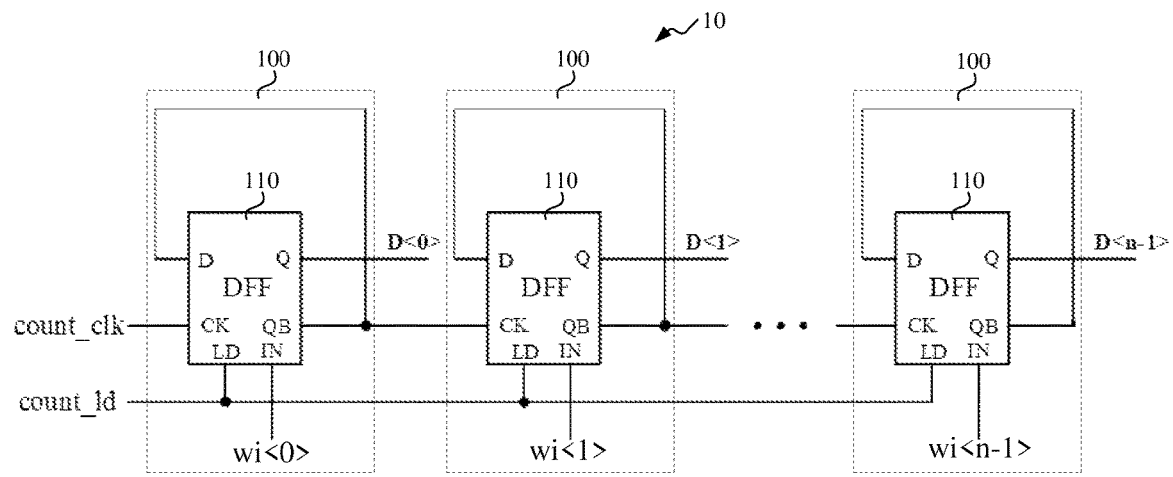
FIG. 3 shows a schematic structural diagram of a counter according to Embodiment 1 of the present disclosure.

As shown in FIG. 3, Embodiment 1 provides a counter 10, comprising N cascaded counting units 100, wherein each counting unit 100 comprises a writable D flip-flop 110, and N is an integer greater than or equal to 1, wherein the writable D flip-flop 110 of each counting unit has a clock input CK, a data input D, a Q output Q, a Q-bar output QB, a control input LD, and a write input IN, wherein the clock input CK of the writable D flip-flop 110 in a current counting unit 100 is connected to the Q-bar output QB or Q output Q of the writable D flip-flop 110 in a counting unit 100 immediately prior to the current counting unit 100, except that the clock input CK of the writable D flip-flop 110 in a first counting unit 100 of the N cascaded counting units 100 receives a clock signal count_clk. The Q-bar output of the writable D flip-flop 110 in each counting unit 100 is connected to the data input D of the same writable D flip-flop, and the Q output of the writable D flip-flop 110 in each counting unit 100 generates a counting result (such as D<0> to D<n−1>). The control input LD of the writable D flip-flop 110 in each counting unit 100 receives a control signal count_ld, and the write input IN of the writable D flip-flop 110 in each counting unit 100 receives a write signal (such as wi<0> to wi<n−1>). When the control signal count_ld is active, the write signal is written into respective writable D flip-flops 110 (for instance, wi<0> to wi<n−1> are respectively written into their corresponding writable D flip-flops 110).

For each two adjacent counting units 100, if the clock input CK of the writable D flip-flop 110 in the latter counting unit 100 is connected to the Q-bar output of the writable D flip-flop 110 in the former counting unit 100, the N cascaded writable D flip-flops 110 form an upward counter; if the clock input CK of the writable D flip-flop 110 in the latter counting unit 100 is connected to the Q output of the writable D flip-flop 110 in the former counting unit 100, the N cascaded writable D flip-flops 110 forms a downward counter. In practice, whether an upward counter or downward counter is adopted may be determined according to specific needs.

Exemplarily, as shown in FIGS. 4 to 7, each of the N cascaded writable D flip-flops 110 has the same circuit structure, and comprises: a write control module 111, an input stage module 112, a master transmission latch module 113, an intermediate stage module 114, a slave transmission latch module 115, and an output stage module 116; wherein The write control module 111 is connected to the control input LD and the write input IN of the corresponding writable D flip-flop 110, performs logical operations on the control signal and the write signal, and generates a first write control signal and a second write control signal;

The input stage module 112 is connected to the clock input CK and the data input D of the corresponding writable D flip-flop 110, transmits a first data signal inputted from the data input D and generates a second data signal under the control of an input clock at the clock input CK of the corresponding writable D flip-flop;

The master transmission latch module 113 is connected to outputs of the write control module 111 and the input stage module 112, and the clock input CK of the corresponding writable D flip-flop 110, transmits the second data signal and generates a third data signal under the control of the input clock, the first write control signal, and the second write control signal, and latches the second data signal and the third data signal;

The intermediate stage module 114 is connected to an output of the master transmission latch module 113 and the clock input CK of the corresponding writable D flip-flop 110, transmits the third data signal, and generates a fourth data signal under the control of the input clock;

The slave transmission latch module 115 is connected to outputs of the write control module 111 and the intermediate stage module 114, and the clock input CK of the corresponding writable D flip-flop 110, transmits the fourth data signal, generates a fifth data signal, and latches the fourth data signal and the fifth data signal under the control of the input clock, the first write control signal, and the second write control signal, respectively;

The output stage module 116 is connected to an output of the slave transmission latch module 115 of the corresponding writable D flip-flop, and outputs of the output stage module 116 serve as the Q-bar output and the Q output of the writable D flip-flop 110 for outputting a fifth data signal and a reverse signal of the fifth data signal, respectively.

Figure 4:
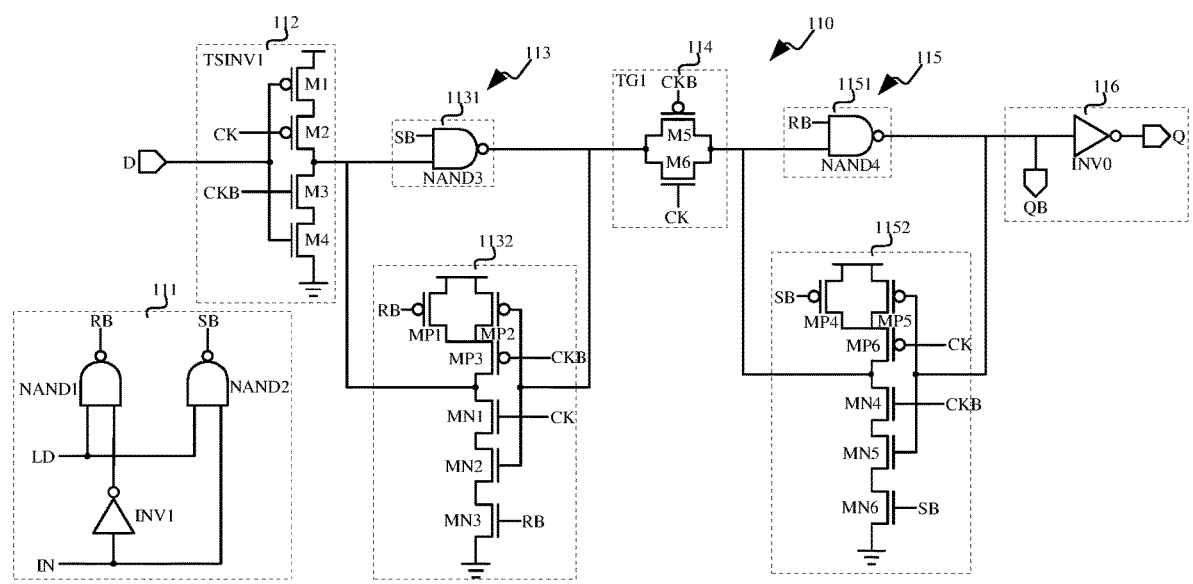
FIG. 4 shows a schematic structural diagram of a writable D flip-flop according to Embodiment 1 of the present disclosure.

Specifically, in one example, as shown in FIG. 4, the write control module 111 comprises: a first NAND gate NAND1, a second NAND gate NAND2, and a first inverter INV1; a first input of the first NAND gate NAND1 receives the control signal, a second input of the first NAND gate NAND1 receives the write signal via the first inverter INV1, and an output of the first NAND gate NAND1 generates a first write control signal RB; a first input of the second NAND gate NAND2 receives the control signal, a second input of the second NAND gate NAND2 receives the write signal, and an output of the second NAND gate NAND2 generates a second write control signal SB.

The input stage module 112 as shown in FIG. 4 comprises a first tri-state inverter TSINV1, which is in an operating state when the input clock is low and generates the second data signal after inverting the first data signal, and is in a high-resistance state when the input clock is high. The first tri-state inverter TSINV1 comprises: a first MOS transistor M1, a second MOS transistor M2, a third MOS transistor M3, and a fourth MOS transistor M4; a gate of the first MOS transistor M1 is connected to a gate of the fourth MOS transistor M4, and serves as an input of the first tri-state inverter TSINV1 receiving the first data signal, a source of the first MOS transistor M1 is connected to a reference voltage, and a drain of the first MOS transistor M1 is connected to a source of the second MOS transistor M2; a gate of the second MOS transistor M2 is connected to the input clock, and a drain of the second MOS transistor M2 is connected to a drain of the third MOS transistor M3 and serves as an output of the first tri-state inverter TSINV1 generating the second data signal; a gate of the third MOS transistor M3 receives an reverse signal of the input clock, and a source of the third MOS transistor M3 is connected to a drain of the fourth MOS transistor M4; a source of the fourth MOS transistor M4 is connected to a reference ground; exemplarily, the first MOS transistor M1 and the second MOS transistor M2 are PMOS transistors, and the third MOS transistor M3 and the fourth MOS transistor M4 are NMOS transistors.

The master transmission latch module 113 as shown in FIG. 4 comprises: a master transmission portion 1131 and a master latch portion 1132. The master transmission portion 1131 comprises a third NAND gate NAND3, a first input of the third NAND gate NAND3 receives the second data signal, a second input of the third NAND gate NAND3 receives the second write control signal SB, and an output of the third NAND gate NAND3 generates the third data signal. The master latch portion 1132 comprises: a first PMOS transistor MP1, a second PMOS transistor MP2, a third PMOS transistor MP3, a first NMOS transistor MN1, a second NMOS transistor MN2, and a third NMOS transistor MN3; a gate of the first PMOS transistor MP1 receives the first write control signal RB, a source of the first PMOS transistor MP1 is connected to the reference voltage, and a drain of the first PMOS transistor MP1 is connected to a drain of the second PMOS transistor MP2; a gate of the second PMOS transistor MP2 is connected to the output of the third NAND gate NAND3, a source of the second PMOS transistor MP2 is connected to the reference voltage, and the drain of the second PMOS transistor MP2 is connected to a source of the third PMOS transistor MP3; a gate of the third PMOS transistor MP3 receives the reverse signal of the input clock, and a drain of the third PMOS transistor MP3 is connected to a drain of the first NMOS transistor MN1 and the first input of the third NAND gate NAND3; a gate of the first NMOS transistor MN1 is connected to the input clock, and a source the first NMOS transistor MN1 is connected to a drain of the second NMOS transistor MN2; a gate of the second NMOS transistor MN2 is connected to the output of the third NAND gate NAND3, and a source of the second NMOS transistor MN2 is connected to a drain of the third NMOS transistor MN3; a gate of the third NMOS transistor MN3 receives the first write control signal RB and a source of the third NMOS transistor MN3 is connected to the reference ground;

The intermediate stage module 114 as shown in FIG. 4 comprises: a first transmission gate TG1 that is turned off when the input clock is low, and turned on when the input clock is high. The first transmission gate TG1 comprises: a fifth MOS transistor M5 and a sixth MOS transistor M6; a gate of the fifth MOS transistor M5 receives the reverse signal of the input clock, and a gate of the sixth MOS transistor M6 is connected to the input clock, and the fifth MOS transistor M5 and the sixth MOS transistor M6 are connected in parallel, one end of which serves as an input of the first transmission gate TG1 receiving the third data signal, and the other end of which serves as an output of the first transmission gate TG1 generating the fourth data signal; exemplarily, the fifth MOS transistor M5 is a PMOS transistor and the sixth MOS transistor M6 is an NMOS transistor.

The slave transmission latch module 115 as shown in FIG. 4 comprises a slave transmission portion 1151 and a slave latch portion 1152. The slave transmission portion 1151 comprises a fourth NAND gate NAND4, a first input of the fourth NAND gate NAND4 receives the fourth data signal, a second input of the fourth NAND gate NAND4 receives the first write control signal RB, and an output of the fourth NAND gate NAND4 generates the fifth data signal. The slave latch portion 1152 comprises: a fourth PMOS transistor MP4, a fifth PMOS transistor MP5, a sixth PMOS transistor MP6, a fourth NMOS transistor MN4, a fifth NMOS transistor MN5, and a sixth NMOS transistor MN6; a gate of the fourth PMOS transistor MP4 receives the second write control signal SB, a source of the fourth PMOS transistor MP4 is connected to the reference voltage, and a drain of the fourth PMOS transistor MP4 is connected to a drain of the fifth PMOS transistor MP5; a gate of the fifth PMOS transistor MP5 is connected to the output of the fourth NAND gate NAND4, a source of the fifth PMOS transistor MP5 is connected to the reference voltage, and the drain of the fifth PMOS transistor MP5 is connected to a source of the sixth PMOS transistor MP6; a gate of the sixth PMOS transistor MP6 is connected to the input clock, and a drain of the sixth PMOS transistor MP6 is connected to a drain of the fourth NMOS transistor MN4 and the first input of the fourth NAND gate NAND4; a gate of the fourth NMOS transistor MN4 receives the reverse signal of the input clock, and a source of the fourth NMOS transistor MN4 is connected to a drain of the fifth NMOS transistor MN5; a gate of the fifth NMOS transistor MN5 is connected to the output of the fourth NAND gate NAND4, and a source of the fifth NMOS transistor MN5 is connected to a drain of the sixth NMOS transistor MN6; a gate of the sixth NMOS transistor MN6 receives the second write control signal SB, and a source of the sixth NMOS transistor MN6 is connected to the reference ground.

The output stage module 116 as shown in FIG. 4 comprises an inverter INV0, wherein an input of the inverter INV0 serves as the Q-bar output of the corresponding writable D flip-flop 110, and an output of the inverter INV0 serves as the Q output of the writable D flip-flop 110.

For the writable D flip-flop in the first counting unit 100 of the N cascaded counting units, its input clock is the clock signal; for each of the writable D flip-flops in the second to Nth counting units 100 of the N cascaded counting units, its input clock is a signal outputted by the Q-bar output or Q output of the writable D flip-flop 110 in the counting unit 100 (for example, the second counting unit) immediately prior to the current counting unit 100 (for example, the third counting unit). In addition, it is to be noted that the present disclosed write control module, master transmission latch module, slave transmission latch module, and the like, may also be adapted on the basis of other existing designs, for example, adjusting the number or position of the inverters, and so on, as long as the adaptations do not affect the realization of above-mentioned functions of the various modules, and such adaptations are all within the scope of the present disclosure.

Figure 5:
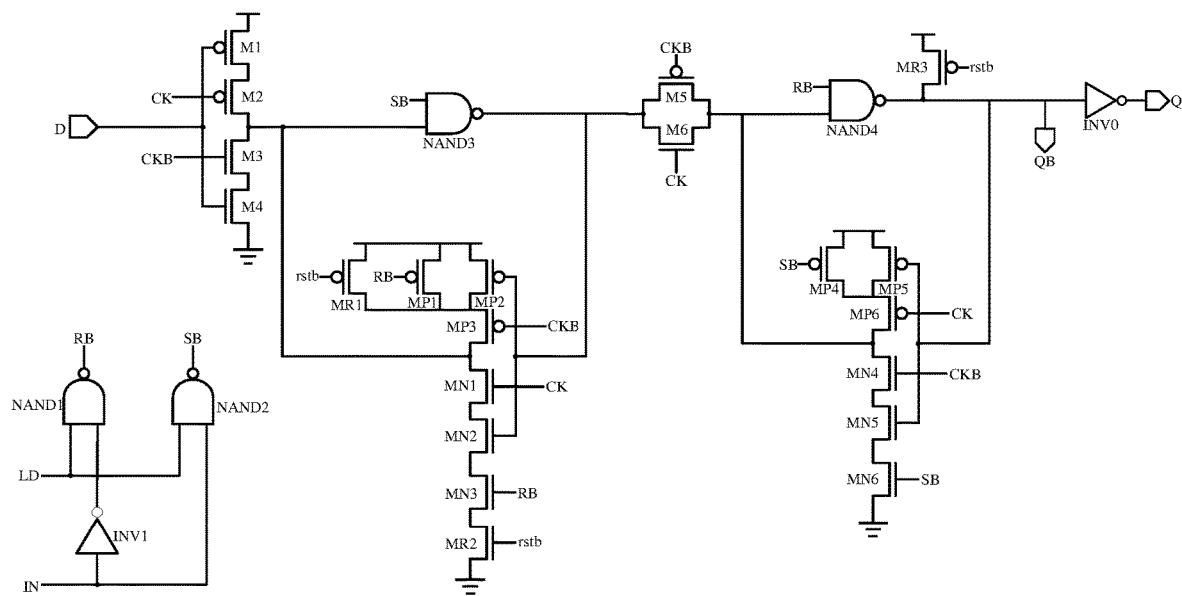
FIG. 5 shows a schematic structural diagram of the writable D flip-flop shown in FIG. 4 with a reset transistor added.

Further, as shown in FIG. 5, the writable D flip-flop 110 may also have a reset function and further comprise: a first reset transistor MR1, a second reset transistor MR2, and a third reset transistor MR3; the first reset transistor MR1 is connected in parallel with the first PMOS transistor MP1, and a gate of the first reset transistor MR1 receives a reverse signal rstb of a reset trigger signal; the second reset transistor MR2 is connected in series between the source of the third NMOS transistor MN3 and the reference ground, and a gate of the second reset transistor MR2 receives the reverse signal rstb of the reset trigger signal; a gate of the third reset transistor MR3 receives the reverse signal rstb of the reset trigger signal, a source of the third reset transistor MR3 is connected to the reference voltage, and a drain of the third reset transistor MR3 is connected to the output of the fourth NAND gate NAND4. Exemplarily, the first reset transistor MR1 and the third reset transistor MR3 are PMOS transistors, and the second reset transistor MR2 is an NMOS transistor.

Herein, the writable D flip-flop 110 have two phases: writing and counting; operations of the writable D flip-flop 110 in the writing phase and the counting phase are described below, respectively.

Writing phase:
The control signal is active and the control signal is "1" (i.e., the corresponding control input LD receives "1"); exemplarily, an initial input clock received by the first counting unit is "0", and a reverse signal of this initial input clock is "1";

If the write signal is "0" (i.e., the corresponding write input IN receives "0"), the first write control signal RB is "0" and the second write control signal SB is "1", at which time, the fourth NAND gate NAND4 outputs "1", that is, the Q-bar output of the writable D flip-flop 110 outputs "1" and the Q output of the writable D flip-flop 110 outputs "0", and the write signal "0" is written into the writable D flip-flop 110;

If the write signal is "1" (i.e., the corresponding write input IN receives "1"), the first write control signal RB is "1" and the second write control signal SB is "0". At this time, if the clock input CK of the writable D flip-flop 110 receives 0, the fourth PMOS transistor MP4 and the sixth PMOS transistor MP6 are turned on, pulling up the first input of the fourth NAND gate NAND4, so that the fourth NAND gate NAND4 outputs "0"; if the clock input CK of the writable D flip-flop 110 receives 1, since the second write control signal SB is "0", the third NAND gate NAND3 outputs "1", which is transmitted through the first transmission gate TG1, and correspondingly the fourth NAND gate NAND4 outputs "0", that is, the Q-bar output of the writable D flip-flop 110 outputs "0", the Q output of the writable D flip-flop 110 outputs "1", and the write signal "1" is written into the writable D flip-flop 110. In the above manner, a desired write signal can be written into the writable D flip-flop of a corresponding bit when the clock input of the writable D flip-flop receives any value.

Counting phase:
If the control signal is inactive, (i.e., the control signal is "0", and the corresponding control input LD receives "0"), the first write control signal RB is "1", the second write control signal SB is "1", and the input clock periodically changes between high level and low level;

When the input clock is "0", the input stage module 112 inverts the first data signal to generate the second data signal and transmits it to the master transmission latch module 113, and the master transmission portion 1131 of the master transmission latch module 113 inverts the second data signal to generate the third data signal and transmits it to the intermediate stage module 114. When the input clock is "1", the master latch portion 1132 in the master transmission latch module 113 latches the second data signal and the third data signal, then the intermediate stage module 114 uses the third data signal as the fourth data signal and transmits it to the slave transmission latch module 115, and then the slave transmission portion 1151 in the slave transmission latch module 115 inverts the fourth data signal to generate the fifth data signal and transmits it to the output stage module 116 for output; the slave latch portion 1152 in the slave transmission latch module 115 latches the fourth data signal and the fifth data signal when the input clock is "0".

Figure 14:
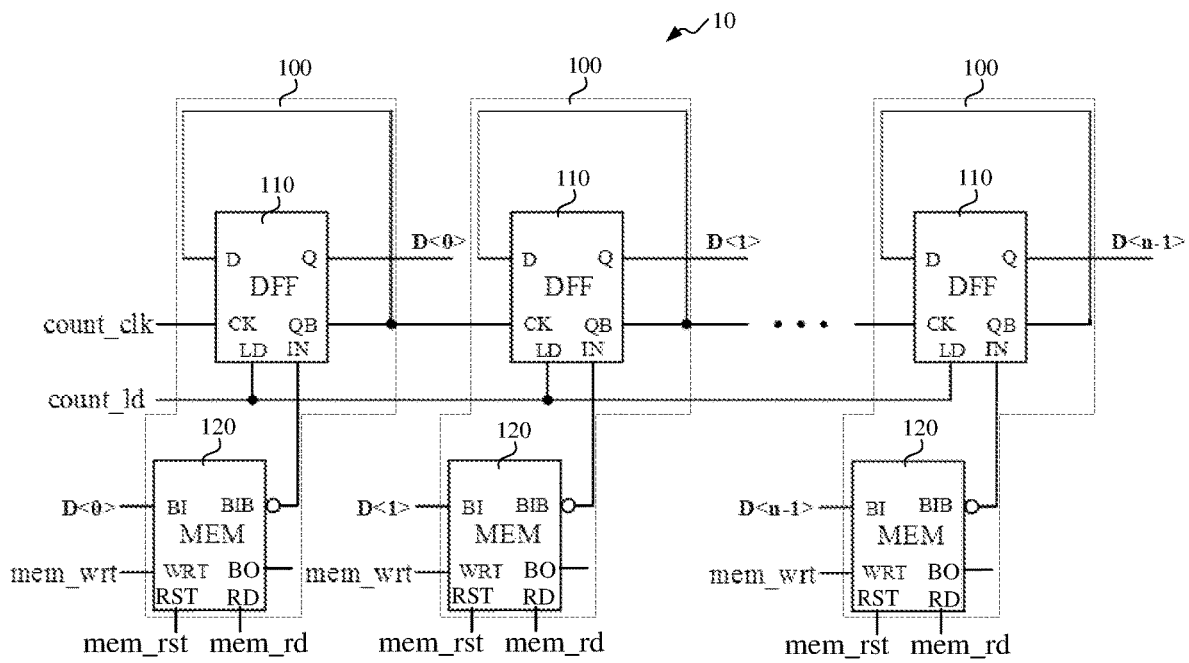
FIG. 14 shows a schematic structural diagram of a counter after a reset function and a read function are added to the first memory according to Embodiment 3 of the present disclosure.

In practice, when the writable D flip-flop 110 performs a reset function: if it does not have reset transistors, the reset function can be realized by writing "0" to the writable D flip-flop 110; if the writable D flip-flop 110 has reset transistors, the reset function can be realized through the reset transistors, or by writing "0" to the writable D flip-flop 110. In one example as shown in FIG. 14, the reset of a certain writable D flip-flop 110 may be realized by resetting a corresponding memory 120 to "0" and writing it to the writable D flip-flop 110.

Figure 6:
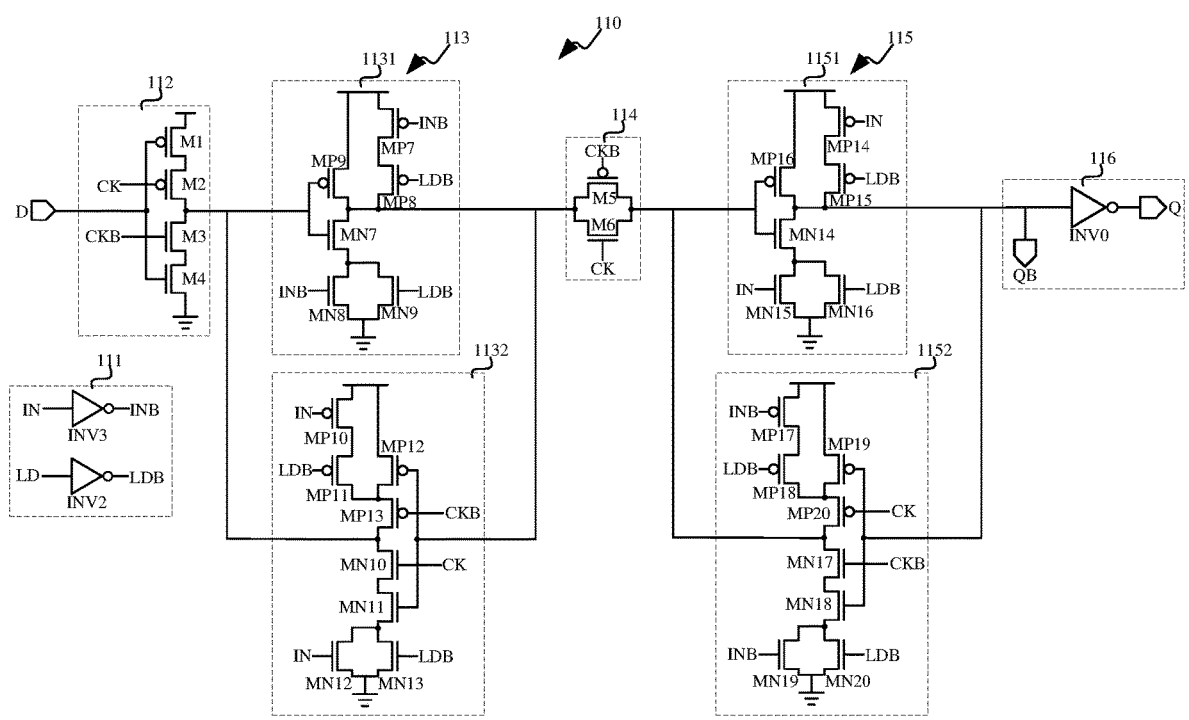
FIG. 6 shows a schematic structural diagram of another writable D flip-flop according to Embodiment 1 of the present disclosure.

In another example as shown in FIG. 6, the write control module 111 comprises: a second inverter INV2 and a third inverter INV3; an input of the second inverter INV2 receives the control signal, and an output the second inverter INV2 generates a first write control signal LDB; an input of the third inverter INV3 receives the write signal, and an output of the third inverter INV3 generates a second write control signal INB.

The circuit structure of the input stage module 112 as shown in FIG. 6 is the same as the one shown in FIG. 4.

The master transmission latch module 113 as shown in FIG. 6 comprises: a master transmission portion 1131 and a master latch portion 1132.

The master transmission portion 1131 comprises: a seventh PMOS transistor MP7, an eighth PMOS transistor MP8, a ninth PMOS transistor MP9, a seventh NMOS transistor MN7, an eighth NMOS transistor MN8, and a ninth NMOS transistor MN9; a gate of the seventh PMOS transistor MP7 receives the second write control signal INB, a source the seventh PMOS transistor MP7 is connected to the reference voltage, and a drain of the seventh PMOS transistor MP7 is connected to a source of the eighth PMOS transistor MP8; a gate of the eighth PMOS transistor MP8 receives the first write control signal LDB, and a drain of the eighth PMOS transistor MP8 is connected to a drain of the ninth PMOS transistor MP9; a gate of the ninth PMOS transistor MP9 is connected to a gate of the seventh NMOS transistor MN7 and connected to the second data signal, a source of the ninth PMOS transistor MP9 is connected to the reference voltage, and the drain of the ninth PMOS transistor MP9 is connected to a drain of the seventh NMOS transistor MN7 and generates the third data signal; a source of the seventh NMOS transistor MN7 is connected to drains of the eighth NMOS transistor MN8 and the ninth NMOS transistor MN9; a gate of the eighth NMOS transistor MN8 receives the second write control signal INB, and a source of the eighth NMOS transistor MN8 is connected to the reference ground; a gate of the ninth NMOS transistor MN9 receives the first write control signal LDB, and a source of the ninth NMOS transistor MN9 is connected to the reference ground.

The master latch portion 1132 comprises: a tenth PMOS transistor MP10, an eleventh PMOS transistor MP11, a twelfth PMOS transistor MP12, a thirteenth PMOS transistor MP13, a tenth NMOS transistor MN10, an eleventh NMOS transistor MN11, a twelfth NMOS transistor MN12, and a thirteenth NMOS transistor MN13; a gate of the tenth PMOS transistor MP10 receives the write signal, a source of the tenth PMOS transistor MP10 is connected to the reference voltage, and a drain of the tenth PMOS transistor MP10 is connected to a source of the eleventh PMOS transistor MP11; a gate of the eleventh PMOS transistor MP11 receives the first write control signal LDB, and a drain of the eleventh PMOS transistor MP11 is connected to a drain of the twelfth PMOS transistor MP12; a gate of the twelfth PMOS transistor MP12 is connected to a gate of the eleventh NMOS transistor MN11 and the drain of the seventh NMOS transistor MN7, a source of the twelfth PMOS transistor MP12 is connected to the reference voltage, and the drain of the twelfth PMOS transistor MP12 is connected to a source of the thirteenth PMOS transistor MP13; a gate of the thirteenth PMOS transistor MP13 receives a reverse signal of the input clock, and a drain of the thirteenth PMOS transistor MP13 is connected to a drain of the tenth NMOS transistor MN10 and to the gate of the seventh NMOS transistor MN7; a gate of the tenth NMOS transistor MN10 is connected to the input clock, and a source of the tenth NMOS transistor MN10 is connected to a drain of the eleventh NMOS transistor MN11; a source of the eleventh NMOS transistor MN11 is connected to drains of the twelfth NMOS transistor MN12 and the thirteenth NMOS transistor MN13; a gate of the twelfth NMOS transistor MN12 receives the write signal, and a source of the twelfth NMOS transistor MN12 is connected to the reference ground; a gate of the thirteenth NMOS transistor MN13 receives the first write control signal LDB and a source of the thirteenth NMOS transistor MN13 is connected to the reference ground;

The circuit structure of the intermediate stage module 114 as shown in FIG. 6 is the same as the one shown in FIG. 4.

The slave transmission latch module 115 as shown in FIG. 6 comprises a slave transmission portion 1151 and a slave latch portion 1152.

The slave transmission portion 1151 comprises: a fourteenth PMOS transistor MP14, a fifteenth PMOS transistor MP15, a sixteenth PMOS transistor MP16, a fourteenth NMOS transistor MN14, a fifteenth NMOS transistor MN15, and a sixteenth NMOS transistor MN16; a gate of the fourteenth PMOS transistor MP14 receives the write signal, a source of the fourteenth PMOS transistor MP14 is connected to the reference voltage, and a drain of the fourteenth PMOS transistor MP14 is connected to a source of the fifteenth PMOS transistor MP15; a gate of the fifteenth PMOS transistor MP15 receives the first write control signal LDB, and a drain of the fifteenth PMOS transistor MP15 is connected to a drain of the sixteenth PMOS transistor MP16; a gate of the sixteenth PMOS transistor MP16 is connected to a gate of the fourteenth NMOS transistor MN14 and the fourth data signal, a source of the sixteenth PMOS transistor MP16 is connected to the reference voltage, and the drain of the sixteenth PMOS transistor MP16 is connected to a drain of the fourteenth NMOS transistor MN14 and generates the fifth data signal; a source of the fourteenth NMOS transistor MN14 is connected to drains of the fifteenth NMOS transistor MN15 and the sixteenth NMOS transistor MN16; a gate of the fifteenth NMOS transistor MN15 receives the write signal and a source of the fifteenth NMOS transistor MN15 is connected to the reference ground; a gate of the sixteenth NMOS transistor MN16 receives the first write control signal LDB and a source of the sixteenth NMOS transistor MN16 is connected to the reference ground.

The slave latch portion 1152 comprises: a seventeenth PMOS transistor MP17, an eighteenth PMOS transistor MP18, a nineteenth PMOS transistor MP19, a twentieth PMOS transistor MP20, a seventeenth NMOS transistor MN17, an eighteenth NMOS transistor MN18, a nineteenth NMOS transistor MN19, and a twentieth NMOS transistor MN20; a gate of the seventeenth PMOS transistor MP17 receives the second write control signal INB, a source of the seventeenth PMOS transistor MP17 is connected to the reference voltage, and a drain of the seventeenth PMOS transistor MP17 is connected to a source of the eighteenth PMOS transistor MP18; a gate of the eighteenth PMOS transistor MP18 receives the first write control signal LDB, and a drain of the eighteenth PMOS transistor MP18 is connected to a drain of the nineteenth PMOS transistor MP19; a gate of the nineteenth PMOS transistor MP19 is connected to a gate of the eighteenth NMOS transistor MN18 and the drain of the fourteenth NMOS transistor MN14, a source of the nineteenth PMOS transistor MP19 is connected to the reference voltage, and the drain of the nineteenth PMOS transistor MP19 is connected to a source of the twentieth PMOS transistor MP20; a gate of the twentieth PMOS transistor MP20 is connected to the input clock, and a drain of the twentieth PMOS transistor MP20 is connected to a drain of the seventeenth NMOS transistor MN17 and the gate of the fourteenth NMOS transistor MN14; a gate of the seventeenth NMOS transistor MN17 receives a reverse signal of the input clock, and a source of the seventeenth NMOS transistor MN17 is connected to a drain of the eighteenth NMOS transistor MN18; a source of the eighteenth NMOS transistor MN18 is connected to drains of the nineteenth NMOS transistor MN19 and the twentieth NMOS transistor MN20; a gate of the nineteenth NMOS transistor MN19 receives the second write control signal INB, and a source of the nineteenth NMOS transistor MN19 is connected to the reference ground; a gate of the twentieth NMOS transistor MN20 receives the first write control signal LDB, and a source of the twentieth NMOS transistor MN20 is connected to the reference ground.

The circuit structure of the output stage module 116 as shown in FIG. 6 is the same as the one shown in FIG. 4.

For the writable D flip-flop in the first counting unit 100 of the N cascaded counting units, its input clock is the clock signal; for each of the writable D flip-flops in the second to Nth counting units 100 of the N cascaded counting units, its input clock is a signal outputted by the Q-bar output or Q output of the writable D flip-flop 110 in the counting unit 100 (for example, the second counting unit) immediately prior to the current counting unit 100 (for example, the third counting unit). The scheme shown in FIG. 6 has a smaller delay and a faster response, compared to the one shown in FIG. 4. In addition, it is to be noted that the present disclosed write control module, master transmission latch module, slave transmission latch module, and the like, may also be adapted on the basis of other existing designs, for example, adjusting the number or position of the inverters, and so on, as long as the adaptations do not affect the realization of above-mentioned functions of the various modules, and such adaptations are all within the scope of the present disclosure.

Figure 7:
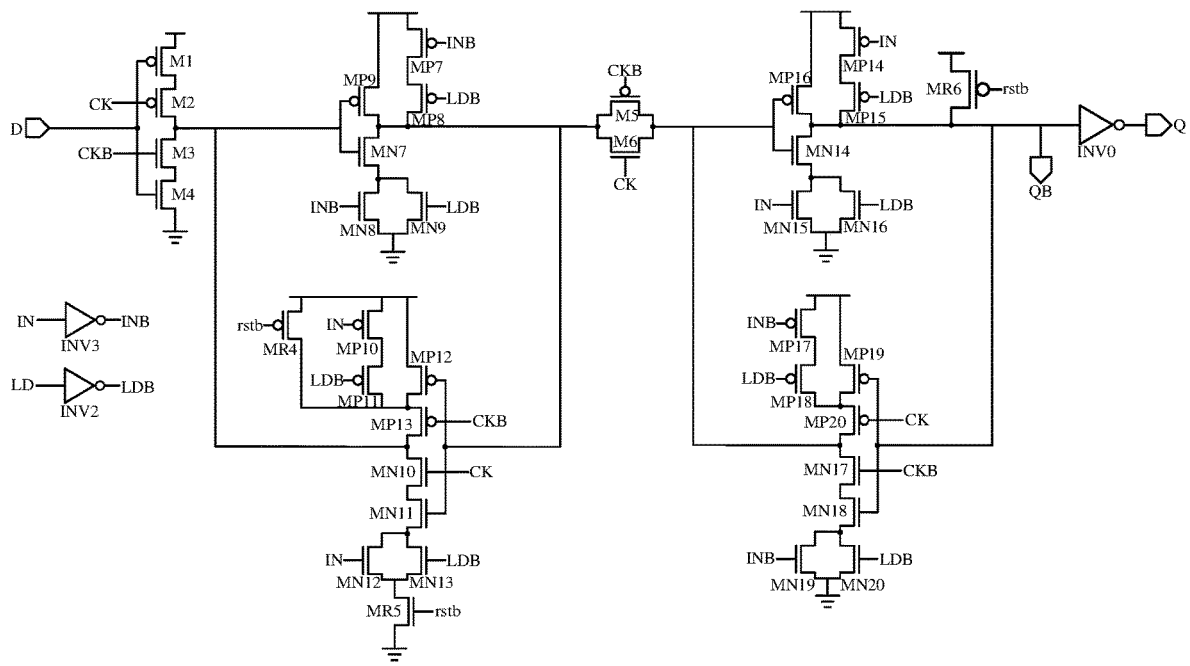
FIG. 7 shows a schematic structural diagram of the writable D flip-flop shown in FIG. 6 with a reset transistor added.

Further, as shown in FIG. 7, the writable D flip-flop 110 may also have a reset function, and further comprise: a fourth reset transistor MR4, a fifth reset transistor MR5, and a sixth reset transistor MR6; a gate of the fourth reset transistor MR4 receives the reverse signal rstb of the reset trigger signal, a source of the fourth reset transistor MR4 is connected to the source of the tenth PMOS transistor MP10, and a drain of the fourth reset transistor MR4 is connected to the drain of the eleventh PMOS transistor MP11; a gate of the fifth reset transistor MR5 receives the reverse signal rstb of the reset trigger signal, a drain of the fifth reset transistor MR5 is connected to sources of the twelfth NMOS transistor MN12 and the thirteenth NMOS transistor MN13, and a source of the fifth reset transistor MR5 is connected to the reference ground; a gate of the sixth reset transistor MR6 receives the reverse signal rstb of the reset trigger signal, a source of the sixth reset transistor MR6 is connected to the reference voltage, and a drain of the sixth reset transistor MR6 is connected to the drain of the sixteenth PMOS transistor MP16. Exemplarily, the fourth reset transistor MR4 and the sixth reset transistor MR6 are PMOS transistors, and the fifth reset transistor MR5 is an NMOS transistor.

Herein, the writable D flip-flop 110 have two phases: writing and counting; operations of the writable D flip-flop 110 in the writing phase and the counting phase are described below, respectively.

Writing phase:

The control signal is active and the control signal is "1" (i.e., the corresponding control input LD receives "1"); exemplarily, an initial input clock received by the first counting unit is "0", and a reverse signal of this initial input clock is "1";

If the write signal is "0" (i.e., the corresponding write input IN receives "0"), the first write control signal LDB is "0" and the second write control signal INB is "1", at which time the fourteenth PMOS transistor MP14 and the fifteenth PMOS transistor MP15 are turned on, so that the Q-bar output of the writable D flip-flop 110 outputs "1" and the Q output of the writable D flip-flop 110 outputs "0", and the write signal "0" is written into the writable D flip-flop 110;

if the write signal is "1" (i.e., the corresponding write input IN receives "1"), the first write control signal LDB is "0" and the second write control signal INB is "0". at this time, if the clock input CK of the writable D flip-flop 110 receives 0, the seventeenth PMOS transistor MP17, the eighteenth PMOS transistor MP18, the twentieth PMOS transistor MP20, the fourteenth NMOS transistor MN14, and the fifteenth NMOS transistor MN15 are turned on; at this time, if the clock input CK of the writable D flip-flop 110 receives 1, the seventh PMOS transistor MP7 and the eighth PMOS transistor MP8 are turned on due to the second write control signal INB being "0" and the first write control signal LDB being "0", and transmission thereof is through the intermediate stage module 114, and correspondingly the fourteenth NMOS transistor MN14 and the fifteenth NMOS transistor MN15 are turned on; that is, the Q-bar output of the writable D flip-flop 110 outputs "0", the Q output of the writable D flip-flop 110 outputs "1", and the write signal "1" is written into the writable D flip-flop 110. In the above manner, a desired write signal can be written into the writable D flip-flop of a corresponding bit when the clock input of the writable D flip-flop receives any value.

Counting phase:

If the control signal is inactive, (i.e., the control signal is "0", and the corresponding control input LD receives "0"), the first write control signal LDB is "1", and the input clock periodically changes between high level and low level;

When the input clock is "0", the input stage module 112 inverts the first data signal to generate the second data signal and transmits it to the master transmission latch module 113, and the master transmission portion 1131 of the master transmission latch module 113 inverts the second data signal to generate the third data signal and transmits it to the intermediate stage module 114. When the input clock is "1", the master latch portion 1132 in the master transmission latch module 113 latches the second data signal and the third data signal, then the intermediate stage module 114 uses the third data signal as the fourth data signal and transmits it to the slave transmission latch module 115, and then the slave transmission portion 1151 in the slave transmission latch module 115 inverts the fourth data signal to generate the fifth data signal and transmits it to the output stage module 116 for output; the slave latch portion 1152 in the slave transmission latch module 115 latches the fourth data signal and the fifth data signal when the input clock is "0".

In practice, when the writable D flip-flop 110 performs a reset function: if it does not have reset transistors, the reset function can be realized by writing "0" to the writable D flip-flop 110; if the writable D flip-flop 110 has reset transistors, the reset function can be realized through the reset transistors, or by writing "0" to the writable D flip-flop 110. In one example as shown in FIG. 14, the reset of a certain writable D flip-flop 110 may be realized by resetting a corresponding memory 120 to "0" and writing it to the writable D flip-flop 110.

Embodiment 2

Figure 8:
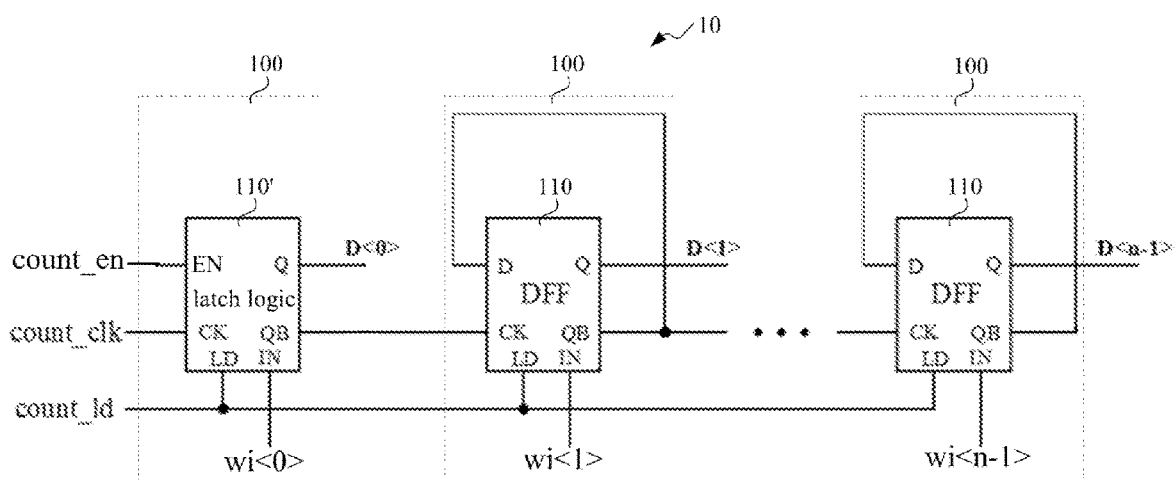
FIG. 8 shows a schematic structural diagram of a counter according to Embodiment 2 of the present disclosure.

As shown in FIG. 8, Embodiment 2 differs from Embodiment 1 in that Embodiment 2 adopts latch logic 110' to replace the writable D flip-flop 110 in the first counting unit 100 of the N cascaded counting units 100; an enable input EN of the latch logic 110' receives a count enable signal count_en, a clock input CK of the latch logic 110' receives a clock signal count_clk, a control input LD of the latch logic 110' receives a control signal count_Id, a write input IN of the latch logic 110' receives a write signal wi<0>, a Q output of the latch logic 110' generates a counting result, and the Q output or a Q-bar output of the latch logic 110' is connected to the clock input CK of the writable D flip-flop 110 in the second counting unit 100. In one example, the latch logic 110' comprises a latch, the control input LD receives the control signal count_Id, and the write input IN receives the write signal wi<0>, and when the control signal count_Id is active, the write signal wi<0> is written into the latch logic 110'. That is, functions of the writable D flip-flop 110 in the first counting unit 100 in Embodiment 1 are realized by the latch in Embodiment 2, and specific ways of realizing the functions are not limited to the described method.

In Embodiment 2, for each two adjacent counting units 100, if the clock input CK of the latter counting unit 100 is connected to the Q-bar output of the former counting unit 100, the latch logic 110' and N−1 writable D flip-flops 110 form an upward counter; if the clock input CK of the latter counting unit 100 is connected to the Q output of the former counting unit 100, the latch logic 110' and N−1 writable D flip-flops 110 form a downward counter. In practice, whether an upward counter or downward counter is adopted may be determined according to specific needs.

Figure 9:
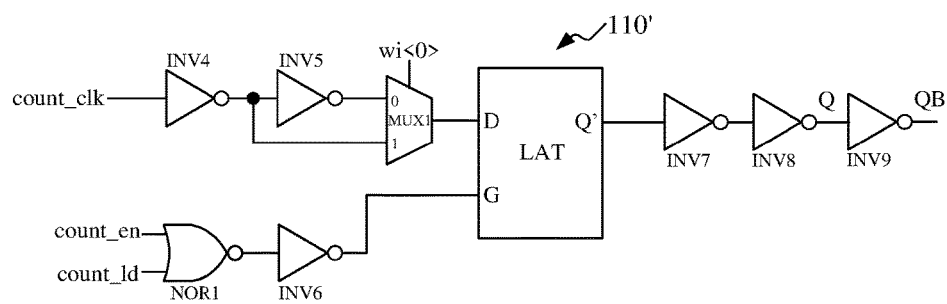
FIG. 9 shows a schematic structural diagram of a latch logic according to Embodiment 2 of the present disclosure.

Exemplarily, as shown in FIG. 9, the latch logic 110' comprises: a latch LAT, a first selector switch MUX1, a first NOR gate NOR1, a fourth inverter INV4, a fifth inverter INV5, a sixth inverter INV6, a seventh inverter INV7, an eighth inverter INV8, and a ninth inverter INV9; the clock signal count_clk is sent to a first input of the first selector switch MUX1 via the fourth inverter INV4 and the fifth inverter INV5, and an output of the fourth inverter INV4 is connected to a second input of the first selector switch MUX1; a control input of the first selector switch MUX1 receives the write signal wi<0>, and an output of the first selector switch MUX1 is connected to a data input of the latch LAT; a first input of the first NOR gate receives the control signal count_Id, a second input of the first NOR gate receives the count enable signal count_en, and an output of the first NOR gate is connected to a clock input of the latch LAT via the sixth inverter INV6; an output of the latch LAT, the seventh inverter INV7, the eighth inverter INV8, and the ninth inverter INV9 are connected in series, wherein an output of the eighth inverter INV8 serves as the Q output of the latch logic 110', and an output of the ninth inverter INV9 serves as the Q-bar output of the latch logic 110'. It should be noted that in the case where the latch logic 110' and the N−1 writable D flip-flops form a downward counter, the latch logic 110' may not comprise the ninth inverter INV9. Other methods capable of realizing counting and writing functions using the latch as the first counting unit are possible and are within the scope of the present disclosure.

Figure 10:
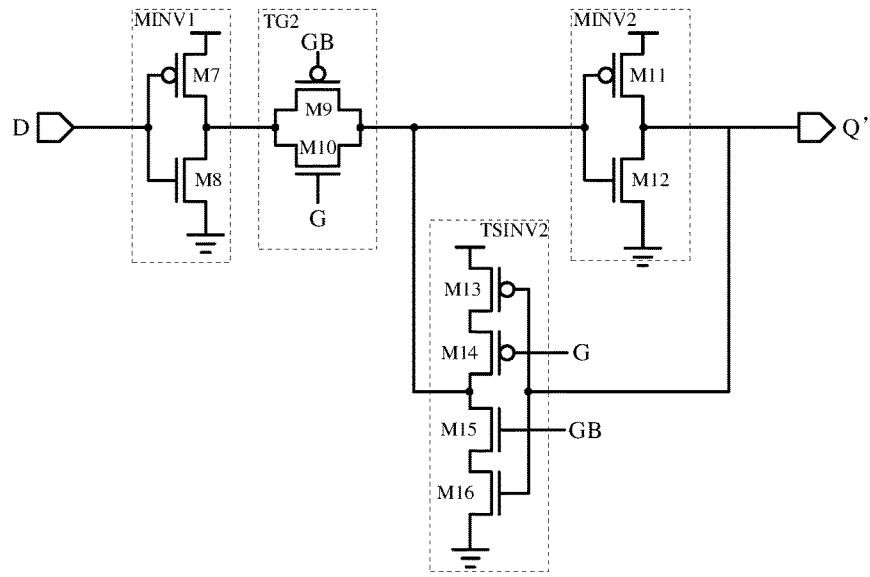
FIG. 10 shows a schematic structural diagram of a latch according to Embodiment 2 of the present disclosure.

Specifically, as shown in FIG. 10, the latch LAT comprises: a first inverted logic gate MINV1, a second transmission gate TG2, a second inverted logic gate MINV2, and a second tri-state inverter TSINV2; the first inverted logic gate MINV1, the second transmission gate TG2, and the second inverted logic gate MINV2 are connected in series between the data input D and the output Q' of the latch LAT, and the second tri-state inverter TSINV2 is connected in parallel with the second inverted logic gate MINV2; the second transmission gate TG2 is turned off when a control clock received by the clock input of the latch LAT is at a low level, and turned on when the control clock is at a high level; the second tri-state inverter TSINV2 is in an operating state when the control clock is at a low level, and is in a high-resistance state when the control clock is at a high level.

Specifically, the first inverted logic gate MINV1 comprises: a seventh MOS transistor M7 and an eighth MOS transistor M8; a gate of the seventh MOS transistor M7 is connected to a gate of the eighth MOS transistor M8 and serves as an input of the first inverted logic gate MINV1, a source of the seventh MOS transistor M7 is connected to the reference voltage, and a drain of the seventh MOS transistor M7 is connected to a drain of the eighth MOS transistor M8 and serves as an output of the first inverted logic gate MINV1; a source of the eighth MOS transistor M8 is connected to the reference ground. Exemplarily, the seventh MOS transistor M7 is a PMOS transistor and the eighth MOS transistor M8 is an NMOS transistor.

The second transmission gate TG2 comprises: a ninth MOS transistor M9 and a tenth MOS transistor M10; a gate of the ninth MOS transistor M9 receives an reverse signal of the control clock, a gate of the tenth MOS transistor M10 is connected to the control clock; the ninth MOS transistor M9 and the tenth MOS transistor M10 are connected in parallel, one end of which serves as an input of the second transmission gate TG2, and the other end of which serves as an output of the second transmission gate TG2; exemplarily, the ninth MOS transistor M9 is a PMOS transistor and the tenth MOS transistor M10 is an NMOS transistor.

The second inverted logic gate MINV2 comprises: an eleventh MOS transistor M11 and a twelfth MOS transistor M12; a gate of the eleventh MOS transistor M11 is connected to a gate of the twelfth MOS transistor M12 and serves as an input of the second inverted logic gate MINV2, a source of the eleventh MOS transistor M11 is connected to the reference voltage, a drain of the eleventh MOS transistor M11 is connected to a drain of the twelfth MOS transistor M12 and serves as an output of the second inverted logic gate MINV2; a source of the twelfth MOS transistor M12 is connected to the reference ground. Exemplarily, the eleventh MOS transistor M11 is a PMOS transistor and the twelfth MOS transistor M12 is an NMOS transistor.

The second tri-state inverter TSINV2 comprises: a thirteenth MOS transistor M13, a fourteenth MOS transistor M14, a fifteenth MOS transistor M15, and a sixteenth MOS transistor M16; a gate of the thirteenth MOS transistor M13 is connected to a gate of the sixteenth MOS transistor M16 and serves as an input of the second tri-state inverter TSINV2, a source of the thirteenth MOS transistor M13 is connected to the reference voltage, and a drain of the thirteenth MOS transistor M13 is connected to a source of the fourteenth MOS transistor M14; a gate of the fourteenth MOS transistor M14 is connected to a control clock, a drain of the fourteenth MOS transistor M14 is connected to a drain of the fifteenth MOS transistor M15 and serves as an output of the second tri-state inverter TSINV2; a gate of the fifteenth MOS transistor M15 receives the reverse signal of the control clock, and a source of the fifteenth MOS transistor M15 is connected to a drain of the sixteenth MOS transistor M16; a source of the sixteenth MOS transistor M16 is connected to the reference ground; exemplarily, the thirteenth MOS transistor M13 and the fourteenth MOS transistor M14 are PMOS transistors, and the fifteenth MOS transistor M15 and the sixteenth MOS transistor M16 are NMOS transistors.

The latch logic 110' have two phases: writing and counting:
  Writing phase:
    The control signal is active and the count enable signal is inactive (i.e., the control signal is "1" and the count enable signal is "0"); exemplarily, an initial input clock received by the first counting unit is "0", and a reverse signal of this initial input clock is "1";
    If the write signal is "0" (i.e., the write signal wi<0> is "0"), the first selector switch MUX1 is switched to channel 0, and the clock signal "0" is inverted twice, transmitted to the latch LAT and output as "0" after it passes through the latch LAT, in which case, the Q output of the latch logic 110' outputs "0", and the write signal "0" is written;

If the write signal is "1" (i.e., the write signal wi<0> is "1"), the first selector switch MUX1 is switched to channel 1, and the clock signal "0" is inverted once, transmitted to the latch LAT and output as "1" after it passes through the latch LAT, in which case, the Q output of the latch logic 110' outputs "1", and the write signal "1" is written;

Counting phase:

The control signal is inactive and the count enable signal is active (i.e., the control signal is "0", the count enable signal is "1"), and the clock signal periodically changes between high level and low level.

When the write signal of the corresponding bit is "0" (i.e., the write signal wi<0> is "0"), the first selector switch MUX1 of the latch logic is switched to channel 0, based on which counting is carried out; when the write signal of the corresponding bit is "1" (i.e., the write signal wi<0> is "1"), the first selector switch MUX1 of the latch logic is switched to channel 1, based on which counting is carried out. During counting, the data signal received by the data input D is transmitted to the output Q' of the latch logic after the data signal passes through the latch LAT; after counting, the count enable signal is inactive (i.e., the count enable signal is "0"), and the output of the latch logic is latched by the latch LAT.

The latch logic 110' may also have a reset phase, in which count_en is 0, count_clk is also 0, and count_ld is enabled to be high level for a short period of time before the formal counting, at which time the latch LAT is turned on, and an initial value of 0 of count_clk is written into the latch LAT to reset the latch LAT. In one example as shown in FIG. 14, the memory can be reset to 0 by a memory reset signal mem_rst, the first selector switch MUX1 is switched to channel 0, the clock signal "0" is transmitted to the latch LAT after being inverted twice and output as "0" after it passes through the latch LAT, in which case, the Q output of the latch logic 110' outputs "0" and the latch LAT is reset to "0".

Embodiment 3

Figure 11:
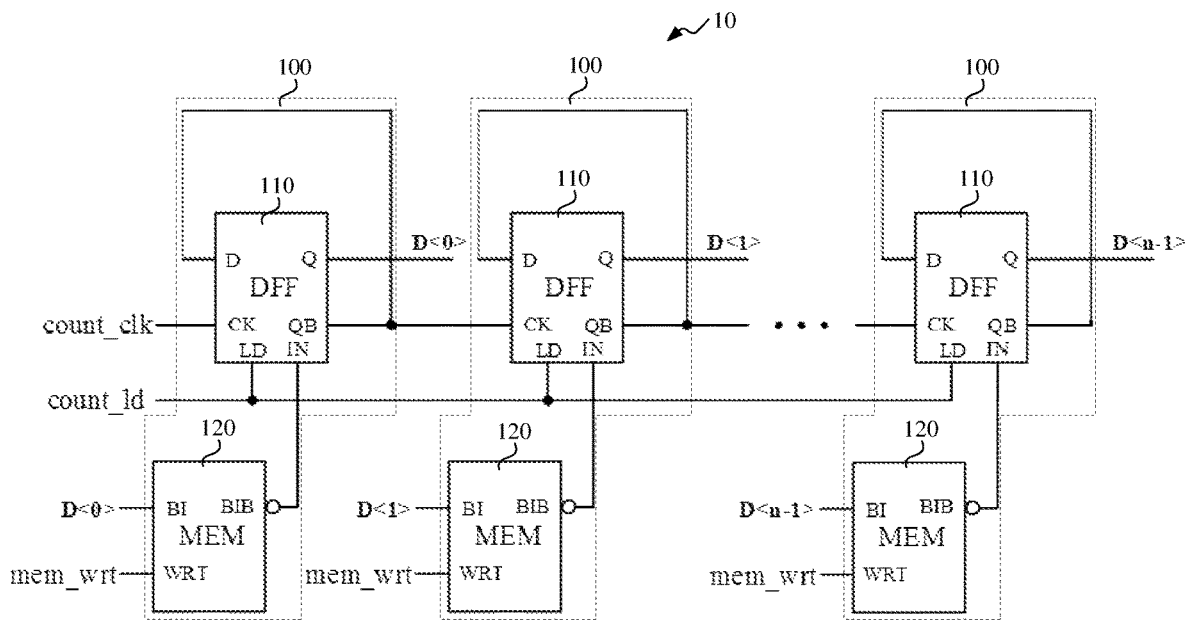
FIG. 11 shows a schematic structural diagram of a counter according to a first example of Embodiment 3 of the present disclosure.
Figure 12:
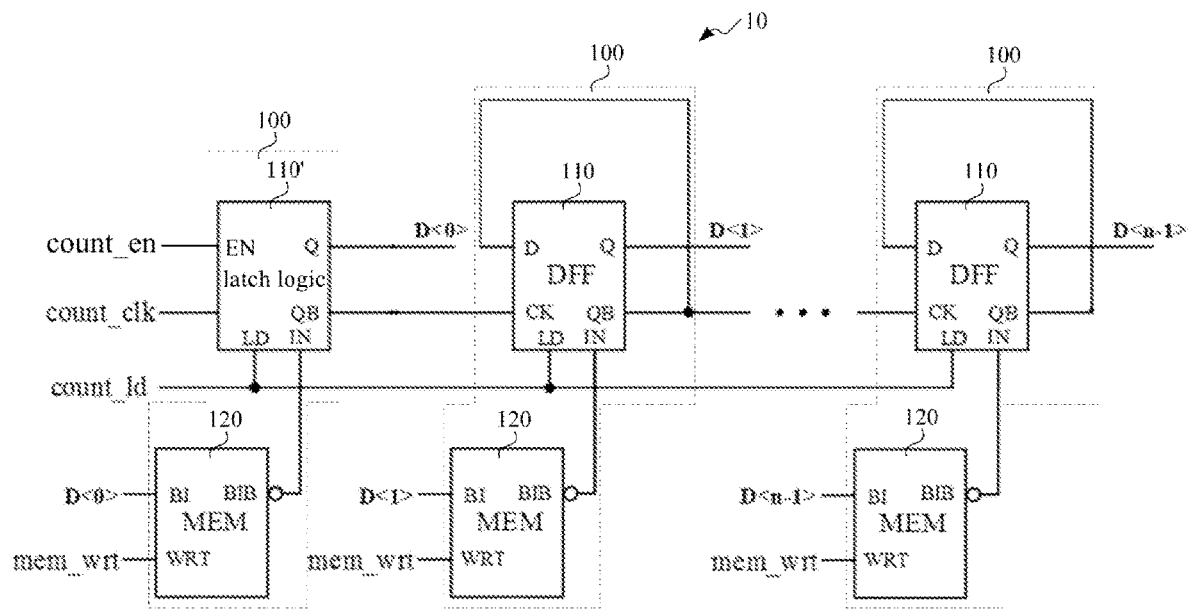
FIG. 12 shows a schematic structural diagram of a counter according to a second example of Embodiment 3 of the present disclosure.

As shown in FIGS. 11 and 12, Embodiment 3 differs from Embodiment 1 and Embodiment 2 in that each counting unit 100 of Embodiment 3 further comprises a first memory 120 storing and providing the write signal.

Further, the first memory 120 may also store the counting result, in which case, a store control terminal WRT of the first memory 120 receives the store enable signal mem_wrt, an input BI of the first memory 120 receives the counting result, and a write output of the first memory 120 generates the write signal. Optionally, an inverted output BIB of the first memory 120 serves as its write output which generates the write signal after inverting the counting result stored in the first memory 120, i.e., the write signal is a reverse signal of the counting result.

Figure 13:
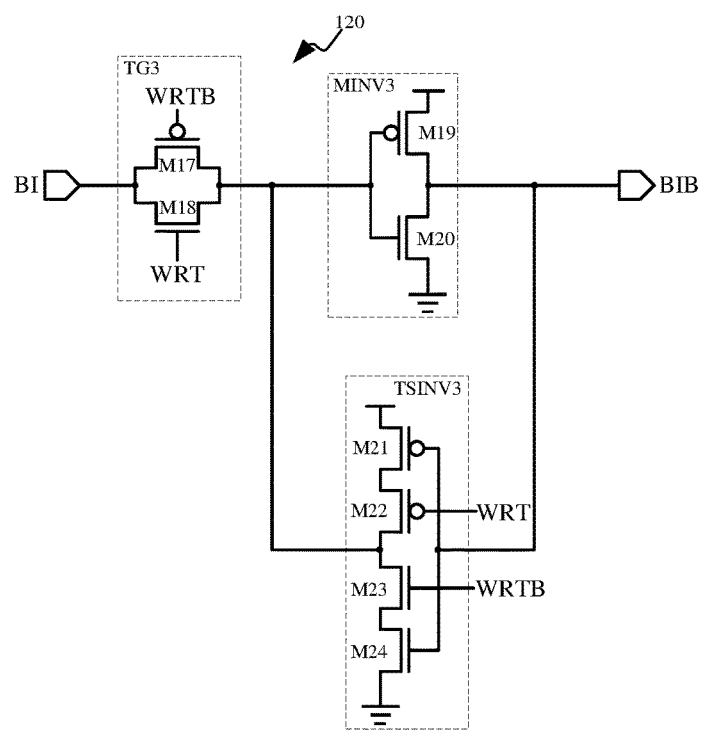
FIG. 13 shows a schematic structural diagram of a first memory according to Embodiment 3 of the present disclosure.

Specifically, as shown in FIG. 13, the first memory 120 comprises: a third transmission gate TG3, a third inverted logic gate MINV3, and a third tri-state inverter TSINV3; the third transmission gate TG3 and the third inverted logic gate MINV3 are connected in series between the input and the write output (i.e., the inverted output) of the first memory 120, and the third tri-state inverter TSINV3 is connected in parallel with the third inverted logic gate MINV3; the third transmission gate TG3 is turned off when the store enable signal mem_wrt is at a low level and is turned on when the store enable signal mem_wrt is at a high level; the third tri-state inverter TSINV3 is in an operating state when the store enable signal mem_wrt is at a low level and is in a high-resistance when the store enable signal mem_wrt is at a high level.

When the store enable signal mem_wrt is active (i.e., the store enable signal mem_wrt is "1"), the third transmission gate TG3 transmits the counting result to the third inverting logic gate MINV3, which generates the write signal after inverting the counting result; when the store enable signal mem_wrt is inactive (i.e., the store enable signal mem_wrt is "0"), the third tri-state inverter TSINV3 latches the counting result and the write signal.

More specifically, the third transmission gate TG3 comprises: a seventeenth MOS transistor M17 and an eighteenth MOS transistor M18; a gate of the seventeenth MOS transistor M17 receives an reverse signal of the store enable signal, a gate of the eighteenth MOS transistor M18 receives the store enable signal; the seventeenth MOS transistor M17 and the eighteenth MOS transistor M18 are connected in parallel, one end of which serves as an input of the third transmission gate TG3, and the other end of which serves as an output of the third transmission gate TG3; exemplarily, the seventeenth MOS transistor M17 is a PMOS transistor and the eighteenth MOS transistor M18 is an NMOS transistor.

The third inverted logic gate MINV3 comprises: a nineteenth MOS transistor M19 and a twentieth MOS transistor M20; a gate of the nineteenth MOS transistor M19 is connected to a gate of the twentieth MOS transistor M20 and serves as an input of the third inverted logic gate MINV3, a source of the nineteenth MOS transistor M19 is connected to the reference voltage, and a drain of the nineteenth MOS transistor M19 is connected to a drain of the twentieth MOS transistor M20 and serves as an output of the third inverted logic gate MINV3; a source of the twentieth MOS transistor M20 is connected to the reference ground. Exemplarily, the nineteenth MOS transistor M19 is a PMOS transistor and the twentieth MOS transistor M20 is an NMOS transistor.

The third tri-state inverter TSINV3 comprises: a twenty-first MOS transistor M21, a twenty-second MOS transistor M22, a twenty-third MOS transistor M23, and a twenty-fourth MOS transistor M24; a gate of the twenty-first MOS transistor M21 is connected to a gate of the twenty-fourth MOS transistor M24 and serves as an input of the third tri-state inverter TSINV3, a source of the twenty-first MOS transistor M21 is connected to the reference voltage, and a drain of the twenty-first MOS transistor M21 is connected to a source of the twenty-second MOS transistor M22; a gate of the twenty-second MOS transistor M22 receives the store enable signal, and a drain of the twenty-second MOS transistor M22 is connected to a drain of the twenty-third MOS transistor M23 and serves as an output of the third tri-state inverter TSINV3; a gate of the twenty-third MOS transistor M23 receives the reverse signal of the store enable signal, and a source of the twenty-third MOS transistor M23 is connected to a drain of the twenty-fourth MOS transistor M24; a source of the twenty-fourth MOS transistor M24 is connected to the reference ground; exemplarily, the twenty-first MOS transistor M21 and the twenty-second MOS transistor M22 are PMOS transistors, and the twenty-third MOS transistor M23 and the twenty-fourth MOS transistor M24 are NMOS transistors.

Further, as shown in FIG. 14, the first memory 120 may also have a reset function, in which case, a reset input RST of the first memory 120 receives the memory reset signal mem_rst; and/or the first memory 120 may also have a read function where the counting result stored thereon is read out, in which case, a read control input RD of the first memory 120 receives a read enable signal mem_rd, and a read output BO of the first memory 120 generates a read signal, wherein a normal output of the first memory 120 serves as its read output BO.

Figure 15:
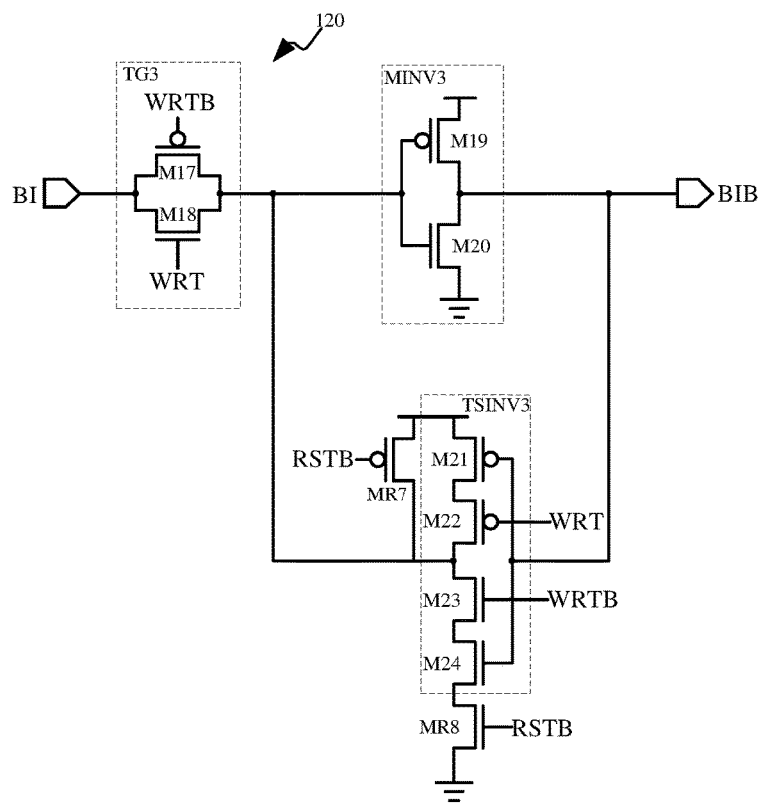
FIG. 15 shows a schematic structural diagram of the first memory with a reset function according to Embodiment 3 of the present disclosure.

In a first example of Embodiment 3, as shown in FIG. 15, when the first memory 120 has the reset function, the first memory 120 further comprises: a seventh reset transistor MR7 and an eighth reset transistor MR8; the seventh reset transistor MR7 is connected in parallel between the reference voltage and the output of the third tri-state inverter TSINV3, and a gate of the seventh reset transistor MR7 receives a reverse signal RSTB of the memory reset signal mem_rst; the eighth reset transistor MR8 is connected in series between a source of the NMOS transistor (i.e., the twenty-fourth MOS transistor M24) in the third tri-state inverter TSINV3 and the reference ground, and a gate of the eighth reset transistor MR8 receives the reverse signal RSTB of the memory reset signal mem_rst. Exemplarily, the seventh reset transistor MR7 is a PMOS transistor and the eighth reset transistor MR8 is an NMOS transistor. In practice, when the writable D flip-flop 110 has reset transistors, there may be no need to introduce a reset function to the first memory 120, and instead, reset operations may be performed directly through the reset transistors in the writable D flip-flop 110, making the timing diagram simpler.

Figure 16:
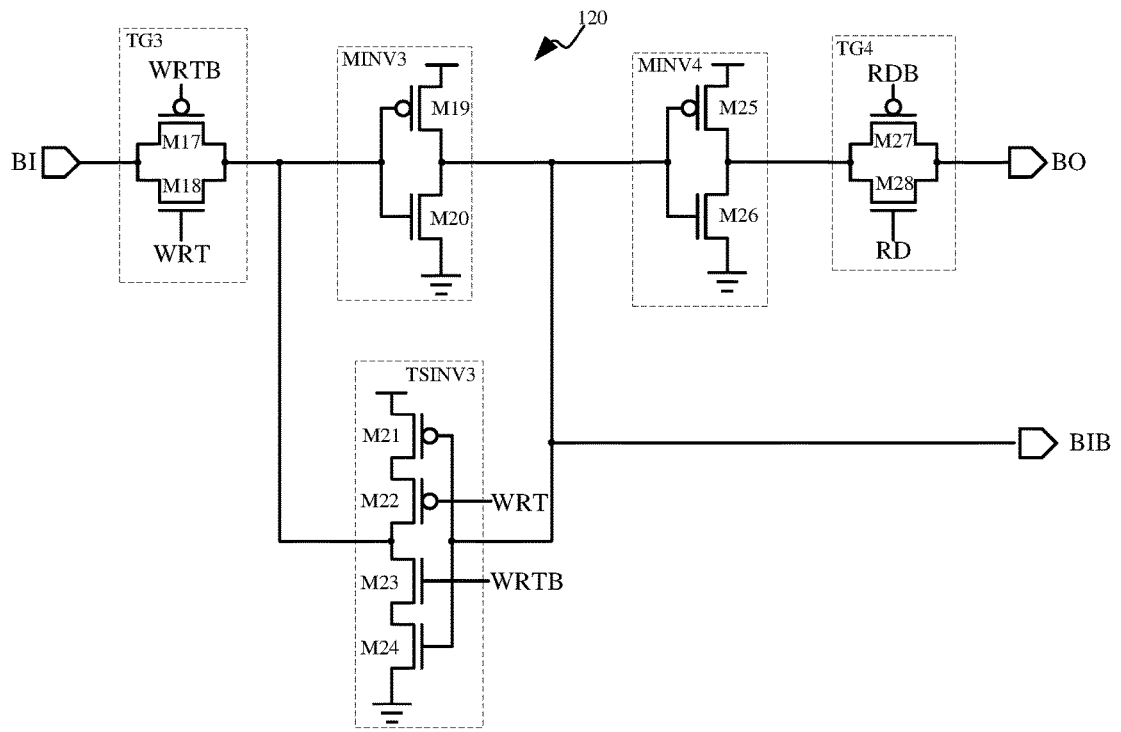
FIG. 16 shows a schematic structural diagram of the first memory with a read function according to Embodiment 3 of the present disclosure.

In a second example of Embodiment 3, as shown in FIG. 16, when the first memory 120 also has the read function, the first memory 120 further comprises: a fourth inverted logic gate MINV4 and a fourth transmission gate TG4; the fourth inverted logic gate MINV4 and the fourth transmission gate TG4 are connected in series between the write output BIB (inverted output) and the read output BI (normal output) of the first memory 120; the fourth transmission gate TG4 is turned off when the read enable signal is at a low level and is turned on when the read enable signal is at a high level.

Specifically, the fourth inverted logic gate MINV4 comprises: a twenty-fifth MOS transistor M25 and a twenty-sixth MOS transistor M26; a gate of the twenty-fifth MOS transistor M25 is connected to a gate of the twenty-sixth MOS transistor M26 and serves as an input of the fourth inverted logic gate MINV4, a source of the twenty-fifth MOS transistor M25 is connected to the reference voltage, and a drain of the twenty-fifth MOS transistor M25 is connected to a drain of the twenty-sixth MOS transistor M26 and serves as an output of the fourth inverted logic gate MINV4; a source of the twenty-sixth MOS transistor M26 is connected to the reference ground. Exemplarily, the twenty-fifth MOS transistor M25 is a PMOS transistor and the twenty-sixth MOS transistor M26 is an NMOS transistor.

The fourth transmission gate TG4 comprises: a twenty-seventh MOS transistor M27 and a twenty-eighth MOS transistor M28; a gate of the twenty-seventh MOS transistor M27 receives an reverse signal of the read enable signal, and a gate of the twenty-eighth MOS transistor M28 receives the read enable signal; the twenty-seventh MOS transistor M27 and the twenty-eighth MOS transistor M28 are connected in parallel, one end of which serves as an input of the fourth transmission gate TG4, and the other end of which serves as an output of the fourth transmission gate TG4; Exemplarily, the twenty-seventh MOS transistor M27 is a PMOS transistor and the twenty-eighth MOS transistor M28 is an NMOS transistor.

Figure 17:
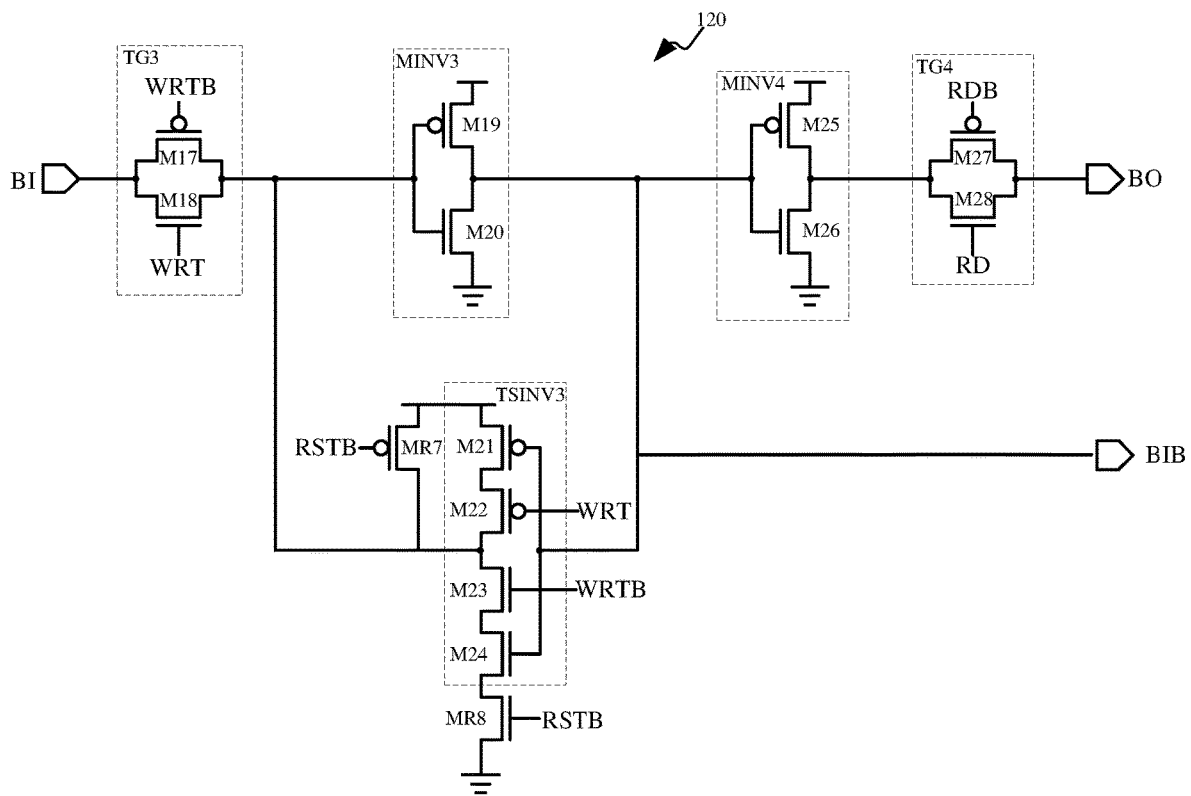
FIG. 17 shows a schematic structural diagram of the first memory with a reset function and a read function according to Embodiment 3 of the present disclosure.

In a third example of Embodiment 3, as shown in FIG. 17, when the first memory 120 has both the reset function and the read function, the first memory comprises the seventh reset transistor MR7 and the eighth reset transistor MR8, as well as the fourth inverted logic gate MINV4 and the fourth transmission gate TG4; circuit structures and control mechanism of the seventh reset transistor MR7, the eighth reset transistor MR8, the fourth inverted logic gate MINV4, and the fourth transmission gate TG4 are the same as those detailed in the foregoing examples.

Embodiment 4

Figure 18:
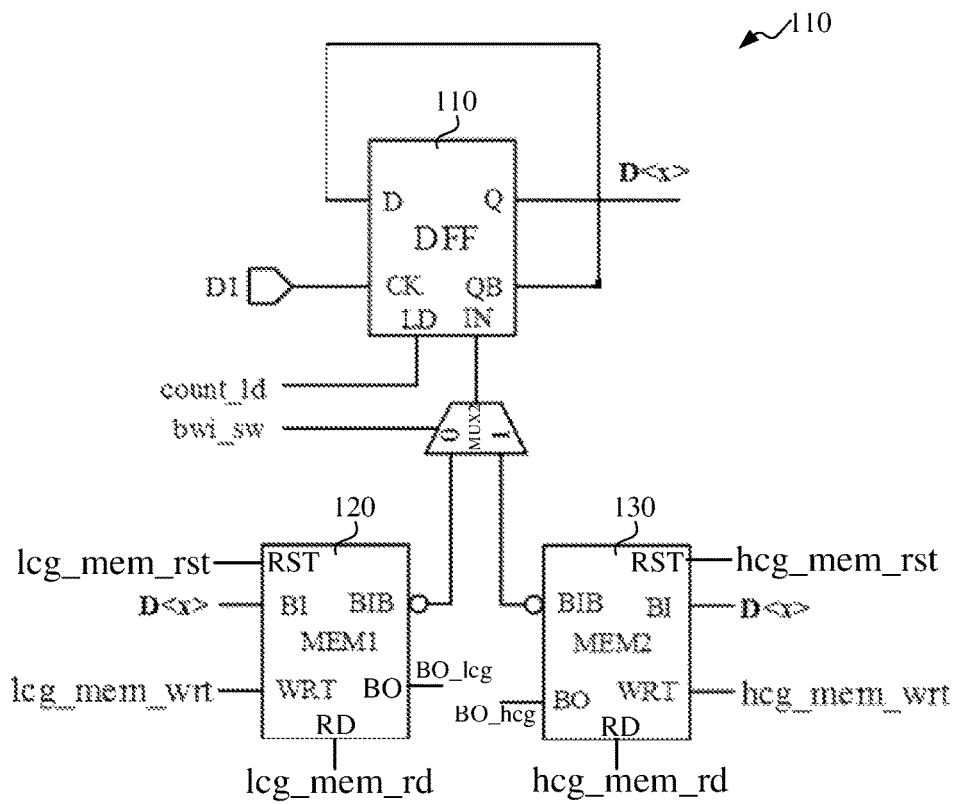
FIG. 18 shows a schematic structural diagram of a counter according to a first example of Embodiment 4 of the present disclosure, wherein only one counting unit thereof is shown.

As shown in FIG. 18, Embodiment 4 differs from Embodiment 1 and Embodiment 2 in that the counting unit 100 of Embodiment 4 comprises: a first memory 120, a second memory 130, and a second selector switch MUX2, and based on the selection of the second selector switch MUX2, the first memory 120 or the second memory 130 generates the write signal.

Further, the first memory 120 and the second memory 130 store the counting result; a store control terminal WRT of the first memory 120 receives a first store enable signal lcg_mem_wrt, an input of memory the first memory 120 receives the counting result D<x>, and a write output BIB of the first memory is connected to a first input of the second selector switch MUX2; a store control terminal WRT of the second memory 130 receives a second store enable signal hcg_mem_wrt, an input of the second memory receives the counting result D<x>, and a write output BIB of the second memory is connected to a second input of the second selector switch MUX2; a control input of the second selector switch MUX2 receives a selector signal bwi_sw, and an output of the second selector switch MUX2 generates the write signal. Optionally, an inverted output of the first memory 120 serves as its write output BIB, and an inverted output of the second memory 130 serves as its write output BIB, so that a reverse signal of the counting result stored in the first memory 120 or second memory 130 is selected to be the write signal. Circuit structures of the first memory 120 and the second memory 130 in Embodiment 4 are the same as the circuit structure of the first memory 120 in Embodiment 3, but with different signals.

Further, the first memory 120 may also have a reset function and/or a read function; when the first memory 120 has a reset function, a reset input RST of the first memory 120 receives a first memory reset signal; when the first memory 120 has a read function, a read control input RD of the first memory 120 receives a first read enable signal, and a read output BO of the first memory 120 generates a first read signal, wherein a normal output of the first memory 120 serves as the read output BO. The second memory 130 may also have a reset function and/or a read function; when the second memory 130 has a reset function, a reset input RST of the second memory 130 receives a second memory reset signal; when the second memory 130 has a read function, a read control input RD of the second memory 130 receives a second read enable signal, and a read output BO of the second memory 130 generates a second read signal, wherein a normal output of the second memory 120 serves as the read output BO. After introducing the reset function and the read function, circuit structures of the first memory 120 and the second memory 130 in Embodiment 4 are still the same as the circuit structure of the first memory 120 in Embodiment 3, but with different signals.

In a practical application, either both the first memory 120 and the second memory 130 have a reset function or neither of them has a reset function, and the situation where one memory has a reset function and the other memory does not have a reset function is rare; however, it is possible one memory has a read function and the other memory does not have a read function.

Figure 19:
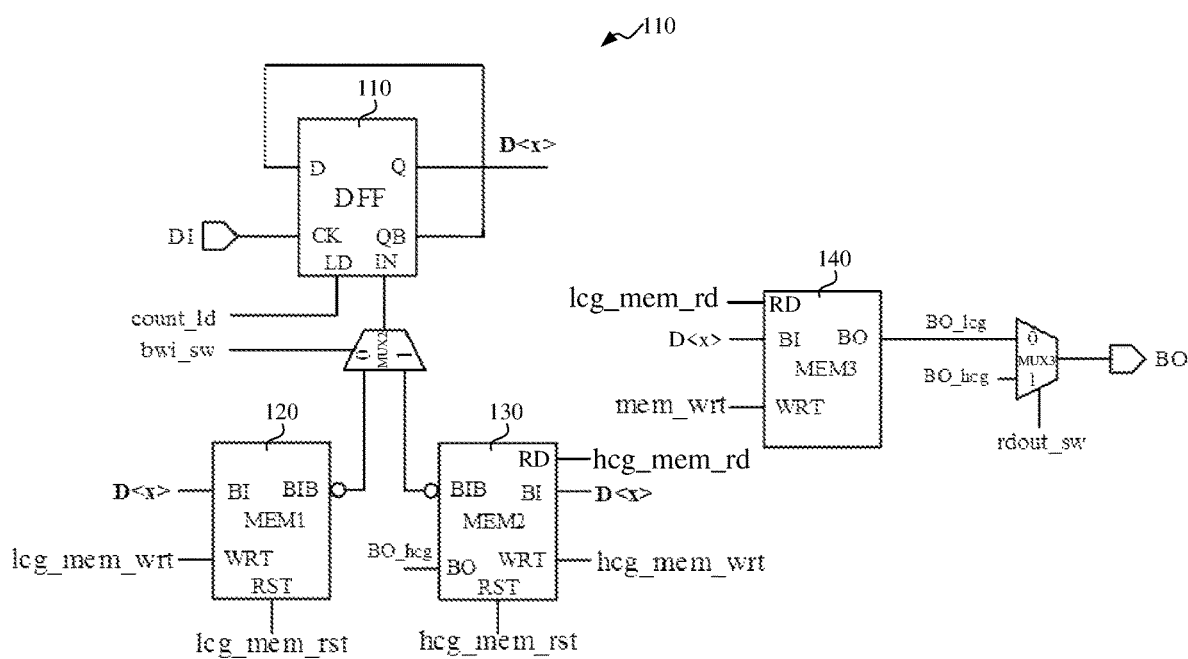

As shown in FIG. 19, in the case where only one of the first memory 120 and the second memory 130 has a read function (for example, the first memory 120 does not have a read function but the second memory 130 has a read function), the counting unit 100 further comprises: a third memory 140 and a third selector switch MUX3, and the third memory 140 cooperates with the first memory 120 to realize the read function; a store control terminal of the third memory 140 receives a third store enable signal, an input of the third memory 140 receives the counting result, a read control terminal of the third memory 140 receives a third read enable signal, and a normal output of the third memory 140 serves as its read output; a control input of the third selector switch MUX3 receives a read control signal, a first input of the third selector switch MUX3 is connected to the read output of the second memory 130, a second input of the third selector switch MUX3 is connected to the read output of the third memory 140, and an output of the third selector switch MUX3 generates a selected read signal (either a read signal BO_lcg from the third memory or a read signal BO_hcg from the second memory).

Figure 20:
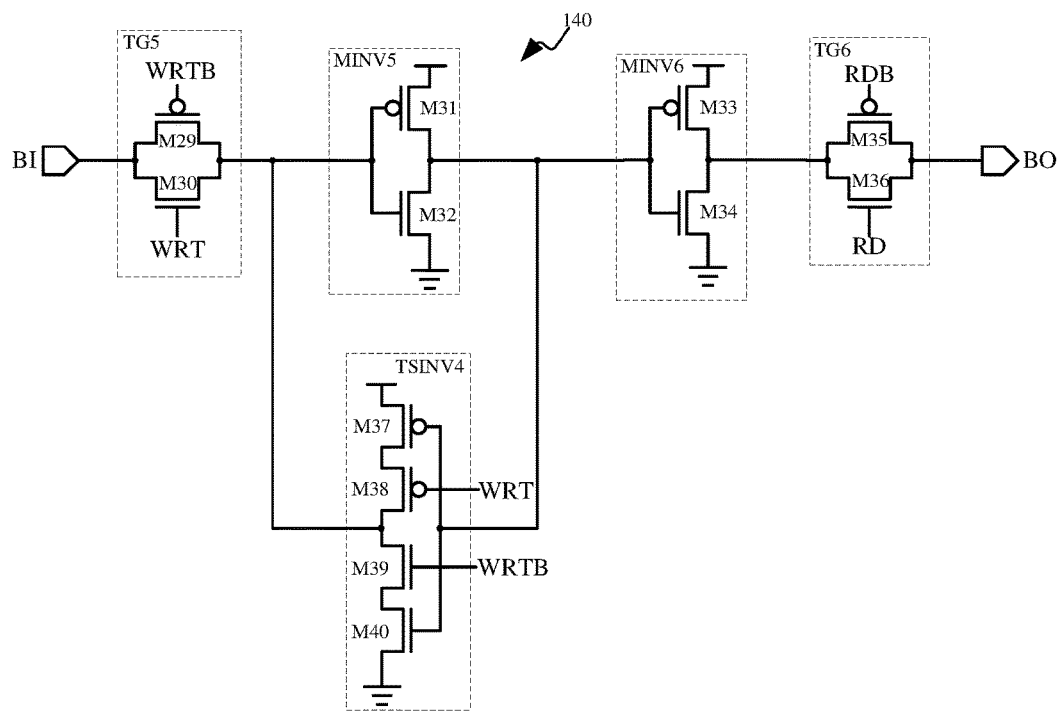
FIG. 20 shows a schematic structural diagram of a third memory according to Embodiment 4 of the present disclosure.

Specifically, as shown in FIG. 20, the third memory 140 comprises: a fifth transmission gate TG5, a fifth reverse logic gate MINV5, a fourth tri-state inverter TSINV4, a sixth reverse logic gate MINV6, and a sixth transmission gate TG6; the fifth transmission gate TG5, the fifth reverse logic gate MINV5, the sixth reverse logic gate MINV6, and the sixth transmission gate TG6 are connected sequentially in series between the input and read output of the third memory 140, and the fourth tri-state inverter TSINV4 is connected in parallel with the fifth inverted logic gate MINV5; the fifth transmission gate TG5 is turned off when the third store enable signal is at a low level, and is turned on when the third store enable signal is at a high level; the fourth tri-state inverter TSINV4 is in an operating state when the third store enable signal is at a low level, and in a high-resistance state when the third store enable signal is at a high level; the sixth transmission gate TG6 is turned off when the third read enable signal is at a low level and turned on when the third read enable signal is at a high level.

More specifically, the fifth transmission gate TG5 comprises: a twenty-ninth MOS transistor M29 and a thirtieth MOS transistor M30; a gate of the twenty-ninth MOS transistor M29 receives a reverse signal of the third store enable signal, and a gate of the thirtieth MOS transistor M30 receives the third store enable signal; the twenty-ninth MOS transistor M29 and the thirtieth MOS transistor M30 are connected in parallel, one end of which serves as an input of the fifth transmission gate TG5, and the other end of which serves as an output of the fifth transmission gate TG5; exemplarily, the twenty-ninth MOS transistor M29 is a PMOS transistor and the thirtieth MOS transistor M30 is an NMOS transistor.

The fifth inverted logic gate MINV5 comprises: a thirty-first MOS transistor M31 and a thirty-second MOS transistor M32; a gate of the thirty-first MOS transistor M31 is connected to a gate of the thirty-second MOS transistor M32 and serves as an input of the fifth inverted logic gate MINV5, a source of the thirty-first MOS transistor M31 is connected to the reference voltage, and a drain of the thirty-first MOS transistor M31 is connected to a drain of the thirty-second MOS transistor M32 and serves as an output of the fifth inverted logic gate MINV5; a source of the thirty-second MOS transistor M32 is connected to the reference ground. Exemplarily, the thirty-first MOS transistor M31 is a PMOS transistor and the thirty-second MOS transistor M32 is an NMOS transistor.

The sixth inverted logic gate MINV6 comprises: a thirty-third MOS transistor M33 and a thirty-fourth MOS transistor M34; a gate of the thirty-third MOS transistor M33 is connected to a gate of the thirty-fourth MOS transistor M34 and serves as an input of the sixth inverted logic gate MINV6, a source of the thirty-third MOS transistor M33 is connected to the reference voltage, and a drain of the thirty-third MOS transistor M33 is connected to a drain of the thirty-fourth MOS transistor M34 and serves as an output of the sixth inverted logic gate MINV6; a source of the thirty-fourth MOS transistor M34 is connected to the reference ground. Exemplarily, the thirty-third MOS transistor M33 is a PMOS transistor and the thirty-fourth MOS transistor M34 is an NMOS transistor.

The sixth transmission gate TG6 comprises: a thirty-fifth MOS transistor M35 and a thirty-sixth MOS transistor M36; a gate of the thirty-fifth MOS transistor M35 receives a reverse signal of the third read enable signal, a gate of the thirty-sixth MOS transistor M36 receives the third read enable signal; the thirty-fifth MOS transistor M35 and the thirty-sixth MOS transistor M36 are connected in parallel, one end of which serves as an input of the sixth transmission gate TG6, and the other end of which serves as an output of the sixth transmission gate TG6; exemplarily, the thirty-fifth MOS transistor M35 is a PMOS transistor and the thirty-sixth MOS transistor M36 is an NMOS transistor.

The fourth tri-state inverter TSINV4 comprises: a thirty-seventh MOS transistor M37, a thirty-eighth MOS transistor M38, a thirty-ninth MOS transistor M39, and a fortieth MOS transistor M40; a gate of the thirty-seventh MOS transistor M37 is connected to a gate of the fortieth MOS transistor M40 and serves as an input of the fourth tri-state inverter TSINV4, a source of the thirty-seventh MOS transistor M37 is connected to the reference voltage, and a drain of the thirty-seventh MOS transistor M37 is connected to a source of the thirty-eighth MOS transistor M38; a gate of the thirty-eighth MOS transistor M38 receives the third store enable signal, a drain of the thirty-eighth MOS transistor M38 is connected to a drain of the thirty-ninth MOS transistor M39 and serves as an output of the fourth tri-state inverter TSINV4; a gate of the thirty-ninth MOS transistor M39 receives a reverse signal of the third store enable signal, a source of the thirty-ninth MOS transistor M39 is connected to a drain of the fortieth MOS transistor M40; a source of the fortieth MOS transistor M40 is connected to the reference ground; exemplarily, the thirty-seventh MOS transistor M37 and the thirty-eighth MOS transistor M38 are PMOS transistors, and the thirty-ninth MOS transistor M39 and the fortieth MOS transistor M40 are NMOS transistors.

Embodiment 5

Figure 24:
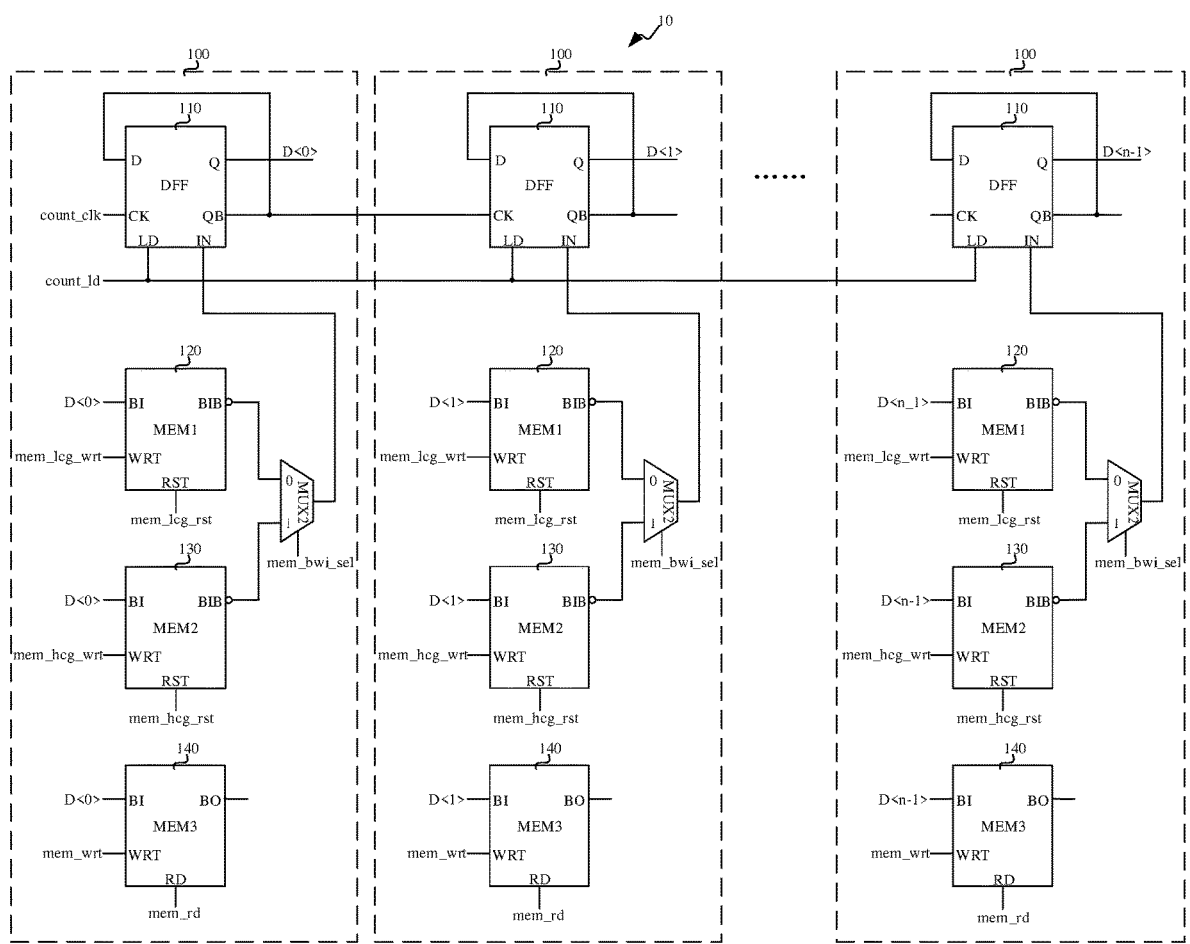
FIG. 24 shows a schematic structural diagram of a counter according to Embodiment 5 of the present disclosure.

As shown in FIG. 24, Embodiment 5 differs from Embodiment 1 and Embodiment 2 in that the counting unit 100 of Embodiment 5 comprises: a first memory 120, a second memory 130, a third memory 140, and a second selector switch MUX2.

A store control terminal WRT of the first memory 120 receives a first store enable signal mem_lcg_wrt, an input BI of the first memory 120 receives the counting result, and a write output BIB of the first memory 120 is connected to a first input of the second selector switch MUX2; a store control terminal WRT of the second memory 130 receives a second store enable signal mem_hcg_wrt, an input BI of the second memory 130 receives the counting result, and a write output BIB of the second memory 130 is connected to a second input of the second selector switch MUX2; a control input of the second selector switch MUX2 receives a selector signal mem_bwi_sel, and an output of the second selector switch MUX2 generates the write signal; an inverted output of the first memory 120 serves as its write output, and an inverted output of the second memory 130 serves as its write output. The first memory 120 and the second memory 130 both store the counting result, and based on the selection of the second selector switch MUX2, either the first memory 120 or the second memory 130 provided the write signal to be output by the second selector switch MUX2;

A store control terminal WRT of the third memory 140 receives a third store enable signal mem_wrt, a read control terminal RD of the third memory 140 receives a read enable signal mem_rd, an input BI of the third memory 140 receives the counting result, and a read output BO of the third memory 140 generates the read signal; a normal output of the third memory 140 serves as its read output BO. The third memory 140 stores the counting result, which is readable through the read output BO of the third memory;

It is to be noted that there may be more than one third memory 140 in each counting unit 100, in which case, the counting unit 100 further comprise a third selector switch, wherein an input of the third selector switch is connected to normal outputs of the plurality of third memories 140, respectively, and a control input of the third selector switch receives the read control signal, and an output of the third selector switch generates the read signal; the third selector switch select one of the plurality of third memories 140 to read out the result terminal stored thereon under the control of the read control signal. In practice, the number of the third memories 140 is related to the read speed of the individual third memories, and if the read speed is fast enough, only one third memory 140 is needed in some cases; if the read speed is not fast enough, a higher number of third memories 140 may be needed; in an extreme case, one third memory 140 is provided for each signal to be read out.

Circuit structures of the first memory 120 and the second memory 130 in Embodiment 5 are the same as those of Embodiment 3, but with different signals; circuit structures of the third memory 140 in Embodiment 5 are the same as that of Embodiment 4, but with different signals.

Embodiment 6

Figure 1:
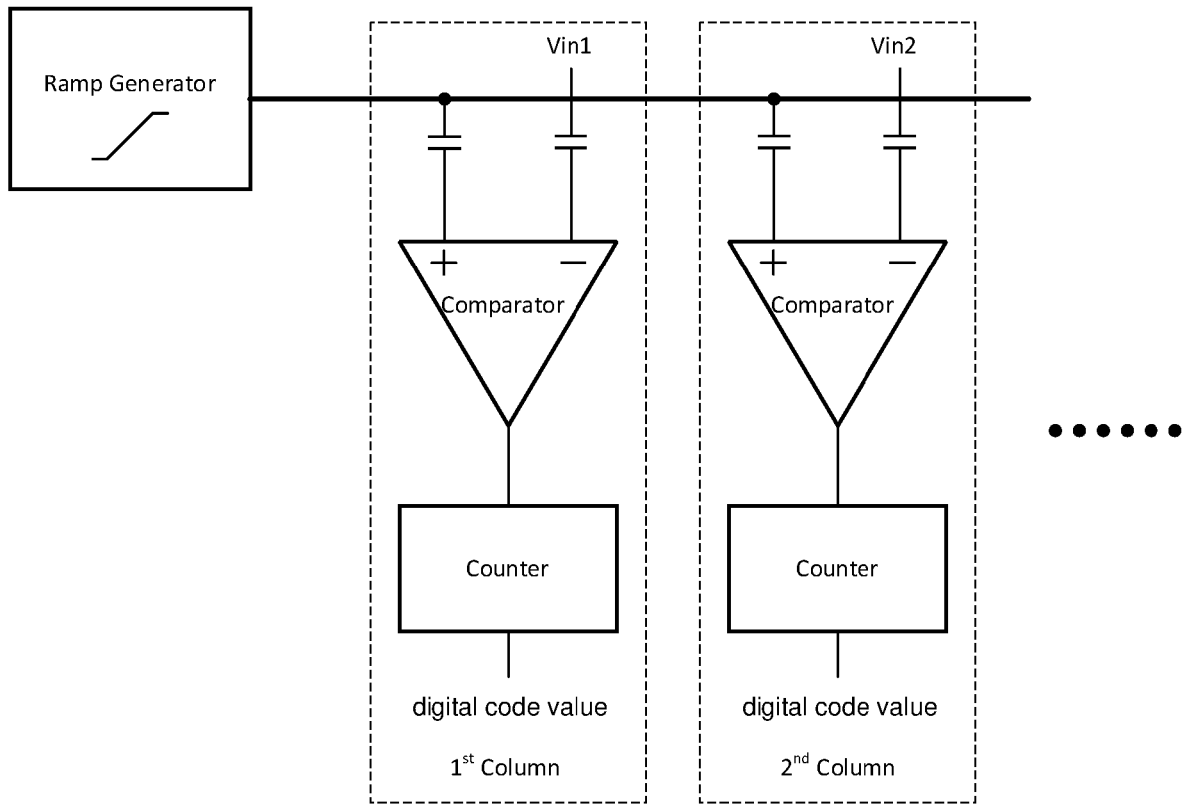
FIG. 1 shows a schematic structural diagram of a single-slope analog-to-digital converter.
Figure 2:
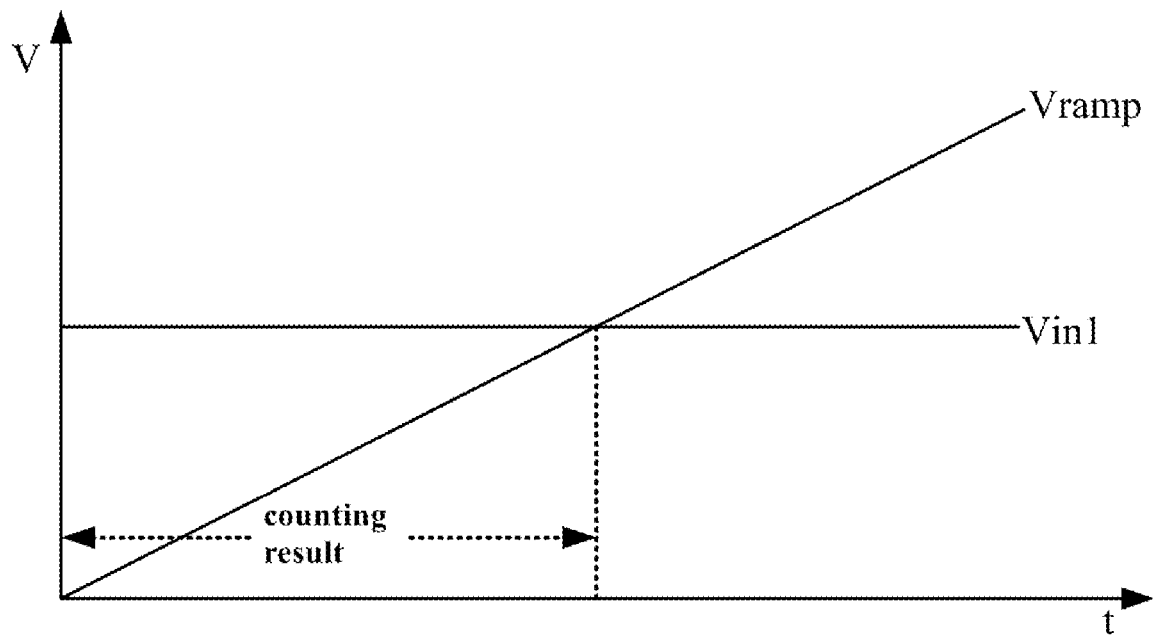
FIG. 2 shows an operating principle of the single-slope analog-to-digital converter.

As shown in FIG. 1, Embodiment 6 provides an analog-to-digital converter comprising at least one row of cascaded analog-to-digital conversion units, wherein each of the analog-to-digital conversion units comprises a comparator, a counter, a first sampler, and a second sampler. Each row of analog-to-digital conversion units correspond to one row of pixels.

The first sampler is configured to sample an input signal, and the second sampler is configured to sample a ramp signal. The first sampler and the second sampler comprise capacitors. In practice, the analog-to-digital converter also comprises a ramp generation circuit for generating the ramp signal. For example, the several analog-to-digital converter units share the ramp generation circuit.

The comparator compares the ramp signal and the input signal, and generates a comparison signal. Wherein, an inverting input of the comparator receives the input signal via the first sampler, a non-inverting input of the comparator receives the ramp signal via the second sampler, and an output of the comparator generates the comparison signal.

The counter is connected to the output of the comparator for digitally quantizing the input signal based on the comparison signal. The counter may be any one of the counters 10 described in Embodiment 1, Embodiment 2, Embodiment 3, Embodiment 4, and Embodiment 5.

The analog-to-digital converter is a single-slope analog-to-digital converter, which may be applied in a CMOS image sensor readout circuit for converting analog signals from pixels into digital signals.

In a first example of Embodiment 6, each counting unit 100 of the counter 10 in the analog-to-digital converter comprises the first memory 120 described in Embodiment 3, and the analog-to-digital converter is capable of executing correlated double sampling (CDS). In the context of image sensor applications, the analog-to-digital converter can capture a reset signal, invert it, and store it into the counter, based on which, corresponding exposure signal is subsequently quantized. A difference between values of these two data (i.e., the reset signal and the exposure signal) is then calculated, enabling the implementation of CDS.

To illustrate the implementation of CDS by the analog-to-digital converter, take each counting unit 100 in the counter 10 comprising a writable D flip-flop 110 and the first memory 120 as an example, wherein the writable D flip-flop 110 does not have a reset function, and the first memory 120 has a reset function and a read function, as shown in FIG. 14.

A reset signal Vrst of pixels is quantized, and the counter counts upward from 0. When a first quantization is completed, a first quantization result of the reset signal Vrst is stored to the first memory 120 of each counting unit 100. Before the second quantization, the first quantization result of the reset signal Vrst is inverted and written into each writable D flip-flop 110 as an initial state of the counter, and the second quantization is counted based on this initial state. Since the second quantization is counted based on an inverse signal of the first quantization result, the two quantizations effectively achieves subtracting one signal from the other, thereby realizing CDS.

Figure 21:
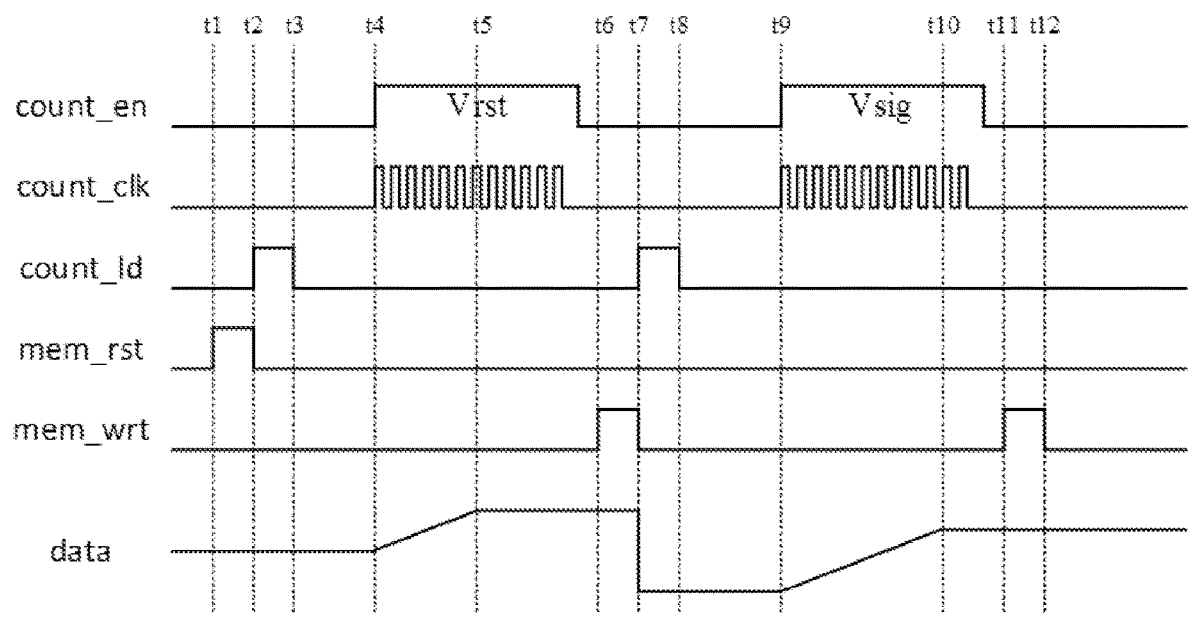
FIG. 21 shows a timing diagram of one quantization cycle when an analog-to-digital converter of Embodiment 6 performs CDS.

A timing diagram during one complete quantization cycle is shown in FIG. 21.

Before quantization, during t1-t2, mem_rst is enabled to reset each first memory 120 (their outputs all become "0"); during t2-t3, count_ld is enabled to write a reset value of each first memory 120 to the corresponding writable D flip-flop 110, thereby setting the initial state of each writable D Flip-flop 110 to 0, i.e., each writable D flip-flop 110 is reset; at t4, the first quantization starts, and the counter counts upward under the action of a high-speed clock; at t5, an output of the comparator is flipped, the counting stops, and the first quantization is completed; during t6-t7, mem_wrt is enabled, and data of the first quantization is stored in the respective first memory 120; during t7-t8, count_ld is enabled to write a reverse signal of the data of the first quantization into each writable D flip-flop 110 as the initial state of the second quantization; at t9, the second quantization starts from the initial state, and the process of the second quantization is similar to that of the first quantization; at t10, the output of the comparator is flipped, the counting stops, and the second quantization ends; during t11-t12, mem_wrt is enabled, and a final quantization result is stored into respective first memory 120; subsequently, reading out is performed (controlled by enabling mem_rd, not shown in the figures). At this point, one complete quantization cycle is performed, and a final digital code value is obtained by calculating a difference between the reset signal Vrst, and the exposure signal Vsig of the pixels.

This approach eliminates the need for switching between upward and downward counting, and does away with the need for extra holding circuits, by simply enhancing the design of the writable D flip-flop, which decreases the number of transistors needed. This not only reduces the layout size but also optimizes the wiring. The end result is a reduction in power consumption and an increase in counting frequency. When the writable D flip-flop in the first counting unit is replaced by a latch logic, operations of the latter can be carried out according to relevant descriptions in Embodiment 2.

In a second example of Embodiment 6, each counting unit 100 of the counter 10 in the analog-to-digital converter comprises a first memory 120, a second memory 130, and a second selector switch MUX2, or a first memory 120, a second memory 130, a third memory 140, a second selector switch MUX2, and a third selector switch MUX3 (as described in Embodiment 4), the analog-to-digital converter may perform CDS at high-conversion-gain (HCG) and low-conversion-gain (LCG).

To illustrate the implementation of CDS at HCG and LCG by the analog-to-digital converter, take each counting unit 100 in the counter 10 comprising a writable D flip-flop 110, a first memory 120, a second memory 130, a third memory 140, a second selector switch MUX2, and a third selector switch MUX3 as example; the writable D flip-flop 110 does not have a reset function, the first memory 120 has a reset function, the second memory 130 has a reset function and a read function, and the third memory 130 has a read function, as shown in FIG. 19.

Exemplarily, a quantization cycle comprises four quantization phases: LCG-RST, HCG-RST, HCG-SIG, and LCG-SIG. Before each RST quantization, count_Id needs to be enabled to write a reset value into each writable D flip-flop 110 to reset the writable D flip-flop 110. Before each SIG quantization, count_Id needs to be enabled to write a reverse signal of a corresponding RST quantization result to each writable D flip-flop 110 as an initial state of the SIG quantization.

Figure 22:
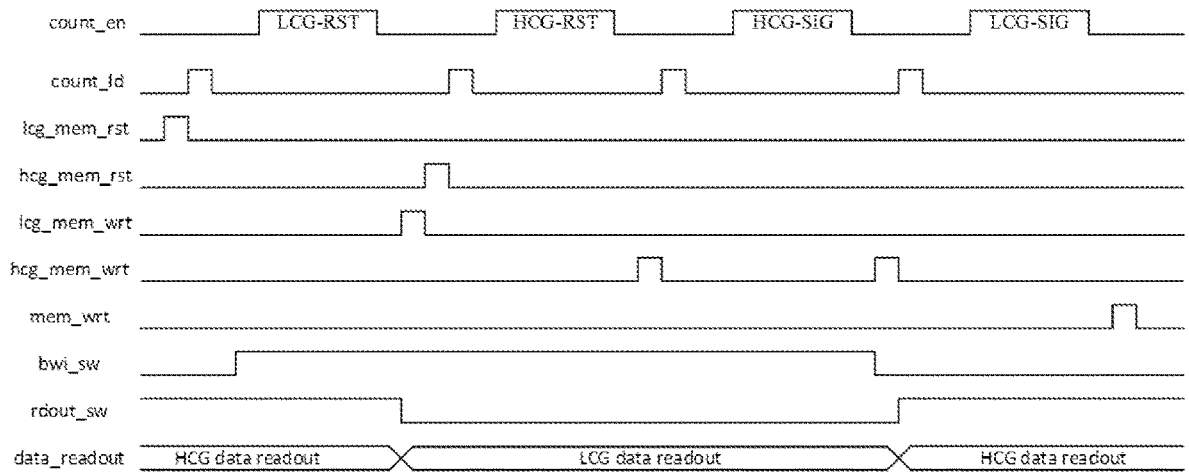
FIG. 22 shows a timing diagram of one quantization cycle when the analog-to-digital converter of Embodiment 6 performs CDS at high-conversion-gain and low-conversion-gain.

A timing diagram of one complete quantization cycle is shown in FIG. 22.

Before the first quantization, lcg_mem_rst is enabled to reset each first memory 120; then, count_Id is enabled to write a reset value of the first memory 120 into the corresponding writable D flip-flop 110, thereby setting an initial state of each writable D flip-flop 110 to 0, i.e., resetting each writable D flip-flop 110, at which time bwi_sw is at a low level, and each writable D flip-flop 110 selects the output of their corresponding first memory 120 as a write signal.

The first quantization is performed on signal LCG-RST, the counter counts upward; when the first quantization is finished, lcg_mem_wrt is enabled to store a quantization result of LCG-RST into each first memory 120;

Before the second quantization, hcg_mem_rst is enabled to reset each second memory 130; then, count_Id is enabled to write a reset value of the second memory 130 into the corresponding writable D flip-flop 110, thereby setting an initial state of each writable D flip-flop 110 to 0, i.e., resetting each writable D flip-flop 110, at which time, bwi_sw is switched to high level, and each writable D flip-flop 110 selects the output of their corresponding second memory 130 as the write signal.

The second quantization is performed on signal HCG-RST, the counter counts upward; when the second quantization is finished, hcg_mem_wrt is enabled to store a quantization result of HCG-RST into each second memory 130;

Before the third quantization, count_Id is enabled to write a reverse signal of a corresponding quantization result of HCG-RST into the corresponding writable D flip-flop 110 as an initial state of the third quantization.

The third quantization is performed on signal HCG-SIG, the counter counts upward; when the third quantization is finished, hcg_mem_wrt is enabled to store the quantization results of the HCG signals into each second memory 130, which is subsequently read out (controlled by enabling hcg_mem_rd, not shown in FIG. 22); at this time, rdout_sw is at a high level, and a readout circuit is connected to a read output of each second memory 130, enabling reading out of the quantization results of the HCG signals.

Before the fourth quantization, bwi_sw is switched to low level, and then count_Id is enabled to write a reverse signal of a quantization result of signal LCG-RST into each writable D flip-flop 110 as an initial state of the fourth quantization.

The fourth quantization is performed on signal LCG-SIG, the counter counts upward; when the fourth quantization is finished, mem_wrt is enabled to store the quantization results of the LCG signals into each third memory 140; after the quantization results of the HCG signals are read out, readout_sw is switched to low level, enabling reading out of the quantization results of the LCG signals (controlled by enabling lcg_mem_rd, not shown in FIG. 22)

This approach requires only one set of quantization circuits to achieve CDS at HCG and LCG, while traditional approaches require two sets of quantization circuits and upward/downward counters. Therefore, this approach not only eliminates the need for switching between upward and downward counting, but also does away with the need for extra holding circuits, by simply enhancing the design of the writable D flip-flop, which decreases the number of transistors needed. This not only reduces the layout size but also optimizes the wiring. The end result is a reduction in power consumption and an increase in counting frequency. It should be noted that three sets of memories (i.e., the first memory, second memory, and third memory of each counting unit) are used in the analog-to-digital converter described above since quantized LCG signals need to be stored in a different memory than the non-quantized ones, which increases the total signal readout speed; it is also equally feasible to use only two sets of memories if memories with higher readout speed are used or the row cycle time (the minimum number of clock cycles a memory row takes to complete a full cycle) is longer.

In a third example of Embodiment 6, each counting unit 100 of the counter 10 in the analog-to-digital converter comprises a first memory 120, a second memory 130, a third memory 140, and a second selector switch MUX2 (as described in Embodiment 5), the analog-to-digital converter can realize phase focusing in different conversion gain modes, which is further detailed in Embodiment 8 to Embodiment 10.

Embodiment 7

Embodiment 7 provides a control method of the analog-to-digital converter described in Embodiment 6, and the control method comprises: writing the write signal into each writable D flip-flop when the control signal is active. In practice, when the write signal is at a low level, resetting the writable D flip-flop can be realized by writing the low level into the writable D flip-flop.

Embodiment 8

Embodiment 8 provides a method for reading out image signals, comprising:
  in a first conversion gain mode, collecting a first-gain reset signal of all-phase pixels;
  in a second conversion gain mode, collecting a second-gain reset signal of the all-phase pixels;
  in the second conversion gain mode, first collecting a second-gain one-side exposure signal of first-side pixels of the all-phase pixels, and then collecting a second-gain total exposure signal of the all-phase pixels;
  in the first conversion gain mode, collecting a first-gain total exposure signal of the all-phase pixels;
  after the second-gain reset signal is collected, quantizing the second-gain reset signal to obtain and store a quantized second-gain reset signal.

It should be noted that the gain of the first-gain mode and the gain of the second-gain mode are different, and specific magnitudes thereof can be determined based on practical needs. The different gains can be realized by DCG of gain control transistors, or other applicable methods in the field. In addition, as an example, the full-phase pixels may be a combination of all pixels used for focusing. For instance, in the context of a phase-focusing method involving Quad Bayer (or 4-CELL, or Tetracell), full-phase pixels could represent a total signal produced by all photodetectors. This total signal can be divided into upper and lower phase information for phase focusing. Alternatively, it can also be divided into left and right phase information for phase focusing. The specific method can be chosen based on actual requirements. In other examples, when other pixel signals are required to participate in the reading out, corresponding adjustments may be made.

Embodiment 8 may be implemented using any of the structural embodiments described above. In a specific example, Embodiment 8 is implemented by an analog-to-digital converter comprising the counter 10 described in Embodiment 5 (that is, each counting unit 100 of the counter 10 comprises a first memory 120, a second memory 130, a third memory 140, and a second selector switch MUX2); that is, the method for reading out image signals can be realized by the analog-to-digital converter of Embodiment 8, and the method comprises:
  quantizing the first-gain reset signal and the first-gain total exposure signal of the all-phase pixels in the first conversion gain mode based on the first memory 120;
  quantizing the second-gain reset signal and the second-gain total exposure signal of the all-phase pixels, and the second-gain one-side exposure signal of the first-side pixels in the second conversion gain mode, based on the second memory 130,
  reading out a counting result of the second-gain one-side exposure signal based on the third memory 140, and/or, reading out a counting result of the first-gain total exposure signal in the first conversion gain mode and a counting result of the second-gain total exposure signal in the second conversion gain mode based on both the first memory 120 and the second memory 130; and optimizing timing.

In another example, the method for reading out image signals as realized by the analog-to-digital converter of Embodiment 8 comprises:
  quantizing the first-gain reset signal and the first-gain total exposure signal of the all-phase pixels, and the first-gain one-side exposure signal of the first-side pixels in the first conversion gain mode based on the first memory 120;
  quantizing the second-gain reset signal and the second-gain total exposure signal of the all-phase pixels, and the second-gain one-side exposure signal of the first-side pixels in the second conversion gain mode based on the second memory 130,
  reading out a counting result of the first-gain side exposure signal in the first conversion gain mode or a counting result of the second-gain one-side exposure signal in the second conversion gain mode based on the third memory 140, and/or, reading out a counting result of the first-gain total exposure signal in the first conversion gain mode and a counting result of the second-gain total exposure signal in the second conversion gain mode based on both the first memory 120 and the second memory 130; and optimizing timing.

Figure 25:
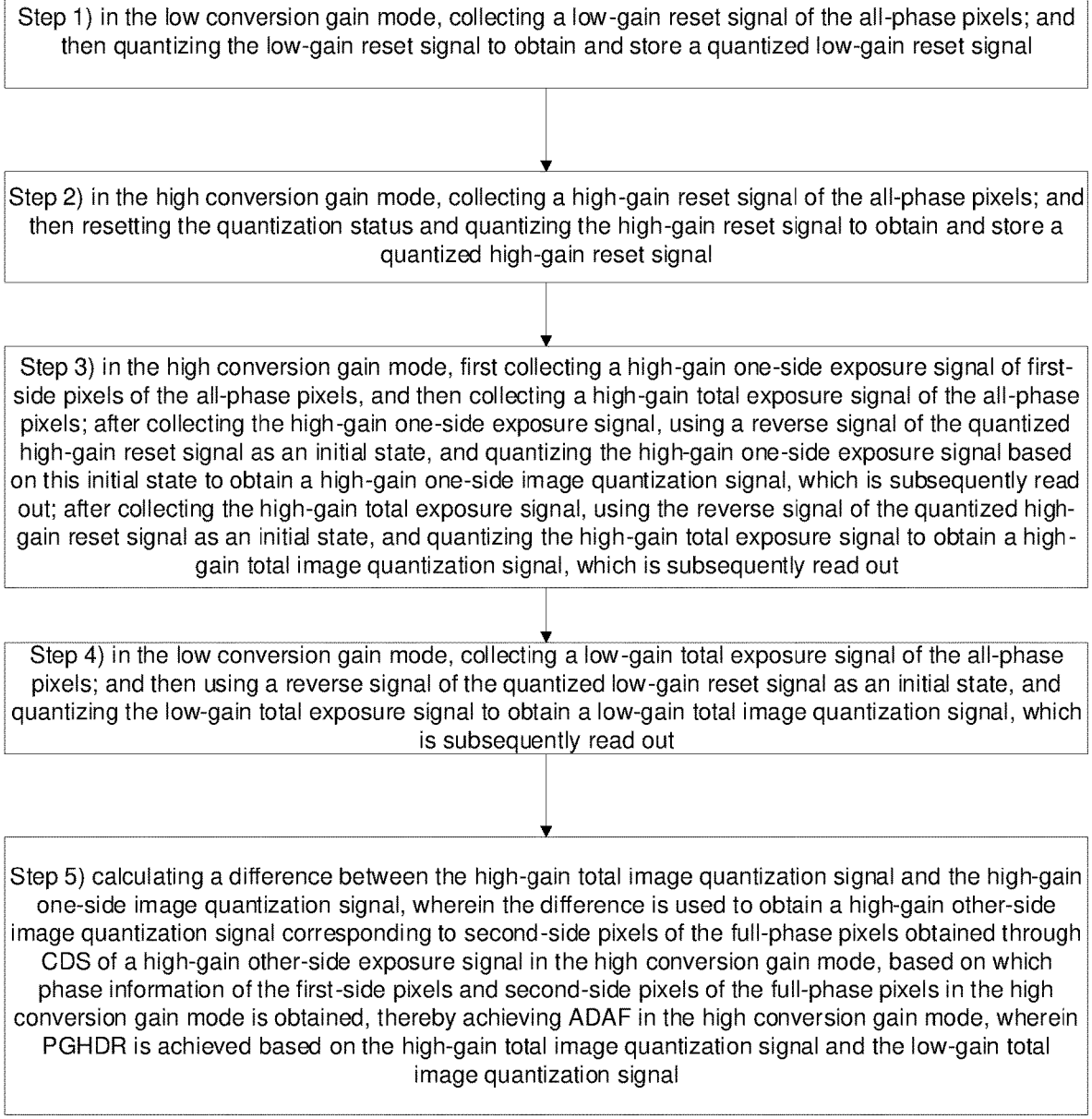
FIG. 25 shows a flowchart illustrating a read method according to Embodiment 8 of the present disclosure.

As shown in FIG. 25, in a more specific example, the method for reading out image signals comprises step 1) to step 5). The method of Embodiment 8 is for implementing ADAF during HCG quantization in the PGHDR mode. The method for reading out image signals comprises:
  Step 1) in the low conversion gain mode, collecting a low-gain reset signal of the all-phase pixels;
  and then quantizing the low-gain reset signal to obtain and store a quantized low-gain reset signal. Optionally, before quantizing the low-gain reset signal, step 1) also comprises: resetting a quantization status.
  Step 2) in the high conversion gain mode, collecting a high-gain reset signal of the all-phase pixels;
  and then resetting the quantization status and quantizing the high-gain reset signal to obtain and store a quantized high-gain reset signal;
  Step 3) in the high conversion gain mode, first collecting a high-gain one-side exposure signal of first-side pixels of the all-phase pixels, and then collecting a high-gain total exposure signal of the all-phase pixels; after collecting the high-gain one-side exposure signal, using a reverse signal of the quantized high-gain reset signal as an initial state, and quantizing the high-gain one-side exposure signal based on this initial state to obtain a high-gain one-side image quantization signal, which is subsequently read out; after collecting the high-gain total exposure signal, using the reverse signal of the quantized high-gain reset signal as an initial state, and quantizing the high-gain total exposure signal to obtain a high-gain total image quantization signal, which is subsequently read out;
  Step 4) in the low conversion gain mode, collecting a low-gain total exposure signal of the all-phase pixels;
  and then using a reverse signal of the quantized low-gain reset signal as an initial state, and quantizing the low-gain total exposure signal to obtain a low-gain total image quantization signal, which is subsequently read out;
  Step 5) calculating a difference between the high-gain total image quantization signal and the high-gain one-side image quantization signal, wherein the difference is used to obtain a high-gain other-side image quantization signal corresponding to second-side pixels of the full-phase pixels obtained through CDS of a high-gain other-side exposure signal in the high conversion gain mode, based on which phase information of the first-side pixels and second-side pixels of the full-phase pixels in the high conversion gain mode is obtained, thereby achieving ADAF in the high conversion gain mode, wherein PGHDR is achieved based on the high-gain total image quantization signal and the low-gain total image quantization signal.

Figure 23:
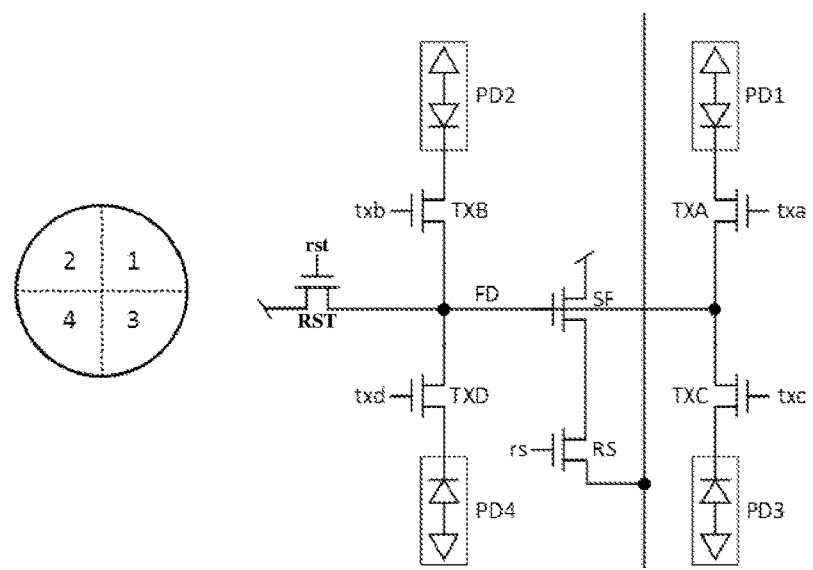
FIG. 23 shows a schematic structural diagram of all-phase pixels.

In the following, the signal collection and quantization processes of above the method for reading out image signals is further detailed in conjunction with FIGS. 23 and 24, and with reference to FIGS. 26 and 27, with the counter being an upward counter as an example, where reset thereof is achieved by writing "0" to memories of the counter.

Figure 26:
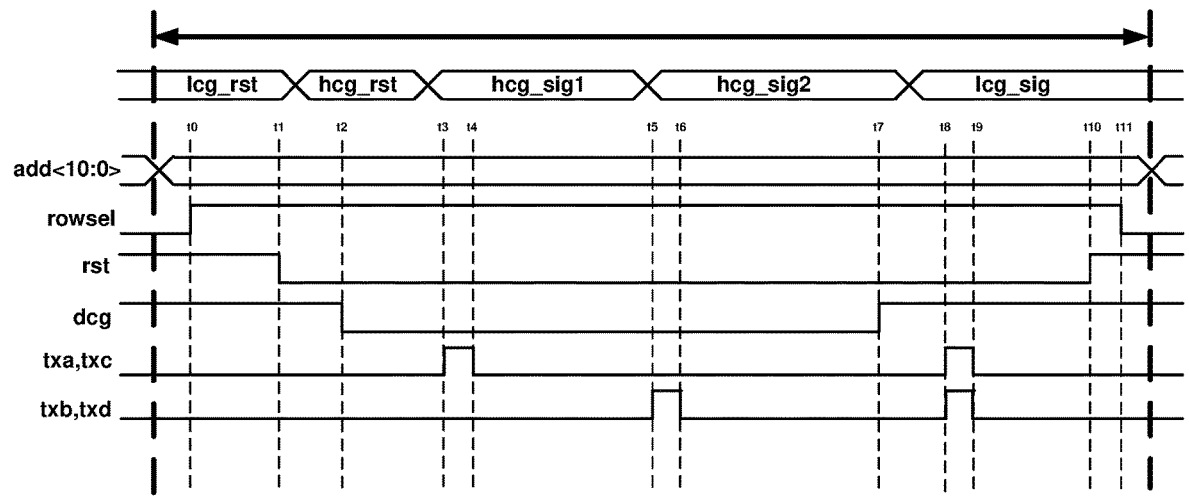
FIG. 26 shows a timing diagram of signal collection according to Embodiment 8 of the present disclosure.
Figure 27:
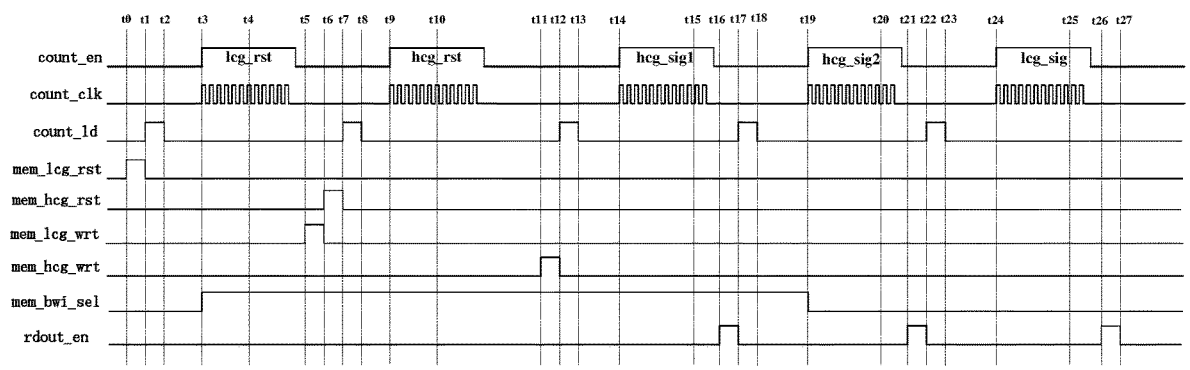
FIG. 27 shows a timing diagram of signal quantization according to Embodiment 8 of the present disclosure.

During t0-t1, dcg is at a high level and rst is at a high level, and a floating diffusion point (FD) voltage is reset;

during t1-t2, rst is at a low level, and a low-gain reset signal Vlrst of the full-phase pixels in the low conversion gain mode is collected;

during t2-t3, dcg is at a low level, and a high-gain reset signal Vhrst of the full-phase pixels in the high conversion gain mode is collected;

during t3-t4, txa and txc are high level, and the first-side pixels (e.g., the right pixels) of the full-phase pixels are shifted; during t4-t5, the high-gain one-side exposure signal Vhsig1 of the first-side pixels in the high conversion gain mode is collected;

during t5-t6, txb and txd are high level, and the second-side pixels (e.g., the left pixels) of the full-phase pixels are shifted; during t6-t7, the high-gain total exposure signal Vhsig of the full-phase pixels in the high conversion gain mode is collected (obtained by superimposing the high-gain other-side exposure signal on top of the high-gain one-side exposure signal, and shown as hcg_sig2 in FIG. 26);

at t7, dcg is at a high level, the method switches to the low conversion gain mode;

during t8-t9, txa and txc, txb and txd are all high level, the all-phase pixels are shifted; during t9-t10, the low-gain total exposure signal Vlsig of the all-phase pixels in the low conversion gain mode is collected.

Further, before the first quantization, during t0-t1, mem_lcg_rst is enabled to reset each first memory 120 (i.e., the output of each first memory 120 becomes "0"); and during t1-t2, count_Id is enabled to write a reset value of the first memory 120 into the corresponding writable D flip-flop 110, thereby setting an initial state of writable D flip-flop 110 to 0, and resetting the counter, at which time mem_bwi_sel is at a low level, the writable D flip-flop 110 selects the output of the first memory 120 as the write signal; at t3, the first quantization is carried out to quantize the low-gain reset signal Vlrst, and the counter counts upwards under the action of a high-speed clock; at t4, an output of the comparator flips, and the counting stops, the first quantization ends, and a quantized low-gain reset signal is obtained; during t5-t6, mem_lcg_wrt is enabled, and the quantized low-gain reset signal is stored in the first memory 120;

before the second quantization, during t6-t7, mem_hcg_rst is enabled to reset each second memory 130 (i.e., the output of each second memory 130 becomes "0"); during t7-t8, count_Id is enabled to write a reset value of the second memory 130 into the corresponding writable D flip-flop 110, thereby setting an initial state of the writable D to 0, and resetting the counter, at which time mem_bwi_sel is at a high level, the writable D flip-flop 110 selects the output of the second memory 130 as the write signal; at t9, the second quantization is carried out to quantize the high-gain reset signal Vhrst, and the counter counts upward under the action of the high-speed clock; at t10, the output of the comparator flips, the counting stops, the second quantization ends, and a quantized high-gain reset signal is obtained; during t11-t12, mem_hcg_wrt is enabled to store the quantized high-gain reset signal into the second memory 130;

before the third quantization, during t12-t13, count_Id is enabled to write a reverse signal of the quantized high-gain reset signal stored in the second memory 130 into the writable D flip-flop 110 as an initial state of the third quantization; at t14, the third quantization is carried out starting from this initial state after reverse writing, to quantize the high-gain one-side exposure signal Vhsig1, and the counter counts upward under the action of the high-speed clock; at t15, the output of the comparator flips, the counting stops, the third quantization ends, and the high-gain one-side image quantization signal (the difference between the high-gain one-side exposure signal Vhsig1 and the high-gain reset signal Vhrst, i.e., Vhsig1−Vhrst) is obtained; after that, mem_wrt is enabled, the high-gain one-side image quantization signal is stored into the third memory 140; during t16-t17, mem_rd is enabled, and rdout_en (an external read signal) is at a high level, and the high-gain one-side image quantization signal is read out (mem_wrt and mem_rd are not shown in the figures).

Before the fourth quantization, during t17-t18, count_Id is enabled to write the reverse signal of the quantized high-gain reset signal stored in the second memory 130 into the writable D flip-flop 110 as an initial state of the fourth quantization; at t19, the fourth quantization is carried out starting from the initial state to quantize the high-gain total exposure signal Vhsig, and the counter counts upward under the action of the high-speed clock; at t20, the output of the comparator flips, the counting stops, the fourth quantization ends, and the high-gain total image quantization signal (the difference between the high-gain total exposure signal Vhsig and the high-gain reset signal Vhrst, i.e., Vhsig-Vhrst) is obtained; after that, the mem_wrt is enabled, and the high-gain total image quantization signal is stored into the third memory 140; during t21-t22, mem_rd is enabled and rdout_en (an external read signal) is at a high level, and the high-gain total image quantization signal is read out (mem_wrt and mem_rd are not shown in the figures). Alternatively, when the second memory 130 has a read function, mem_hcg_wrt is enabled, the high-gain total image quantization signal is stored into the second memory 130, and during t21-t22, the read enable signal mem_hcg_rd of the second memory 130 is enabled, and rdout_en (the external read signal) is at a high level, and the high-gain total image quantization signal is read out (not shown in the figures).

Before the fifth quantization, during t22-t23, count_Id is enabled to write the reverse signal of the quantized low-gain reset signal stored in the first memory 120 into the writable D flip-flop 110 as an initial state of the fifth quantization, at which time, mem_bwi_sel is at a low level and the writable D flip-flop 110 selects the output of the first memory 120 as the write signal; at t24, the fifth quantization is carried out starting from the initial state to quantize the low-gain total exposure signal Vlsig, and the counter counts upward under the action of the high-speed clock; at t25, the output of the comparator flips, the counting stops, the fifth quantization ends, and the low-gain total image quantization signal (the difference between the low-gain total exposure signal Vlsig and the low-gain reset signal Vlrst, i.e., Vlsig-Vlrst) is obtained; after that, mem_wrt is enabled to store the low-gain total image quantization signal into the third memory 140, and during t26-t27, mem_rd is enabled, rdout_en (the external read signal) is at a high level, and the low-gain total image quantization signal is read out (mem_wrt and mem_rd are not shown in the figures). Alternatively, when the first memory 120 has a read function, mem_lcg_wrt is enabled, the low-gain total image quantization signal is stored into the first memory 120, and during t26-t27, the read enable signal mem_lcg_rd of the first memory 120 is enabled, and rdout_en (the external read signal) is at a high level, and the low-gain total image quantization signal is read out (not shown in the figures).

In one example, mem_hcg_wrt is enabled to store the high-gain total image quantization signal into the second memory 130, and during t21-t22, mem_hcg_rd is enabled, rdout_en (the external read signal) is at a high level, and the high-gain total image quantization signal is read out; also, mem_lcg_wrt is enabled to store the low-gain total image quantization signal into the first memory 120, and during t26-t27, mem_lcg_rd is enabled, rdout_en (the external read signal) is at a high level, and the low-gain total image quantization signal is read out. Therefore, based on the above design, respective counting results of the first memory 120 and the second memory 130 can be read out simultaneously.

So far, one complete quantization cycle has completed, and the high-gain one-side image quantization signal after CDS of the high-gain one-side exposure signal in the high conversion gain mode, and the high-gain total image quantization signal after CDS of the high-gain total exposure signal in the high conversion gain mode are obtained; the difference between the high-gain total image quantization signal and the high-gain one-side image quantization signal is calculated, wherein the difference is used to obtain a high-gain other-side image quantization signal corresponding to second-side pixels of the full-phase pixels obtained through CDS of a high-gain other-side exposure signal in the high conversion gain mode, based on which phase information of the first-side pixels and second-side pixels of the full-phase pixels in the high conversion gain mode is obtained, thereby achieving ADAF in the high conversion gain mode. At the same time, PGHDR is realized by the high-gain total image quantization signal in the high conversion gain mode and the low-gain total image quantization signal in the low conversion gain mode. As can be seen, the method for reading out image signals of Embodiment 8 is for implementing ADAF during HCG quantization in the PGHDR mode.

Embodiment 9

As shown in FIG. 28, in a more specific example, the method for reading out image signals comprises step 1) to step 5). The method of Embodiment 9 is for implementing ADAF during LCG quantization in the PGHDR mode. The method for reading out image signals comprises:

Step 1) in the low conversion gain mode, collecting a low-gain reset signal of the all-phase pixels;
and then quantizing the low-gain reset signal to obtain and store a quantized low-gain reset signal. Optionally, before quantizing the low-gain reset signal, step 1) also comprises: resetting a quantization status.

Step 2) in the high conversion gain mode, collecting a high-gain reset signal of the all-phase pixels;
and then resetting the quantization status and quantizing the high-gain reset signal to obtain and store a quantized high-gain reset signal;

Step 3) in the high conversion gain mode, collecting the high-gain total exposure signal of the all-phase pixels; and then using a reverse signal of the quantized high-gain reset signal as an initial state, and quantizing the high-gain total exposure signal based on this initial state to obtain a high-gain total image quantization signal, which is subsequently read out;

Step 4) in the low conversion gain mode, first collecting the low-gain one-side exposure signal of first-side pixels of the all-phase pixels, and then collecting the low-gain total exposure signal of the all-phase pixels; after collecting the low-gain one-side exposure signal, using a reverse signal of the quantized low-gain reset signal as an initial state, and quantizing the low-gain one-side exposure signal based on this initial state to obtain a low-gain one-side image quantization signal, which is subsequently read out; after collecting the low-gain total exposure signal, using the reverse signal of the quantized low-gain reset signal as an initial state, and quantizing the low-gain total exposure signal to obtain a low-gain total image quantization signal, which is subsequently read out;

Step 5) calculating a difference between the low-gain total image quantization signal and the low-gain one-side image quantization signal, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in the low conversion gain mode is obtained, thereby achieving ADAF in the low conversion gain mode, wherein PGHDR is achieved based on the high-gain total image quantization signal and the low-gain total image quantization signal.

In the following, the signal collection and quantization processes of above the method for reading out image signals is further detailed in conjunction with FIG. 24, and with reference to FIGS. 29 and 30, with the counter being an upward counter as an example, where reset thereof is achieved by writing "0" to memories of the counter.

Figure 29:
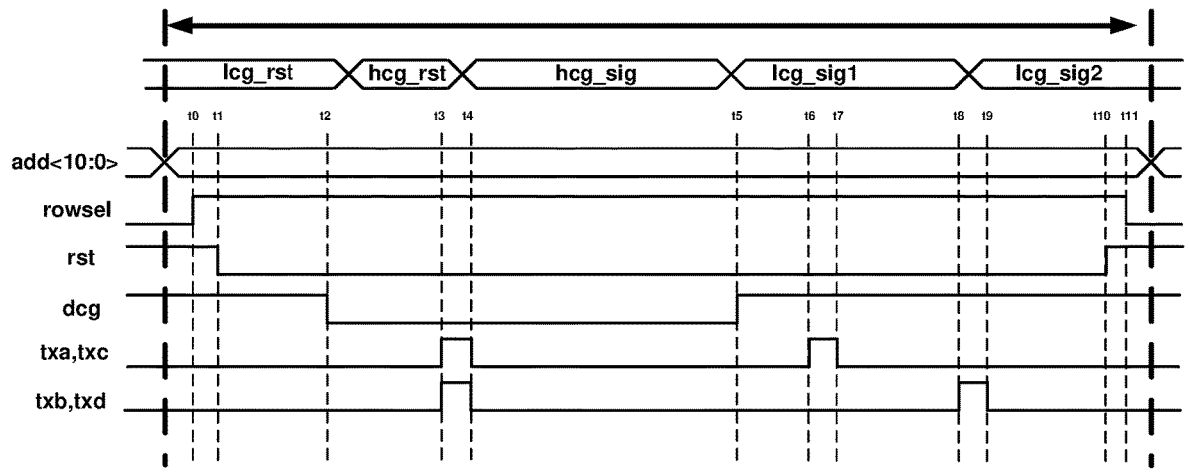
FIG. 29 shows a timing diagram of signal collection according to Embodiment 9 of the present disclosure.
Figure 30:
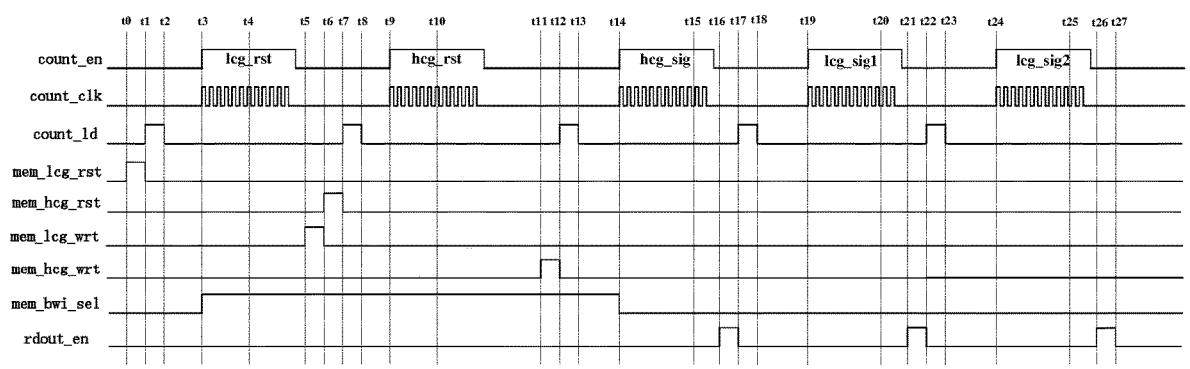
FIG. 30 shows a timing diagram of signal quantization according to Embodiment 9 of the present disclosure.

During t0-t1, dcg is at a high level and rst is at a high level, and a floating diffusion point (FD) voltage is reset;

during t1-t2, rst is at a low level, and a low-gain reset signal Vlrst of the full-phase pixels in the low conversion gain mode is collected;

during t2-t3, dcg is at a low level, and a high-gain reset signal Vhrst of the full-phase pixels in the high conversion gain mode is collected;

during t3-t4, txa and txc, txb and txd are all high level, the all-phase pixels are shifted; during t4-t5, the high-gain total exposure signal Vhsig of the all-phase pixels in the high conversion gain mode is collected.

at t5, dcg is at a high level, the method switches to the low conversion gain mode;

during t6-t7, txa and txc are high level, and the first-side pixels (e.g., the right pixels) of the full-phase pixels are shifted; during t7-t8, the low-gain one-side exposure signal Vlsig1 of the first-side pixels in the low conversion gain mode is collected;

during t8-t9, txb and txd are high level, and the second-side pixels (e.g., the left pixels) of the full-phase pixels are shifted; during t9-t10, the low-gain total exposure signal Vlsig of the full-phase pixels in the low conversion gain mode is collected (obtained by superimposing the low-gain other-side exposure signal on top of the low-gain one-side exposure signal, and shown as lcg_sig2 in FIG. 29).

Further, before the first quantization, during t0-t1, mem_lcg_rst is enabled to reset each first memory 120 (i.e., the output of each first memory 120 becomes "0"); and during t1-t2, count_Id is enabled to write a reset value of the first memory 120 into the corresponding writable D flip-flop 110, thereby setting an initial state of writable D flip-flop 110 to 0, and resetting the counter, at which time mem_bwi_sel is at a low level, the writable D flip-flop 110 selects the output of the first memory 120 as the write signal; at t3, the first quantization is carried out to quantize the low-gain reset signal Vlrst, and the counter counts upwards under the action of a high-speed clock; at t4, an output of the comparator flips, the counting stops, the first quantization ends, and a quantized low-gain reset signal is obtained; during t5-t6, mem_lcg_wrt is enabled, and the quantized low-gain reset signal is stored into the first memory 120;

before the second quantization, during t6-t7, mem_hcg_rst is enabled to reset each second memory 130 (i.e., the output of each second memory 130 becomes "0"); during t7-t8, count_Id is enabled to write a reset value of the second memory 130 into the corresponding writable D flip-flop 110, thereby setting an initial state of the writable D to 0, and resetting the counter, at which time mem_bwi_sel is at a high level, the writable D flip-flop 110 selects the output of the second memory 130 as the write signal; at t9, the second quantization is carried out to quantize the high-gain reset signal Vhrst, and the counter counts upward under the action of the high-speed clock; at t10, the output of the comparator output flips, the counting stops, the second quantization ends, and a quantized high-gain reset signal is obtained; during t11-t12, mem_hcg_wrt is enabled to store the quantized high-gain reset signal into the second memory 130;

before the third quantization, during t12-t13, count_Id is enabled to write a reverse signal of the quantized high-gain reset signal into the writable D flip-flop 110 as an initial state of the third quantization; at t14, the third quantization is carried out starting from the initial state to quantize the high-gain total exposure signal Vhsig, and the counter counts upward under the action of the high-speed clock; at t15, the output of the comparator flips, the counting stops, the third quantization ends, and the high-gain total image quantization signal (the difference between the high-gain total exposure signal Vhsig and the high-gain reset signal Vhrst, i.e., Vhsig-Vhrst) is obtained; after that, the mem_wrt is enabled, and the high-gain total image quantization signal is stored into the third memory 140; during t16-t17, mem_rd is enabled and rdout_en (an external read signal) is at a high level, and the high-gain total image quantization signal is read out (mem_wrt and mem_rd are not shown in the figures). Alternatively, when the second memory 130 has a read function, mem_hcg_wrt is enabled, the high-gain total image quantization signal is stored into the second memory 130, and during t16-t17, the read enable signal mem_hcg_rd of the second memory 130 is enabled, and rdout_en (the external read signal) is at a high level, and the high-gain total image quantization signal is read out (not shown in the figures).

Before the fourth quantization, during t17-t18, count_Id is enabled to write the reverse signal of the quantized low-gain reset signal stored in the first memory 120 into the writable D flip-flop 110 as an initial state of the fourth quantization, at which time, mem_bwi_sel is at a low level and the writable D flip-flop 110 selects the output of the first memory 120 as the write signal; at t19, the fourth quantization is carried out starting from the initial state to quantize the low-gain one-side exposure signal Vlsig1, and the counter counts upward under the action of the high-speed clock; at t20, the output of the comparator flips, the counting stops, the fourth quantization ends, and the low-gain one-side image quantization signal (the difference between the low-gain one-side exposure signal Vlsig1 and the low-gain reset signal Vlrst, i.e., Vlsig1−Vlrst) is obtained; after that, mem_wrt is enabled, the low-gain one-side image quantization signal is stored into the third memory 140; during t21-t22, mem_rd is enabled, and rdout_en (the external read signal) is at a high level, and the low-gain one-side image quantization signal is read out (mem_wrt and mem_rd are not shown in the figures).

before the fifth quantization, during t22-t23, count_Id is enabled to write a reverse signal of the quantized low-gain reset signal into the writable D flip-flop 110 as an initial state of the fifth quantization; at t24, the fifth quantization is carried out starting from the initial state to quantize the low-gain total exposure signal Vlsig, and the counter counts upward under the action of the high-speed clock; at t25, the output of the comparator flips, the counting stops, the fifth quantization ends, and the low-gain total image quantization signal (the difference between the low-gain total exposure signal Vlsig and the low-gain reset signal Vlrst, i.e., Vlsig-Vlrst) is obtained; after that, mem_wrt is enabled to store the low-gain total image quantization signal into the third memory 140, and during t26-t27, mem_rd is enabled, rdout_en (the external read signal) is at a high level, and the low-gain total image quantization signal is read out (mem_wrt and mem_rd are not shown in the figures). Alternatively, when the first memory 120 has a read function, mem_lcg_wrt is enabled, the low-gain total image quantization signal is stored into the first memory 120, and during t26-t27, the read enable signal mem_lcg_rd of the first memory 120 is enabled, and rdout_en (the external read signal) is at a high level, and the low-gain total image quantization signal is read out (not shown in the figures).

In one example, mem_hcg_wrt is enabled to store the high-gain total image quantization signal into the second memory 130, and during t16-t17, mem_hcg_rd is enabled, rdout_en (the external read signal) is at a high level, and the high-gain total image quantization signal is read out; also, mem_lcg_wrt is enabled to store the low-gain total image quantization signal into the first memory 120, and during t26-t27, mem_lcg_rd is enabled, rdout_en (the external read signal) is at a high level, and the low-gain total image quantization signal is read out. Therefore, based on the above design, respective counting results of the first memory 120 and the second memory 130 can be read out simultaneously.

So far, one complete quantization cycle has completed, and the low-gain one-side image quantization signal after CDS of the low-gain one-side exposure signal in the low conversion gain mode, and the low-gain total image quantization signal after CDS of the low-gain total exposure signal in the low conversion gain mode are obtained; the difference between the low-gain total image quantization signal and the low-gain one-side image quantization signal is calculated, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in the low conversion gain mode is obtained, thereby achieving ADAF in the low conversion gain mode. At the same time, PGHDR is realized by the high-gain total image quantization signal in the high conversion gain mode and the low-gain total image quantization signal in the low conversion gain mode. As can be seen, the method for reading out image signals of Embodiment 9 is for implementing ADAF during LCG quantization in the PGHDR mode.

Embodiment 10

As shown in FIG. 31, in a more specific example, the method for reading out image signals comprises step 1) to step 5). The method for reading out image signals is for implementing ADAF during LCG quantization and HCG quantization in the PGHDR mode. The method for reading out image signals comprises:

Step 1) in the low conversion gain mode, collecting a low-gain reset signal of the all-phase pixels;
and then quantizing the low-gain reset signal to obtain and store a quantized low-gain reset signal. Optionally, before quantizing the low-gain reset signal, step 1) also comprises: resetting a quantization status.
Step 2) in the high conversion gain mode, collecting a high-gain reset signal of the all-phase pixels;
and then resetting the quantization status and quantizing the high-gain reset signal to obtain and store a quantized high-gain reset signal;
Step 3) in the high conversion gain mode, first collecting a high-gain one-side exposure signal of first-side pixels of the all-phase pixels, and then collecting a high-gain total exposure signal of the all-phase pixels;
after collecting the high-gain one-side exposure signal, using a reverse signal of the quantized high-gain reset signal as an initial state, and quantizing the high-gain one-side exposure signal based on this initial state to obtain a high-gain one-side image quantization signal, which is subsequently read out;
after collecting the high-gain total exposure signal, using the reverse signal of the quantized high-gain reset signal as an initial state, and quantizing the high-gain total exposure signal to obtain a high-gain total image quantization signal, which is subsequently read out;
Step 4) in the low conversion gain mode, first collecting a low-gain one-side exposure signal of first-side pixels of the all-phase pixels, and then collecting a low-gain total exposure signal of the all-phase pixels;
after collecting the low-gain one-side exposure signal, using a reverse signal of the quantized low-gain reset signal as an initial state, quantizing the low-gain one-side exposure signal based on this initial state to obtain a low-gain one-side image quantization signal, which is subsequently read out;
after collecting the low-gain total exposure signal, using the reverse signal of the quantized low-gain reset signal as an initial state, and quantizing the low-gain total exposure signal to obtain a low-gain total image quantization signal, which is subsequently read out;
Step 5) the difference between the high-gain total image quantization signal and the high-gain one-side image quantization signal is calculated, wherein the difference is used to obtain a high-gain other-side image quantization signal corresponding to second-side pixels of the full-phase pixels obtained through CDS of a high-gain other-side exposure signal in the high conversion gain mode, the difference between the low-gain total image quantization signal and the low-gain one-side image quantization signal is calculated, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in different conversion gain modes is obtained, thereby achieving ADAF in the different conversion gain modes; PGHDR is achieved based on the high-gain total image quantization signal and the low-gain total image quantization signal.

In the following, the signal collection and quantization processes of above the method for reading out image signals is further detailed in conjunction with FIG. 24, and with reference to FIGS. 32 and 33, with the counter being an upward counter as an example, where reset thereof is achieved by writing "0" to memories of the counter.

Figure 32:
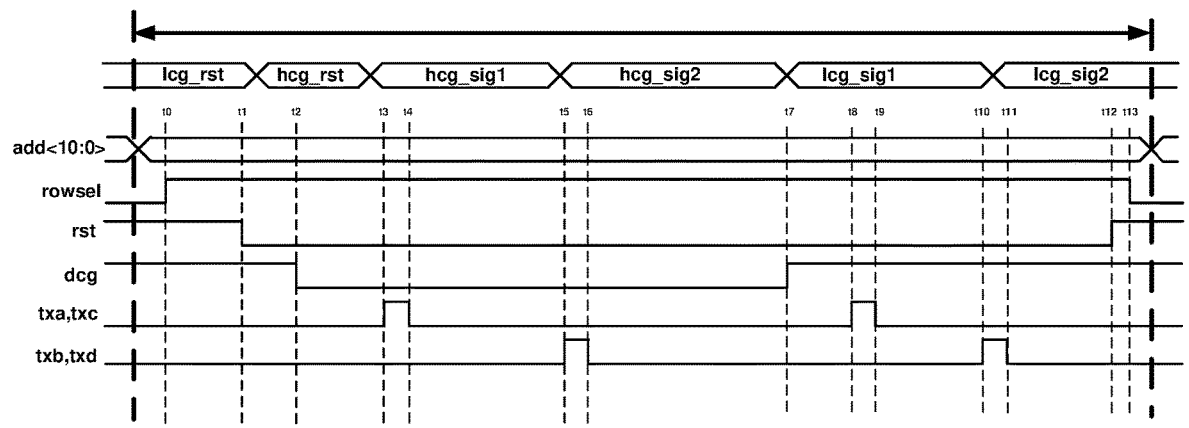
FIG. 32 shows a timing diagram of signal collection according to Embodiment 10 of the present disclosure.
Figure 33:
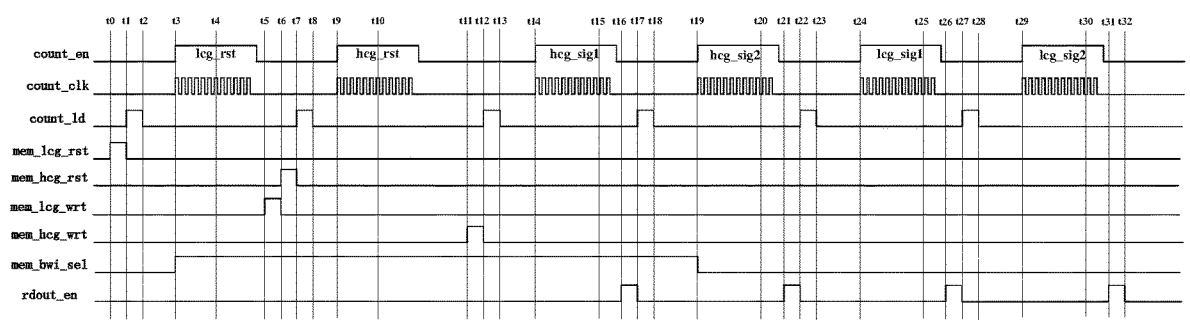
FIG. 33 shows a timing diagram of signal quantization according to Embodiment 10 of the present disclosure.

During t0-t1, dcg is at a high level and rst is at a high level, and a floating diffusion point (FD) voltage is reset;

during t1-t2, rst is at a low level, and a low-gain reset signal Vlrst of the full-phase pixels in the low conversion gain mode is collected;

during t2-t3, dcg is at a low level, and a high-gain reset signal Vhrst of the full-phase pixels in the high conversion gain mode is collected;

during t3-t4, txa and txc are high level, and the first-side pixels (e.g., the right pixels) of the full-phase pixels are shifted; during t4-t5, the high-gain one-side exposure signal Vhsig1 of the first-side pixels in the high conversion gain mode is collected;

during t5-t6, txb and txd are high level, and the second-side pixels (e.g., the left pixels) of the full-phase pixels are shifted; during t6-t7, the high-gain total exposure signal Vhsig of the full-phase pixels in the high conversion gain mode is collected (obtained by superimposing the high-gain other-side exposure signal on top of the high-gain one-side exposure signal, and shown as hcg_sig2 in FIG. 32);

at t7, dcg is at a high level, the method switches to the low conversion gain mode;

during t8-t9, txa and txc are high level, and the first-side pixels (e.g., the right pixels) of the full-phase pixels are shifted; during t9-t10, the low-gain one-side exposure signal Vlsig1 of the first-side pixels in the low conversion gain mode is collected;

during t10-t11, txb and txd are high level, and the second-side pixels (e.g., the left pixels) of the full-phase pixels are shifted; during t11-t12, the low-gain total exposure signal Vlsig of the full-phase pixels in the low conversion gain mode is collected (obtained by superimposing the low-gain other-side exposure signal on top of the low-gain one-side exposure signal, and shown as lcg_sig2 in FIG. 32).

Further, before the first quantization, during t0-t1, mem_lcg_rst is enabled to reset each first memory 120 (i.e., the output of each first memory 120 becomes "0"); and during t1-t2, count_ld is enabled to write a reset value of the first memory 120 into the corresponding writable D flip-flop 110, thereby setting an initial state of writable D flip-flop 110 to 0, and resetting the counter, at which time mem_bwi_sel is at a low level, the writable D flip-flop 110 selects the output of the first memory 120 as the write signal; at t3, the first quantization is carried out to quantize the low-gain reset signal Vlrst, and the counter counts upwards under the action of a high-speed clock; at t4, an output of the comparator flips, the counting stops, the first quantization ends, and a quantized low-gain reset signal is obtained; during t5-t6, mem_lcg_wrt is enabled, and the quantized low-gain reset signal is stored into the first memory 120;

before the second quantization, during t6-t7, mem_hcg_rst is enabled to reset each second memory 130 (i.e., the output of each second memory 130 becomes "0"); during t7-t8, count_Id is enabled to write a reset value of the second memory 130 into the corresponding writable D flip-flop 110, thereby setting an initial state of the writable D to 0, and resetting the counter, at which time mem_bwi_sel is at a high level, the writable D flip-flop 110 selects the output of the second memory 130 as the write signal; at t9, the second quantization is carried out to quantize the high-gain reset signal Vhrst, and the counter counts upward under the action of the high-speed clock; at t10, the output of the comparator flips, the counting stops, the second quantization ends, and a quantized high-gain reset signal is obtained; during t11-t12, mem_hcg_wrt is enabled to store the quantized high-gain reset signal into the second memory 130;

before the third quantization, during t12-t13, count_Id is enabled to write a reverse signal of the quantized high-gain reset signal into the writable D flip-flop 110 as an initial state of the third quantization; at t14, the third quantization is carried out starting from this initial state, to quantize the high-gain one-side exposure signal Vhsig1, and the counter counts upward under the action of the high-speed clock; at t15, the output of the comparator flips, the counting stops, the third quantization ends, and the high-gain one-side image quantization signal (the difference between the high-gain one-side exposure signal Vhsig1 and the high-gain reset signal Vhrst, i.e., Vhsig1–Vhrst) is obtained; after that, mem_wrt is enabled, the high-gain one-side image quantization signal is stored into the third memory 140; during t16-t17, mem_rd is enabled, and rdout_en (an external read signal) is at a high level, and the high-gain one-side image quantization signal is read out (mem_wrt and mem_rd are not shown in the figures).

Before the fourth quantization, during t17-t18, count_Id is enabled to write the reverse signal of the quantized high-gain reset signal stored in the second memory 130 into the writable D flip-flop 110 as an initial state of the fourth quantization; at t19, the fourth quantization is carried out starting from the initial state to quantize the high-gain total exposure signal Vhsig, and the counter counts upward under the action of the high-speed clock; at t20, the output of the comparator flips, the counting stops, the fourth quantization ends, and the high-gain total image quantization signal (the difference between the high-gain total exposure signal Vhsig and the high-gain reset signal Vhrst, i.e., Vhsig-Vhrst) is obtained; after that, the mem_wrt is enabled, and the high-gain total image quantization signal is stored into the third memory 140; during t21-t22, mem_rd is enabled and rdout_en (an external read signal) is at a high level, and the high-gain total image quantization signal is read out (mem_wrt and mem_rd are not shown in the figures). Alternatively, when the second memory 130 has a read function, mem_hcg_wrt is enabled, the high-gain total image quantization signal is stored into the second memory 130, and during t21-t22, the read enable signal mem_hcg_rd of the second memory 130 is enabled, and rdout_en (the external read signal) is at a high level, and the high-gain total image quantization signal is read out (not shown in the figures).

Before the fifth quantization, during t22-t23, count_Id is enabled to write the reverse signal of the quantized low-gain reset signal into the writable D flip-flop 110 as an initial state of the fifth quantization, at which time, mem_bwi_sel is at a low level and the writable D flip-flop 110 selects the output of the first memory 120 as the write signal; at t24, the fifth quantization is carried out starting from the initial state to quantize the low-gain one-side exposure signal Vlsig1, and the counter counts upward under the action of the high-speed clock; at t25, the output of the comparator flips, the counting stops, the fifth quantization ends, and the low-gain one-side image quantization signal (the difference between the low-gain one-side exposure signal Vlsig1 and the low-gain reset signal Vlrst, i.e., Vlsig1–Vlrst) is obtained; after that, mem_wrt is enabled, the low-gain one-side image quantization signal is stored into the third memory 140; during t26-t27, mem_rd is enabled, and rdout_en (the external read signal) is at a high level, and the low-gain one-side image quantization signal is read out (mem_wrt and mem_rd are not shown in the figures).

before the sixth quantization, during t27-t28, count_Id is enabled to write a reverse signal of the quantized low-gain reset signal into the writable D flip-flop 110 as an initial state of the sixth quantization; at t29, the sixth quantization is carried out starting from the initial state to quantize the low-gain total exposure signal Vlsig, and the counter counts upward under the action of the high-speed clock; at t30, the output of the comparator flips, the counting stops, the sixth quantization ends, and the low-gain total image quantization signal (the difference between the low-gain total exposure signal Vlsig and the low-gain reset signal Vlrst, i.e., Vlsig-Vlrst) is obtained; after that, mem_wrt is enabled to store the low-gain total image quantization signal into the third memory 140, and during t31-t32, mem_rd is enabled, rdout_en (the external read signal) is at a high level, and the low-gain total image quantization signal is read out (mem_wrt and mem_rd are not shown in the figures). Alternatively, when the first memory 120 has a read function, mem_lcg_wrt is enabled, the low-gain total image quantization signal is stored into the first memory 120, and during t31-t32, the read enable signal mem_lcg_rd of the first memory 120 is enabled, and rdout_en (the external read signal) is at a high level, and the low-gain total image quantization signal is read out (not shown in the figures).

In one example, mem_hcg_wrt is enabled to store the high-gain total image quantization signal into the second memory 130, and during t21-t22, mem_hcg_rd is enabled, rdout_en (the external read signal) is at a high level, and the high-gain total image quantization signal is read out; also, mem_lcg_wrt is enabled to store the low-gain total image quantization signal into the first memory 120, and during t31-t32, mem_lcg_rd is enabled, rdout_en (the external read signal) is at a high level, and the low-gain total image quantization signal is read out. Therefore, based on the above design, respective counting results of the first memory 120 and the second memory 130 can be read out simultaneously.

So far, one complete quantization cycle has completed, by which the high-gain one-side image quantization signal after CDS of the high-gain one-side exposure signal in the high conversion gain mode, the high-gain total image quantization signal after CDS of the high-gain total exposure signal in the high conversion gain mode, the low-gain one-side image quantization signal after CDS of the low-gain one-side exposure signal in the low conversion gain mode, and the low-gain total image quantization signal after CDS of the low-gain total exposure signal in the low conversion gain mode are obtained; the difference between the high-gain total image quantization signal and the high-gain one-side image quantization signal is calculated, wherein the difference is used to obtain a high-gain other-side image quantization signal corresponding to second-side pixels of the full-phase pixels obtained through CDS of a high-gain other-side exposure signal in the high conversion gain mode, based on which phase information of the first-side pixels and second-side pixels of the full-phase pixels in the high conversion gain mode is obtained. the difference between the low-gain total image quantization signal and the low-gain one-side image quantization signal is calculated, wherein the difference is used to obtain a low-gain other-side image quantization signal corresponding to second-side pixels of the full-phase pixels obtained through CDS of a low-gain other-side exposure signal in the low conversion gain mode, based on which phase information of the first-side pixels and second-side pixels of the full-phase pixels in the low conversion gain mode is obtained, thereby achieving ADAF in the high conversion gain mode and the low conversion gain mode. At the same time, PGHDR is realized by the high-gain total image quantization signal in the high conversion gain mode and the low-gain total image quantization signal in the low conversion gain mode. As can be seen, the method for reading out image signals of Embodiment 10 is for implementing ADAF during LCG quantization and HCG quantization in the PGHDR mode.

The present disclosed counter, analog-to-digital converter, and method for reading out image signals propose a novel counter circuit structure that possesses both counting and writing capabilities. When this is applied to an analog-to-digital converter for pixel quantization, it can execute CDS operations or CDS operations in the PGHDR mode. The benefits of this approach include a reduction in layout area and optimization of wiring, which in turn leads to lower power consumption and an increase in counting frequency. In addition, the present disclosure is capable of implementing ADAF during HCG and/or LCG quantization processes in the PGHDR mode. This allows for ADAF while preserving a high dynamic range, thereby enhancing the quality of image capture. Therefore, the present disclosure effectively overcomes various shortcomings in the existing technology and has high industrial utilization value.

The above-mentioned embodiments are merely illustrative of the principle and effects of the present disclosure instead of restricting the scope of the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A counter, comprising N cascaded counting units, wherein each of the counting units comprises a writable D flip-flop, and N is an integer greater than or equal to 1,
    wherein the writable D flip-flop of each counting unit has a clock input, a data input, a Q output, a Q-bar output, a control input, and a write input, wherein the clock input of the writable D flip-flop of each counting unit is connected to the Q-bar output or Q output of the writable D flip-flop of a previous counting unit, except that the clock input of the writable D flip-flop of a first counting unit of the N cascaded counting units receives a clock signal, wherein the Q-bar output of the writable D flip-flop of each counting unit is connected to the data input of the same writable D flip-flop, wherein each Q output generates a counting result, each control input receives a control signal, and each write input receives a write signal;
    wherein the write signal is written into each writable D flip-flop when the control signal is active.

2. The counter according to claim 1, wherein each writable D flip-flop comprises: a write control module, an input stage module, a master transmission latch module, an intermediate stage module, a slave transmission latch module, and an output stage module; wherein
    each write control module is connected to the control input and the write input of the corresponding writable D flip-flop, performs logical operations on the control signal and the write signal, and generates a first write control signal and a second write control signal;
    each input stage module is connected to the clock input and the data input of the corresponding writable D flip-flop, transmits a first data signal inputted from the data input and generates a second data signal under the control of an input clock at the clock input of the corresponding writable D flip-flop;
    each master transmission latch module is connected to outputs of the write control module and the input stage module, and the clock input of the corresponding writable D flip-flop, transmits the second data signal and generates a third data signal under the control of the input clock, the first write control signal, and the second write control signal, and latches the second data signal and the third data signal;
    each intermediate stage module is connected to an output of the master transmission latch module and the clock input of the corresponding writable D flip-flop, transmits the third data signal, and generates a fourth data signal under the control of the input clock;
    each slave transmission latch module is connected to outputs of the write control module and the intermediate stage module, and the clock input of the corresponding writable D flip-flop, transmits the fourth data signal and generates a fifth data signal under the control of the input clock, the first write control signal, and the second write control signal, and latches the fourth data signal and the fifth data signal;
    each output stage module is connected to an output of the slave transmission latch module of the corresponding writable D flip-flop, and outputs of the output stage module serve as the Q-bar output and the Q output of the writable D flip-flop for outputting the fifth data signal and a reverse signal of the fifth data signal, respectively.

3. The counter according to claim 2, wherein each write control module comprises a first NAND gate, a second NAND gate, and a first inverter, wherein a first input of the first NAND gate receives the control signal, a second input of the first NAND gate receives the write signal via the first inverter, and an output of the first NAND gate generates the first write control signal, wherein a first input of the second NAND gate receives the control signal, a second input of the second NAND gate receives the write signal, and an output of the second NAND gate generates the second write control signal;
    wherein each master transmission latch module comprises a master transmission portion and a master latch portion;
    wherein the master transmission portion comprises a third NAND gate, a first input of the third NAND gate receives the second data signal, a second input of the third NAND gate receives the second write control signal, and an output of the third NAND gate generates the third data signal;

wherein the master latch portion comprises a first PMOS transistor, a second PMOS transistor, a third PMOS transistor, a first NMOS transistor, a second NMOS transistor, and a third NMOS transistor; wherein a gate of the first PMOS transistor receives the first write control signal, a source of the first PMOS transistor is connected to a reference voltage, and a drain of the first PMOS transistor is connected to a drain of the second PMOS transistor; wherein a gate of the second PMOS transistor is connected to the output of the third NAND gate, a source of the second PMOS transistor is connected to the reference voltage, the drain of the second PMOS transistor is connected to a source of the third PMOS transistor; wherein a gate of the third PMOS transistor receives a reverse signal of the input clock, and a drain of the third PMOS transistor is connected to a drain of the first NMOS transistor and the first input of the third NAND gate; wherein a gate of the first NMOS transistor is connected to the input clock, and a source of the first NMOS transistor is connected to a drain of the second NMOS transistor; wherein a gate of the second NMOS transistor is connected to the output of the third NAND gate and a source of the second NMOS transistor is connected to a drain of the third NMOS transistor; wherein a gate of the third NMOS transistor receives the first write control signal and a source of the third NMOS transistor is connected to a reference ground;

wherein each slave transmission latch module comprises a slave transmission portion and a slave latch portion;

wherein the slave transmission portion comprises a fourth NAND gate; a first input of the fourth NAND gate receives the fourth data signal, a second input of the fourth NAND gate receives the first write control signal, and an output of the fourth NAND gate generates the fifth data signal;

wherein the slave latch portion comprising: a fourth PMOS transistor, a fifth PMOS transistor, a sixth PMOS transistor, a fourth NMOS transistor, a fifth NMOS transistor, and a sixth NMOS transistor; wherein a gate of the fourth PMOS transistor receives the second write control signal, a source of the fourth PMOS transistor is connected to the reference voltage, and a drain of the fourth PMOS transistor is connected to a drain of the fifth PMOS transistor; wherein a gate of the fifth PMOS transistor is connected to the output of the fourth NAND gate, a source of the fifth PMOS is connected to the reference voltage, and the drain of the fifth PMOS is connected to a source of the sixth PMOS transistor; wherein a gate of the sixth PMOS transistor is connected to the input clock, and a drain of the sixth PMOS transistor is connected to a drain of the fourth NMOS transistor and to the first input of the fourth NAND gate; wherein a gate of the fourth NMOS transistor receives the reverse signal of the input clock, and a source of the fourth NMOS transistor is connected to a drain of the fifth NMOS transistor; wherein a gate of the fifth NMOS transistor is connected to the output of the fourth NAND gate and a source of the fifth NMOS transistor is connected to a drain of the sixth NMOS transistor; wherein a gate of the sixth NMOS transistor receives the second write control signal and a source of the sixth NMOS transistor is connected to the reference ground.

4. The counter according to claim 3, wherein each writable D flip-flop has a reset function, and further comprises: a first reset transistor, a second reset transistor, and a third reset transistor; wherein the first reset transistor is connected in parallel with the first PMOS transistor, a gate of the first reset transistor receives a reverse signal of a reset trigger signal; wherein the second reset transistor is connected in series between the source of the third NMOS transistor and the reference ground, a gate of the second reset transistor receives the reverse signal of the reset trigger signal; wherein a gate of the third reset transistor receives the reverse signal of the reset trigger signal, a source of the third reset transistor is connected to the reference voltage, and a drain of the third reset transistor is connected to the output of the fourth NAND gate.

5. The counter according to claim 2, wherein each write control module comprises: a second inverter and a third inverter; wherein an input of the second inverter receives the control signal, and an output of the second inverter generates the first write control signal; wherein an input of the third inverter receives the write signal, and an output of the third inverter generates the second write control signal;

wherein each master transmission latch module comprises a master transmission portion and a master latch portion;

wherein the master transmission portion comprises a seventh PMOS transistor, an eighth PMOS transistor, a ninth PMOS transistor, a seventh NMOS transistor, an eighth NMOS transistor, and a ninth NMOS transistor; wherein a gate of the seventh PMOS transistor receives the second write control signal, a source of the seventh PMOS transistor is connected to a reference voltage, and a drain of the seventh PMOS transistor is connected to a source of the eighth PMOS transistor; wherein a gate of the eighth PMOS transistor receives the first write control signal, and a drain of the eighth PMOS transistor is connected to a drain of the ninth PMOS transistor; wherein a gate of the ninth PMOS transistor is connected to a gate of the seventh NMOS transistor and to the second data signal, a source of the ninth PMOS transistor is connected to the reference voltage, a drain of the ninth PMOS transistor is connected to a drain of the seventh NMOS transistor and generates the third data signal; wherein a source of the seventh NMOS transistor is connected to drains of the eighth NMOS transistor and the ninth NMOS transistor; wherein a gate of the eighth NMOS transistor receives the second write control signal and a source of the eighth NMOS transistor is connected to a reference ground; wherein a gate of the ninth NMOS transistor receives the first write control signal and a source of the ninth NMOS transistor is connected to the reference ground;

wherein the master latch portion comprises a tenth PMOS transistor, an eleventh PMOS transistor, a twelfth PMOS transistor, a thirteenth PMOS transistor, a tenth NMOS transistor, an eleventh NMOS transistor, a twelfth NMOS transistor, and a thirteenth NMOS transistor; wherein a gate of the tenth PMOS transistor receives the write signal, a source of the tenth PMOS transistor is connected to the reference voltage, and a drain of the tenth PMOS transistor is connected to a source of the eleventh PMOS transistor; wherein a gate of the eleventh PMOS transistor receives the first write control signal and a drain of the eleventh PMOS transistor is connected to a drain of the twelfth PMOS transistor; wherein a gate of the twelfth PMOS transistor is connected to a gate of the eleventh NMOS transistor and to the drain of the seventh NMOS transistor, a source of the twelfth PMOS transistor is connected to the reference voltage, and the drain of the twelfth PMOS transistor is connected to a source of the thirteenth PMOS transistor; wherein a gate of the thirteenth PMOS transistor receives a reverse signal of the input clock, and a drain of the thirteenth PMOS transistor is connected to a drain of the tenth NMOS transistor and to the gate of the seventh NMOS transistor; wherein a gate of the tenth NMOS transistor is connected to the input clock, and a source of the tenth NMOS transistor is connected to a drain of the eleventh NMOS transistor; wherein a source of the eleventh NMOS transistor is connected to drains of the twelfth NMOS transistor and the thirteenth NMOS transistor; wherein a gate of the twelfth NMOS transistor receives the write signal, and a source of the twelfth NMOS transistor is connected to the reference ground; wherein a gate of the thirteenth NMOS transistor receives the first write control signal and a source of the thirteenth NMOS transistor is connected to the reference ground;

wherein each slave transmission latch module comprises a slave transmission portion and a slave latch portion;

wherein the slave transmission portion comprises: a fourteenth PMOS transistor, a fifteenth PMOS transistor, a sixteenth PMOS transistor, a fourteenth NMOS transistor, a fifteenth NMOS transistor, and a sixteenth NMOS transistor; wherein a gate of the fourteenth PMOS transistor receives the write signal, a source of the fourteenth PMOS transistor is connected to the reference voltage, and a drain of the fourteenth PMOS transistor is connected to a source of the fifteenth PMOS transistor; wherein a gate of the fifteenth PMOS transistor receives the first write control signal and a drain of the fifteenth PMOS transistor is connected to a drain of the sixteenth PMOS transistor; wherein a gate of the sixteenth PMOS transistor is connected to a gate of the fourteenth NMOS transistor and to the fourth data signal, a source of the sixteenth PMOS transistor is connected to the reference voltage, and the drain of the sixteenth PMOS transistor is connected to a drain of the fourteenth NMOS transistor and generates the fifth data signal; wherein a source of the fourteenth NMOS transistor is connected to drains of the fifteenth NMOS transistor and the sixteenth NMOS transistor; wherein a gate of the fifteenth NMOS transistor receives the write signal and a source of the fifteenth NMOS transistor is connected to the reference ground; wherein a gate of the sixteenth NMOS transistor receives the first write control signal and a source of the sixteenth NMOS transistor is connected to the reference ground;

wherein the slave latch portion comprises a seventeenth PMOS transistor, an eighteenth PMOS transistor, a nineteenth PMOS transistor, a twentieth PMOS transistor, a seventeenth NMOS transistor, an eighteenth NMOS transistor, a nineteenth NMOS transistor, and a twentieth NMOS transistor; wherein a gate of the seventeenth PMOS transistor receives the second write control signal, a source of the seventeenth PMOS transistor is connected to the reference voltage, and a drain of the seventeenth PMOS transistor is connected to a source of the eighteenth PMOS transistor; wherein a gate of the eighteenth PMOS transistor receives the first write control signal, and a drain of the eighteenth PMOS transistor is connected to a drain of the nineteenth PMOS transistor; wherein a gate of the nineteenth PMOS transistor is connected to a gate of the eighteenth NMOS transistor and to the drain of the fourteenth NMOS transistor, a source of the nineteenth PMOS transistor is connected to the reference voltage, and the drain of the nineteenth PMOS transistor is connected to a source of the twentieth PMOS transistor; wherein a gate of the twentieth PMOS transistor is connected to the input clock, and a drain of the twentieth PMOS transistor is connected to a drain of the seventeenth NMOS transistor and to the gate of the fourteenth NMOS transistor; wherein a gate of the seventeenth NMOS transistor receives the reverse signal of the input clock, and a source of the seventeenth NMOS transistor is connected to a drain of the eighteenth NMOS transistor; wherein a source of the eighteenth NMOS transistor is connected to drains of the nineteenth NMOS transistor and the twentieth NMOS transistor; wherein a gate of the nineteenth NMOS transistor receives the second write control signal, and a source of the nineteenth NMOS transistor is connected to the reference ground; wherein a gate of the twentieth NMOS transistor receives the first write control signal and a source of the twentieth NMOS transistor is connected to the reference ground.

6. The counter according to claim 5, wherein each writable D flip-flop has a reset function, and further comprises a fourth reset transistor, a fifth reset transistor, and a sixth reset transistor; wherein a gate of the fourth reset transistor receives a reverse signal of a reset trigger signal, a source of the fourth reset transistor is connected to the source of the tenth PMOS transistor, and a drain of the fourth reset transistor is connected to the drain of the eleventh PMOS transistor; wherein a gate of the fifth reset transistor receives the reverse signal of the reset trigger signal, a drain of the fifth reset transistor is connected to sources of the twelfth NMOS transistor and the thirteenth NMOS transistor, and a source of the fifth reset transistor is connected to the reference ground; wherein a gate of the sixth reset transistor receives the reverse signal of the reset trigger signal, a source of the sixth reset transistor is connected to the reference voltage, and a drain of the sixth reset transistor is connected to the drain of the sixteenth PMOS transistor.

7. The counter according to claim 2, wherein each input stage module comprises a first tri-state inverter; wherein the first tri-state inverter is in an operating state when the input clock is low, and the first tri-state inverter is in a high-resistance state when the input clock is high; and/or, each intermediate stage module comprises a first transmission gate; wherein, the first transmission gate is turned off when the input clock is low, and turned on when the input clock is high.

8. The counter according to claim 1, wherein a latch logic is used to replace the writable D flip-flop in the first counting unit, wherein the latch logic comprises a latch, and the latch logic has a control input which receives the control signal and a write input which receives the write signal, wherein the write signal is written into the latch logic when the control signal is active.

9. The counter according to claim 8, wherein the latch logic further comprises: a first selector switch, a first NOR gate, a fourth inverter, a fifth inverter, a sixth inverter, a seventh inverter, an eighth inverter, and a ninth inverter;

wherein the clock signal is sent to a first input of the first selector switch via the fourth inverter and the fifth inverter, and an output of the fourth inverter is connected to a second input of the first selector switch; wherein a control input of the first selector switch receives the write signal, and an output of the first selector switch is connected to a data input of the latch;

wherein a first input of the first NOR gate receives the control signal, and a second input of the first NOR gate receives a count enable signal, and an output of the first NOR gate is connected to a clock input of the latch via the sixth inverter; wherein an output of the latch, the seventh inverter, the eighth inverter, and the ninth inverter are connected in series, wherein an output of the eighth inverter serves as a Q output of the latch logic, and an output of the ninth inverter serves as a Q-bar output of the latch logic.

10. The counter according to claim 1, wherein each of the counting units further comprises a first memory which is at least used to store the write signal and is also used to store the counting result; wherein a store control terminal of the first memory receives a store enable signal, an input of the first memory receives the counting result, and a write output of the first memory generates the write signal.

11. The counter according to claim 10, wherein an inverted output of the first memory serves as the write output of the first memory; and/or, the first memory has at least one of a reset function and a read function, wherein when the first memory has a reset function, a reset input of the first memory receives a memory reset signal, and wherein when the first memory has a read function, a read control terminal of the first memory receives a read enable signal, and a read output of the first memory generates a first read signal, wherein a normal output of the first memory serves as the read output of the first memory.

12. The counter according to claim 1, further comprising: a first memory, a second memory and a second selector switch, wherein based on the selection of the second selector switch, either the first memory or the second memory generates the write signal; wherein the first memory and the second memory store the counting result; wherein a store control terminal of the first memory receives a first store enable signal, an input of the first memory receives the counting result, and a write output of the first memory is connected to a first input of the second selector switch; wherein a store control terminal of the second memory receives a second store enable signal, an input of the second memory receives the counting result, and a write output of the second memory is connected to a second input of the second selector switch; wherein a control input of the second selector switch receives a selector signal, and an output of the second selector switch generates the write signal.

13. The counter according to claim 12, wherein an inverted output of the first memory serves as the write output of the first memory, and an inverted output of the second memory serves as the write output of the second memory; and/or, the first memory has at least one of a reset function and a read function, and the second memory has at least one of a reset function and a read function; wherein when the first memory has a reset function, a reset input of the first memory receives a first memory reset signal, and wherein when the first memory has a read function, a read control terminal of the first memory receives a first read enable signal, and a read output of the first memory generates a first read signal, wherein a normal output of the first memory serves as the read output of the first memory; wherein when the second memory has a reset function, a reset input of the second memory receives a second memory reset signal, and wherein when the second memory has a read function, a read control terminal of the second memory receives a second read enable signal, and a read output of the second memory generates a second read signal, wherein a normal output of the second memory serves as the read output of the second memory.

14. The counter according to claim 12, wherein when the first memory does not have a read function and the second memory has a read function, the counter further comprises: a third memory and a third selector switch, wherein the third memory cooperates with the first memory to realize a read function; wherein a store control terminal of the third memory receives a third store enable signal, an input of the third memory receives the counting result, a read control terminal of the third memory receives a third read enable signal, and a normal output of the third memory serves as a read output of the third memory to generate a third read signal; wherein a control input of the third selector switch receives a read control signal, a first input of the third selector switch is connected to a read output of the second memory, a second input of the third selector switch is connected to a read output of the third memory, and an output of the third selector switch generates a selected read signal.

15. The counter according to claim 1, wherein the counting unit further comprises: a first memory, a second memory, a third memory, and a second selector switch;
wherein a store control terminal of the first memory receives a first store enable signal, an input of the first memory receives the counting result, and a write output of the first memory is connected to a first input of the second selector switch;
wherein a store control terminal of the second memory receives a second store enable signal, an input of the second memory receives the counting result, and a write output of the second memory is connected to a second input of the second selector switch;
wherein a control input of the second selector switch receives a selector signal, and an output of the second selector switch generates the write signal,
wherein a store control terminal of the third memory receives a third store enable signal, a read control terminal of the third memory receives a third read enable signal, an input of the third memory receives the counting result, and a read output of the third memory generates a third read signal,
wherein inverted outputs of the first memory and the second memory serve as their respective write outputs and a normal output of the third memory serves as the read output of the third memory; wherein the first memory and the second memory store the counting result, wherein based on the selection of the second selector switch, either the first memory or the second memory generates the write signal; wherein the third memory stores the counting result, which is readable through the read output of the third memory.

16. An analog-to-digital converter, comprising at least one row of cascaded analog-to-digital conversion units, wherein each of the analog-to-digital conversion units comprises a comparator and the counter as claimed in claim 1;
wherein the comparator compares a ramp signal and an input signal, and generates a comparison signal;
wherein the counter is connected to an output of the comparator, and digitally quantizes the input signal based on the comparison signal.

17. The analog-to-digital converter according to claim 16, wherein when each counting unit of the counter comprises a first memory, the analog-to-digital converter implements correlated double sampling; when each counting unit of the counter comprises the first memory, a second memory, and a second selector switch, or the first memory, the second memory, a third memory, the second selector switch, and a third selector switch, the analog-to-digital converter implements correlated double sampling at different gains; wherein when each counting unit of the counter comprises the first memory, the second memory, the third memory, and the second selector switch, the analog-to-digital converter implements phase focusing at different conversion gain modes.

18. A method for reading out image signals, comprising:
in a first conversion gain mode, collecting a first-gain reset signal of all-phase pixels;
in a second conversion gain mode, collecting a second-gain reset signal of the all-phase pixels;
in the second conversion gain mode, first collecting a second-gain one-side exposure signal of first-side pixels of the all-phase pixels, and then collecting a second-gain total exposure signal of the all-phase pixels;
in the first conversion gain mode, collecting a first-gain total exposure signal of the all-phase pixels;
wherein, after collecting the second-gain reset signal, the method further comprises:
quantizing the second-gain reset signal to obtain and store a quantized second-gain reset signal.

19. The method for reading out image signals according to claim 18, wherein when the first conversion gain mode is a low conversion gain mode, the second conversion gain mode is a high conversion gain mode, and a gain of the high conversion gain mode is greater than that of the low conversion gain mode, the method comprises:
Step 1) in the low conversion gain mode, collecting a low-gain reset signal of the all-phase pixels; and then quantizing the low-gain reset signal to obtain and store a quantized low-gain reset signal;
Step 2) in the high conversion gain mode, collecting a high-gain reset signal of the all-phase pixels; and then quantizing the high-gain reset signal to obtain and store a quantized high-gain reset signal;
Step 3) in the high conversion gain mode, first collecting a high-gain one-side exposure signal of first-side pixels of the all-phase pixels, and then collecting a high-gain total exposure signal of the all-phase pixels; after collecting the high-gain one-side exposure signal, using a reverse signal of the quantized high-gain reset signal as an initial state, and quantizing the high-gain one-side exposure signal based on this initial state to obtain a high-gain one-side image quantization signal, which is subsequently read out; and after collecting the high-gain total exposure signal, using the reverse signal of the quantized high-gain reset signal as an initial state, and quantizing the high-gain total exposure signal to obtain a high-gain total image quantization signal, which is subsequently read out; and
Step 4) comprising step 4-1) or step 4-2),
wherein step 4-1) comprises:
in the low conversion gain mode, collecting a low-gain total exposure signal of the all-phase pixels; and after collecting the low-gain total exposure signal, using a reverse signal of the quantized low-gain reset signal as an initial state, and quantizing the low-gain total exposure signal to obtain a low-gain total image quantization signal, which is subsequently read out;
wherein step 4-2) comprises:
in the low conversion gain mode, first collecting a low-gain one-side exposure signal of first-side pixels of the all-phase pixels, and then collecting a low-gain total exposure signal of the all-phase pixels; after collecting the low-gain one-side exposure signal, using a reverse signal of the quantized low-gain reset signal as an initial state, quantizing the low-gain one-side exposure signal based on this initial state to obtain a low-gain one-side image quantization signal, which is subsequently read out; and after collecting the low-gain total exposure signal, using the reverse signal of the quantized low-gain reset signal as an initial state, and quantizing the low-gain total exposure signal to obtain a low-gain total image quantization signal, which is subsequently read out;
wherein when the first conversion gain mode is the high conversion gain mode, the second conversion gain mode is the low conversion gain mode, and the gain of the high conversion gain mode is greater than that of the low conversion gain mode, the method comprises:
Step 1) in the low conversion gain mode, collecting the low-gain reset signal of the all-phase pixels; and then quantizing the low-gain reset signal to obtain and store the quantized low-gain reset signal;
Step 2) in the high conversion gain mode, collecting the high-gain reset signal of the all-phase pixels; and then quantizing the high-gain reset signal to obtain and store the quantized high-gain reset signal;
Step 3) in the high conversion gain mode, collecting the high-gain total exposure signal of the all-phase pixels; and after collecting the high-gain total exposure signal, using the reverse signal of the quantized high-gain reset signal as an initial state, and quantizing the high-gain total exposure signal to obtain the high-gain total image quantization signal, which is subsequently read out; and
Step 4) in the low conversion gain mode, first collecting the low-gain one-side exposure signal of first-side pixels of the all-phase pixels, and then collecting the low-gain total exposure signal of the all-phase pixels; after collecting the low-gain one-side exposure signal, using the reverse signal of the quantized low-gain reset signal as an initial state, and quantizing the low-gain one-side exposure signal based on this initial state to obtain the low-gain one-side image quantization signal, which is subsequently read out; and after collecting the low-gain total exposure signal, using the reverse signal of the quantized low-gain reset signal as an initial state, and quantizing the low-gain total exposure signal to obtain the low-gain total image quantization signal, which is subsequently read out.

20. The method for reading out image signals according to claim 18, wherein reading out of the image signals is realized based on an analog-to-digital converter comprising a counter,
wherein the counter comprises N cascaded counting units, each of the counting units comprises a writable D flip-flop, and N is an integer greater than or equal to 1;
wherein the writable D flip-flop of each counting unit has a clock input, a data input, a Q output, a Q-bar output, a control input, and a write input, wherein the clock input of the writable D flip-flop of each counting unit is connected to the Q-bar output or Q output of the writable D flip-flop of a previous counting unit, except that the clock input of the writable D flip-flop of a first counting unit of the N cascaded counting units receives a clock signal, wherein the Q-bar output of the writable D flip-flop of each counting unit is connected to the data input of the same writable D flip-flop, wherein each Q output generates a counting result, each control input receives a control signal, and each write input receives a write signal;
wherein the write signal is written into each writable D flip-flop when the control signal is active;

wherein the counting unit further comprises: a first memory, a second memory, a third memory, and a second selector switch;

wherein a store control terminal of the first memory receives a first store enable signal, an input of the first memory receives the counting result, and a write output of the first memory is connected to a first input of the second selector switch;

wherein a store control terminal of the second memory receives a second store enable signal, an input of the second memory receives the counting result, and a write output of the second memory is connected to a second input of the second selector switch;

wherein a control input of the second selector switch receives a selector signal, and an output of the second selector switch generates the write signal, wherein a store control terminal of the third memory receives a third store enable signal, a read control terminal of the third memory receives a third read enable signal, an input of the third memory receives the counting result, and a read output of the third memory generates a third read signal, wherein inverted outputs of the first memory and the second memory serve as their respective write outputs and a normal output of the third memory serves as the read output of the third memory; wherein the first memory and the second memory store the counting result, wherein based on the selection of the second selector switch, either the first memory or the second memory generates the write signal; wherein the third memory stores the counting result, which is readable through the read output of the third memory;

wherein the method further comprises:
quantizing the first-gain reset signal and the first-gain total exposure signal of the all-phase pixels in the first conversion gain mode based on the first memory;

quantizing the second-gain reset signal and the second-gain total exposure signal of the all-phase pixels, and the second-gain one-side exposure signal of the first-side pixels in the second conversion gain mode, based on the second memory, and reading out a counting result of the second-gain one-side exposure signal based on the third memory, and/or, reading out a counting result of the first-gain total exposure signal in the first conversion gain mode and a counting result of the second-gain total exposure signal in the second conversion gain mode based on both the first memory and the second memory;

or, the method further comprises:
quantizing the first-gain reset signal and the first-gain total exposure signal of the all-phase pixels, and the first-gain one-side exposure signal of the first-side pixels in the first conversion gain mode, based on the first memory;

quantizing the second-gain reset signal and the second-gain total exposure signal of the all-phase pixels, and the second-gain one-side exposure signal of the first-side pixels in the second conversion gain mode, based on the second memory, and reading out a counting result of the first-gain one-side exposure signal in the first conversion gain mode or the counting result of the second-gain one-side exposure signal in the second conversion gain mode based on the third memory, and/or, reading out a counting result of the first-gain total exposure signal in the first conversion gain mode and a counting result of the second-gain total exposure signal in the second conversion gain mode based on both the first memory and the second memory.

* * * * *